(12) United States Patent
Shiga et al.

(10) Patent No.: US 12,380,705 B2
(45) Date of Patent: *Aug. 5, 2025

(54) IMAGE CAPTURE DEVICE AND VEHICLE

(71) Applicant: NIKON CORPORATION, Tokyo (JP)

(72) Inventors: Akiko Shiga, Tokyo (JP); Toru Miyakoshi, Kawasaki (JP); Satoshi Yamaguchi, Sagamihara (JP); Akira Kinoshita, Yokohama (JP); Kaoru Yoshino, Tokyo (JP); Hitomi Naganuma, Kawasaki (JP); Takashi Kuriyama, Yokohama (JP); Koichi Fukuda, Yokohama (JP); Yuki Kita, Kawasaki (JP); Koji Nagaoka, Yokohama (JP); Tomoya Nakagawa, Ichikawa (JP); Masakazu Sekiguchi, Kawasaki (JP); Takashi Shionoya, Koganei (JP)

(73) Assignee: NIKON CORPORATION, Tokyo (JP)

( * ) Notice: Subject to any disclaimer, the term of this patent is extended or adjusted under 35 U.S.C. 154(b) by 75 days.

This patent is subject to a terminal disclaimer.

(21) Appl. No.: 18/149,720

(22) Filed: Jan. 4, 2023

(65) Prior Publication Data

US 2023/0158952 A1    May 25, 2023

Related U.S. Application Data

(60) Continuation of application No. 17/546,550, filed on Dec. 9, 2021, now Pat. No. 11,572,016, which is a (Continued)

(30) Foreign Application Priority Data

May 29, 2014 (JP) ................................ 2014-111375
Aug. 28, 2014 (JP) ................................ 2014-173833
Jan. 14, 2015 (JP) ................................ 2014-005171

(51) Int. Cl.
*G06V 20/58* (2022.01)
*B60K 35/00* (2024.01)
(Continued)

(52) U.S. Cl.
CPC .............. *G06V 20/58* (2022.01); *B60K 35/00* (2013.01); *B60R 11/02* (2013.01); *G01C 21/34* (2013.01);
(Continued)

(58) Field of Classification Search
CPC .... G06V 20/58; G06V 10/147; G06V 20/588; H04N 25/134; H04N 23/69
See application file for complete search history.

(56) References Cited

U.S. PATENT DOCUMENTS 6,772,057 B2  8/2004  Breed et al.
7,171,027 B2  1/2007  Satoh
(Continued)

FOREIGN PATENT DOCUMENTS

CN   102785620 A   11/2012
CN   103477240 A   12/2013
(Continued)

OTHER PUBLICATIONS

Feb. 7, 2023 Notice of Reasons for Refusal issued in Japanese Patent Application No. 2022-108519.
(Continued)

*Primary Examiner* — On S Mung
(74) *Attorney, Agent, or Firm* — Oliff PLC

(57) ABSTRACT

An image capture device is mounted in a vehicle. The image capture device includes: an image capture unit; and a setting unit that sets an image capture condition for each region of the image capture unit each having a plurality of pixels, or (Continued)

for each pixel, based upon at least one of a state exterior to the vehicle and a state of the vehicle.

16 Claims, 46 Drawing Sheets

Related U.S. Application Data continuation of application No. 17/114,761, filed on Dec. 8, 2020, now Pat. No. 11,220,215, which is a continuation of application No. 16/928,075, filed on Jul. 14, 2020, now abandoned, which is a continuation of application No. 16/282,775, filed on Feb. 22, 2019, now Pat. No. 10,807,532, which is a division of application No. 15/314,285, filed as application No. PCT/JP2015/065593 on May 29, 2015, now Pat. No. 10,279,742.

(51) Int. Cl.
| | |
|---|---|
| *B60K 35/29* | (2024.01) |
| *B60K 35/81* | (2024.01) |
| *B60R 11/02* | (2006.01) |
| *G01C 21/34* | (2006.01) |
| *G06V 10/147* | (2022.01) |
| *G06V 20/56* | (2022.01) |
| *H04N 7/18* | (2006.01) |
| *H04N 23/60* | (2023.01) |
| *H04N 23/69* | (2023.01) |
| *H04N 25/13* | (2023.01) |
| *H04N 25/44* | (2023.01) |
| *H04N 25/443* | (2023.01) |
| *H04N 25/535* | (2023.01) |
| *H04N 25/704* | (2023.01) |
| *H10F 39/00* | (2025.01) |
| *H10F 39/12* | (2025.01) |
| *H10F 39/18* | (2025.01) |

(52) U.S. Cl.
CPC .......... *G06V 10/147* (2022.01); *G06V 20/588* (2022.01); *H04N 7/183* (2013.01); *H04N 23/60* (2023.01); *H04N 23/69* (2023.01); *H04N 25/134* (2023.01); *H04N 25/44* (2023.01); *H04N 25/443* (2023.01); *H04N 25/704* (2023.01); *H10F 39/182* (2025.01); *H10F 39/199* (2025.01); *H10F 39/8053* (2025.01); *H10F 39/8063* (2025.01); *H10F 39/811* (2025.01); *B60K 35/29* (2024.01); *B60K 35/81* (2024.01); *B60K 2360/18* (2024.01); *B60K 2360/21* (2024.01); *B60R 2300/30* (2013.01); *H04N 25/535* (2023.01)

(56) References Cited

U.S. PATENT DOCUMENTS

| | | |
|---|---|---|
| 2003/0169902 A1 | 9/2003 | Satoh |
| 2004/0109060 A1 | 6/2004 | Ishii |
| 2005/0171688 A1 | 8/2005 | Fujita et al. |
| 2005/0273260 A1 | 12/2005 | Nishida et al. |
| 2006/0187304 A1 | 8/2006 | Sakata |
| 2007/0073484 A1 | 3/2007 | Horibe |
| 2007/0140527 A1 | 6/2007 | Yamamoto et al. |
| 2010/0036578 A1 | 2/2010 | Taguchi et al. |
| 2013/0182111 A1 | 7/2013 | Ogasawara |
| 2013/0188794 A1* | 7/2013 | Kawamata ............. G08G 1/163 381/56 |
| 2014/0136096 A1 | 5/2014 | Funayama et al. |
| 2014/0152794 A1 | 6/2014 | Takahashi |
| 2014/0253694 A1 | 9/2014 | Zustak et al. |
| 2014/0327776 A1 | 11/2014 | Michiguchi et al. |
| 2015/0077590 A1 | 3/2015 | Kuriyama et al. |
| 2015/0178582 A1 | 6/2015 | Okada et al. |
| 2015/0215517 A1 | 7/2015 | Kusaka |
| 2017/0267178 A1 | 9/2017 | Shiga et al. |

FOREIGN PATENT DOCUMENTS

| | | |
|---|---|---|
| CN | 104053038 A | 9/2014 |
| EP | 2 525 335 A2 | 11/2012 |
| JP | H11053689 A | 2/1999 |
| JP | 2002-99999 A | 4/2002 |
| JP | 3345595 B2 | 11/2002 |
| JP | 2003-011695 A | 1/2003 |
| JP | 2003-259361 A | 9/2003 |
| JP | 2003274393 A | 9/2003 |
| JP | 2004146904 A | 5/2004 |
| JP | 2005214883 A | 8/2005 |
| JP | 2005-258696 A | 9/2005 |
| JP | 3824784 B2 | 9/2006 |
| JP | 2006-270175 A | 10/2006 |
| JP | 2006-339994 A | 12/2006 |
| JP | 2006350670 A | 12/2006 |
| JP | 2007-1402 A | 1/2007 |
| JP | 2007-096510 A | 4/2007 |
| JP | 2007-172035 A | 7/2007 |
| JP | 2007-184814 A | 7/2007 |
| JP | 2007288527 A | 11/2007 |
| JP | 2008-53901 A | 3/2008 |
| JP | 2008060650 A | 3/2008 |
| JP | 2008070999 A | 3/2008 |
| JP | 2008-123197 A | 5/2008 |
| JP | 2008123443 A | 5/2008 |
| JP | 2009-003595 A | 1/2009 |
| JP | 2009-004947 A | 1/2009 |
| JP | 2009-017474 A | 1/2009 |
| JP | 2009071706 A | 4/2009 |
| JP | 2009173093 A | 8/2009 |
| JP | 2009177250 A | 8/2009 |
| JP | 2009271766 A | 11/2009 |
| JP | 4390631 B2 | 12/2009 |
| JP | 4404996 B2 | 1/2010 |
| JP | 2010-074362 A | 4/2010 |
| JP | 2010-079424 A | 4/2010 |
| JP | 2010111261 A | 5/2010 |
| JP | 2012023497 A | 2/2012 |
| JP | 2012-138671 A | 7/2012 |
| JP | 2012-226635 A | 11/2012 |
| JP | 2013147112 A | 8/2013 |
| JP | 2013168019 A | 8/2013 |
| JP | 2013-235047 A | 11/2013 |
| JP | 2014089556 A | 5/2014 |
| JP | 2016-130960 A | 7/2016 |
| WO | 2013/164915 A1 | 11/2013 |
| WO | 2014017104 A1 | 1/2014 |
| WO | 2016151918 A1 | 9/2016 |

OTHER PUBLICATIONS

Aug. 25, 2015 International Search Report issued in International Patent Application No. PCT/JP2015/065593.
Jan. 9, 2018 Office Action issued in Japanese Patent Application No. 2015-186061.
Jan. 9, 2018 Office Action issued in Japanese Patent Application No. 2015-186062.
Jan. 23, 2018 Office Action issued in Japanese Patent Application No. 2015-186053.
Jan. 23, 2018 Office Action issued in Japanese Patent Application No. 2015-186054.
Jan. 23, 2018 Office Action issued in Japanese Patent Application No. 2015-186058.
Jan. 23, 2018 Office Action issued in Japanese Patent Application No. 2015-186059.
Jan. 30, 2018 Office Action issued in Japanese Patent Application No. 2015-186055.
Jan. 30, 2018 Office Action issued in Japanese Patent Application No. 2015-186056.

(56) References Cited

OTHER PUBLICATIONS

Feb. 13, 2018 Office Action issued in Japanese Patent Application No. 2015-186057.
Jun. 25, 2018 Office Action issued in U.S. Appl. No. 15/314,285.
Jun. 5, 2018 Office Action issued in Japanese Patent Application No. 2014-173833.
Jun. 5, 2018 Office Action issued in Japanese Patent Application No. 2014-111375.
Jun. 12, 2018 Office Action issued in Japanese Patent Application No. 2015-186059.
Jun. 12, 2018 Office Action issued in Japanese Patent Application No. 2015-186054.
Nov. 13, 2018 Notification of Reasons for Refusal in Japanese Application No. 2015-186060.
Nov. 13, 2018 Decision of Refusal in Japanese Application No. 2015-186056.
Jan. 3, 2019 Office Action issued in Chinese Application No. 201580041612.8.
Nov. 19, 2018 Notice of Allowance issued in U.S. Appl. No. 15/314,285.
Mar. 12, 2019 Office Action issued in Japanese Patent Application No. 2014-111375.
Mar. 12, 2019 Office Action issued in Japanese Patent Application No. 2014-173833.
May 21, 2019 Office Action issued in Japanese Patent Application No. 2018-131486.
May 28, 2019 Office Action issued in Japanese Patent Application No. 2018-121307.
Jun. 4, 2019 Office Action issued in Japanese Patent Application No. 2018-115588.
Nov. 5, 2019 Office Action issued in U.S. Appl. No. 16/282,775.
Sep. 3, 2019 Decision of Refusal issued in Japanese Patent Application No. 2015-186057.
Sep. 3, 2019 Decision of Dismissal of Amendment issued in Japanese Patent Application No. 2015-186057.
Sep. 3, 2019 Decision of Refusal issued in Japanese Patent Application No. 2015-186060.
Sep. 3, 2019 Decision of Dismissal of Amendment issued in Japanese Patent Application No. 2015-186060.
Sep. 20, 2019 Office Action issued in Chinese Patent Application No. 201580041612.8.
Dec. 30, 2019 Office Action issued in Chinese Patent Application No. 201580041612.8.
Mar. 17, 2020 Office Action issued in Japanese Patent Application No. 2019-045078.
Apr. 15, 2020 Notice of Allowance issued in U.S. Appl. No. 16/282,775.
Jun. 24, 2021 Office Action issued in U.S. Appl. No. 16/928,075.
Sep. 1, 2021 Notice of Allowance issued in U.S. Appl. No. 17/114,761.
Jul. 6, 2021 Office Action issued in Japanese Patent Application No. 2020-120951.
Jan. 6, 2022 Office Action issued in Chinese Patent Application No. 202011643281.4.
Apr. 5, 2022 Office Action issued in Japanese Patent Application No. 2020-120951.
Aug. 23, 2022 Office Action issued in Chinese Patent Application No. 202011643281.4.
Oct. 5, 2022 Notice of Allowance Issued in U.S. Appl. No. 17/546,550.
Oct. 10, 2022 Office Action issued in Chinese Patent Application No. 202011621613.9.

\* cited by examiner

FIG.13

|  |  | POSITION OF STEERING WHEEL | |
|---|---|---|---|
|  |  | ON LEFT | ON RIGHT |
| TRAFFIC LANE | RIGHT | 1 | 2 |
| | LEFT | 3 | 4 |

FIG.18

| VEHICLE SPEED V (km/h) | AMOUNT OF CHANGE OF ANGLE THROUGH WHICH BRAKE PEDAL IS DEPRESSED | | | | |
|---|---|---|---|---|---|
| | 0% | 25% | 50% | 75% | 100% |
| 0 | 0 | 0 | 0 | 0 | 0 |
| 25 | 0 | 0 | 0 | 0 | 0 |
| 50 | 0 | 0 | 0 | 0 | 1 |
| 75 | 0 | 0 | 0 | 1 | 1 |
| 100 | 0 | 0 | 1 | 1 | 1 |

FIG.19

| VEHICLE SPEED V (km/h) | Za: DRY ROAD (m) | Zb: RAIN (m) |
|---|---|---|
| 20 | 2 | 1 |
| 40 | 10 | 4 |
| 60 | 20 | 8 |
| 80 | 36 | 14 |
| 100 | 56 | 23 |

FIG.21

| INITIAL SETTING VALUE | TURN SIGNAL : LEFT DIRECTION | TURN SIGNAL : RIGHT DIRECTION |
|---|---|---|
| 1 | INCLUDE OPPOSITE VEHICLE LANE IN REGION OF ATTENTION 82 (WIDEN REGION OF ATTENTION 82 TOWARD LEFT SIDE) | INCLUDE ROAD RIGHT EDGE IN REGION OF ATTENTION 82 (WIDEN REGION OF ATTENTION 82 TOWARD RIGHT SIDE) |
| 2 | INCLUDE OPPOSITE VEHICLE LANE IN REGION OF ATTENTION 82 (GREATLY WIDEN REGION OF ATTENTION 82 TOWARD LEFT SIDE) | INCLUDE ROAD RIGHT EDGE IN REGION OF ATTENTION 82 (SOMEWHAT WIDEN REGION OF ATTENTION 82 TOWARD RIGHT SIDE) |
| 3 | INCLUDE ROAD LEFT EDGE IN REGION OF ATTENTION 82 (SOMEWHAT WIDEN REGION OF ATTENTION 82 TOWARD LEFT SIDE) | INCLUDE OPPOSITE VEHICLE LANE IN REGION OF ATTENTION 82 (GREATLY WIDEN REGION OF ATTENTION 82 TOWARD RIGHT SIDE) |
| 4 | INCLUDE ROAD LEFT EDGE IN REGION OF ATTENTION 82 (WIDEN REGION OF ATTENTION 82 TOWARD LEFT SIDE) | INCLUDE OPPOSITE VEHICLE LANE IN REGION OF ATTENTION 82 (WIDEN REGION OF ATTENTION 82 TOWARD RIGHT SIDE) |

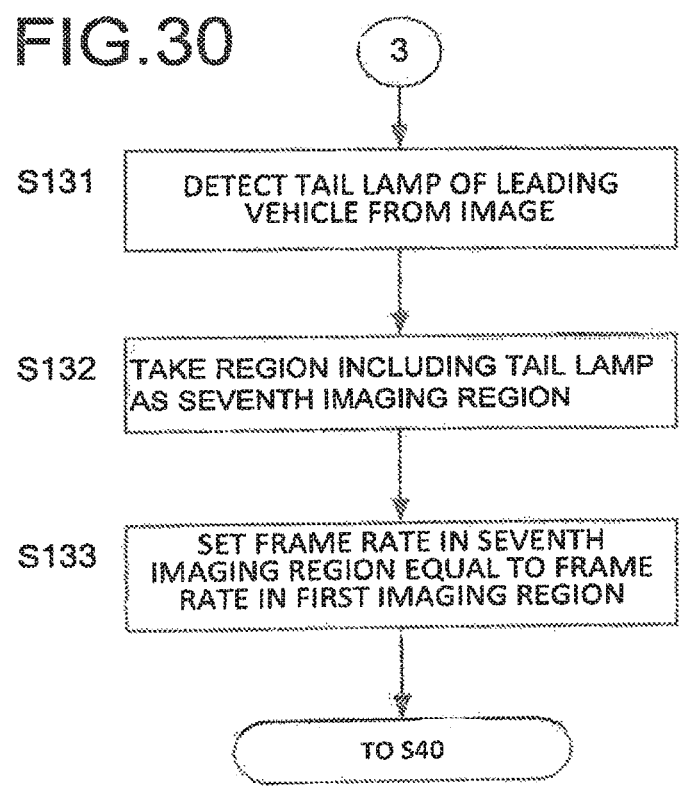

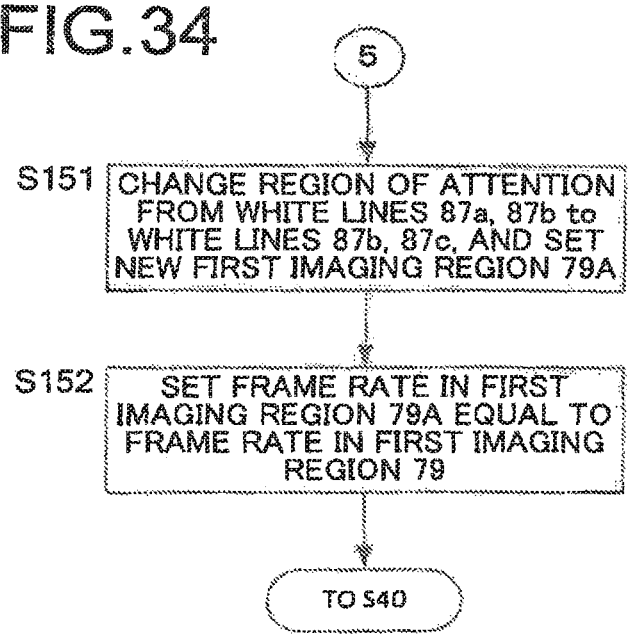

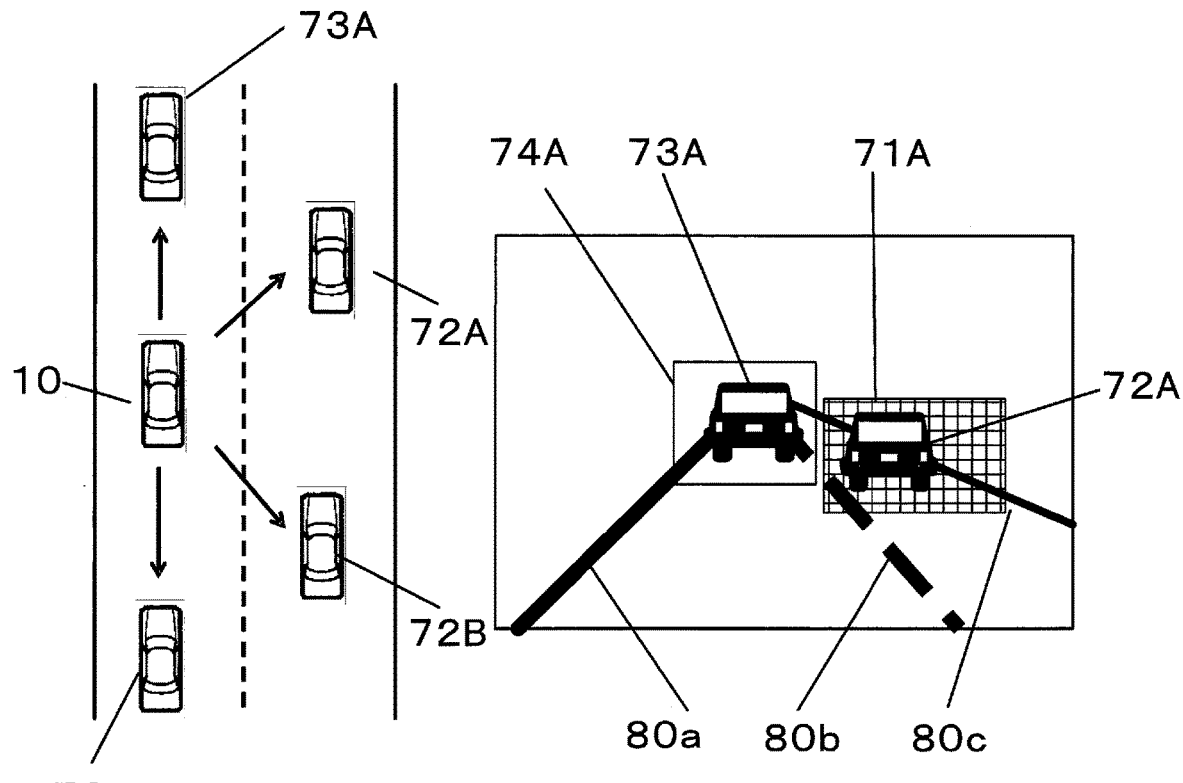
FIG. 40A
FIG. 40B
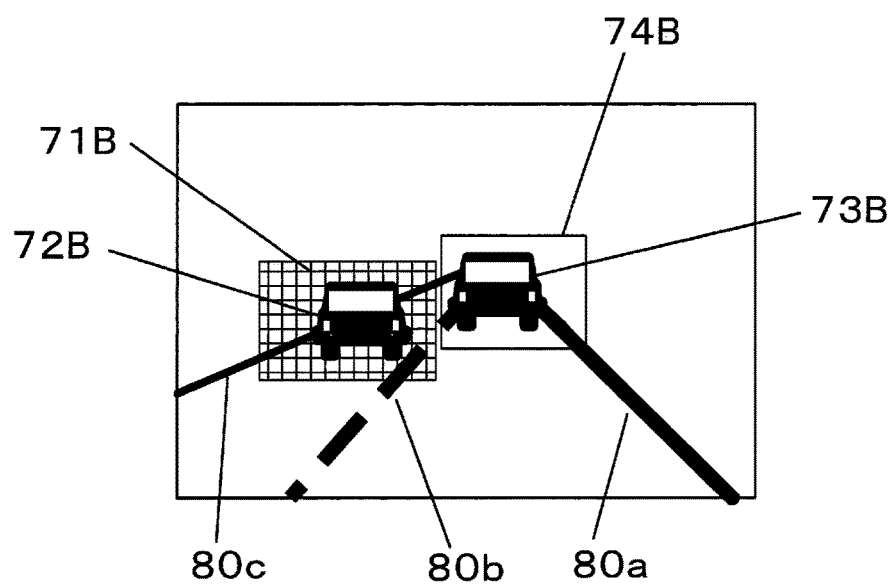
FIG. 40C

IMAGE CAPTURE DEVICE AND VEHICLE

This is a Continuation Application of application Ser. No. 17/546,550 filed on Dec. 9, 2021, which is a Continuation Application of application Ser. No. 17/114,761 filed on Dec. 8, 2020, which in turn is a Continuation Application of application Ser. No. 16/928,075 filed on Jul. 14, 2020, which in turn is a Continuation Application of application Ser. No. 16/282,775 filed on Feb. 22, 2019, which in turn is a Divisional Application of application Ser. No. 15/314,285 filed on Jun. 6, 2017, which in turn is a National Phase Application of International Application No. PCT/JP2015/065593 filed on May 29, 2015, which claims the benefit of Japanese Patent Application No. 2015-005171 filed on Jan. 14, 2015, Japanese Patent Application No. 2014-173833 filed on Aug. 28, 2014, and Japanese Patent Application No. 2014-111375 filed on May 29, 2014. The disclosure of each of the prior applications is incorporated herein by reference in its entirety.

TECHNICAL FIELD

The present invention relates to an image capture device and to a vehicle.

BACKGROUND ART

A technique has been developed (refer to Patent Document #1) in which the traveling environment of a vehicle is detected on the basis of images acquired by a camera mounted upon the vehicle, and, on the basis of traveling environment data that has thus been detected, driving support like automatic cruise control such as for following a leading vehicle in front or the like, alarm provision, braking or steering support, and so on is performed.

CITATION LIST

Patent Literature

Patent Document #1: Japanese Laid-Open Patent Publication 2010-79424.

SUMMARY OF INVENTION

Technical Problem

With prior art techniques, a solid-state imaging element such as a CCD or the like has been employed in the onboard camera. An onboard camera that continually acquires images of the road or the like serves a very important role in automatic cruise control or driving support or the like, but there have not been many proposals for cameras that are specifically intended to be mounted upon vehicles, and it has not been possible to say that the convenience of use of such cameras has been sufficient.

Although, with prior art techniques, lines upon the road have been detected by using a camera, sometimes detection of such lines has become difficult in a traveling environment such as, for example, in a tunnel or during rainfall or the like.

From now on, it is predicted that automobiles that are performing automatic travel control and automobiles that are traveling while being manually driven by drivers will be mixed together, but there have not been many proposals relating to this development.

Solution to Technical Problem

According to the 1st aspect of the present invention, an image capture device that is mounted to a vehicle, comprises: an image capture unit; and a setting unit that sets an image capture condition for each region of the image capture unit each having a plurality of pixels, or for each pixel, based upon at least one of a state exterior to the vehicle and a state of the vehicle.

According to the 2nd aspect of the present invention, in the image capture device according to the 1st aspect, the state of the vehicle may be a traveling state of the vehicle.

According to the 3rd aspect of the present invention, in the image capture device according to 2nd aspect, the traveling state of the vehicle may be at least one of the direction of travel of the vehicle, and a speed of the vehicle.

According to the 4th aspect of the present invention, in the image capture device according to the 3rd aspect, it is preferable that at least one of the direction of travel of the vehicle, and the speed of the vehicle, is controlled by the control unit of the vehicle.

According to the 5th aspect of the present invention, in the image capture device according to 3rd aspect, it is preferable that at least one of the direction of travel of the vehicle, and the speed of the vehicle, is set by actuating an actuation unit of the vehicle.

According to the 6th aspect of the present invention, in the image capture device according to the 5th aspect, it is preferable that the actuation unit is at least one of a steering wheel, a turn signal switch, an accelerator pedal, and a brake pedal.

According to the 7th aspect of the present invention, in the image capture device according to any one of the 4th through 6th aspects, it is preferable that at least one of the direction of travel of the vehicle, and the speed of the vehicle, is detected by a detection unit of the vehicle.

According to the 8th aspect of the present invention, in the image capture device according to any one of the 2nd through 7th aspects, it is preferable that the setting unit sets an imaging region to the image capture unit based upon the traveling state of the vehicle, and sets the image capture condition for the imaging region that has been set.

According to the 9th aspect of the present invention, in the image capture device according to the 8th aspect, it is preferable that as the image capture condition for the imaging region, the setting unit sets a frame rate to be higher than a frame rate of another region.

According to the 10th aspect of the present invention, in the image capture device according to the 8th or 9th aspect, it is preferable that as the image capture condition for the imaging region, the setting unit sets a pixel decimation ratio to be lower than a decimation ratio for another region.

According to the 11th aspect of the present invention, in the image capture device according to the 2nd aspect, it is preferable that the traveling state of the vehicle is a distance from the vehicle to a leading vehicle ahead of the vehicle.

According to the 12th aspect of the present invention, in the image capture device according to the 11th aspect, it is preferable that the setting unit sets an imaging region upon the image capture unit, and sets the image capture condition for the imaging region, based upon the distance from the vehicle to the leading vehicle ahead of the vehicle.

According to the 13th aspect of the present invention, in the image capture device according to the 12th aspect, it is preferable that as the image capture condition for the imaging region, the setting unit lowers a pixel decimation ratio to be lower than a decimation ratio for another region.

According to the 14th aspect of the present invention, in the image capture device according to the 12th or 13th aspect, it is preferable that as the image capture condition for the imaging region, the setting unit increases a frame rate to be higher than a frame rate for another region.

According to the 15th aspect of the present invention, in the image capture device according to the 14th aspect, it is preferable that the setting unit increases the frame rate for the imaging region if the distance from the vehicle to the leading vehicle ahead of the vehicle becomes shorter.

According to the 16th aspect of the present invention, in the image capture device according to the 12th or 15th aspect, it is preferable that the setting unit increases a size of the imaging region if the distance from the vehicle to the leading vehicle ahead of the vehicle becomes shorter.

According to the 17th aspect of the present invention, in the image capture device according to the 1st aspect, it is preferable that the state exterior to the vehicle is a state of a vehicle other than the vehicle.

According to the 18th aspect of the present invention, in the image capture device according to the 17th aspect, it is preferable that the state of a vehicle other than the vehicle is a driving mode of a vehicle other than the vehicle.

According to the 19th aspect of the present invention, in the image capture device according to the 18th aspect, it is preferable that the driving modes of the vehicle are an automatic driving mode in which driving is controlled by a control unit of the vehicle, and a manual driving mode in which driving is performed by actuation of actuation units of the vehicle.

According to the 20th aspect of the present invention, in the image capture device according to the 19th aspect, it is preferable that the setting unit sets, upon the image capture unit, a region for capture of an image of a vehicle operating in the manual driving mode and a region for capture of an image of a vehicle operating in the automatic driving mode, and sets the image capture condition for the region that captures images of a vehicle operating in the manual driving mode and the image capture condition for the region that captures images of a vehicle operating in the automatic driving mode to be different.

According to the 21st aspect of the present invention, in the image capture device according to the 20th aspect, it is preferable that as the image capture condition, the setting unit raises a frame rate for the region that captures the image of the vehicle operating in the manual driving mode to be higher than a frame rate for the region that captures the image of the vehicle operating in the automatic driving mode.

According to the 22nd aspect of the present invention, in the image capture device according to the 20th or 21st aspect, it is preferable that as the image capture condition, the setting unit reduces a decimation ratio for the region that captures the image of the vehicle operating in the manual driving mode to be lower than a decimation ratio for the region that captures the image of the vehicle operating in the automatic driving mode.

According to the 23rd aspect of the present invention, in the image capture device according to any one of the 18th or 22nd aspect, it is preferable that the driving mode of the vehicle is detected by a detection unit.

According to the 24th aspect of the present invention, in the image capture device according to the 1st aspect, it is preferable that the state exterior to the vehicle is a state of a road.

According to the 25th aspect of the present invention, in the image capture device according to the 24th aspect, it is preferable that the state of the road is a state of a line that specifies a lane upon the road along which the vehicle is traveling.

According to the 26th aspect of the present invention, in the image capture device according to the 25th aspect, it is preferable that the line is detected from an image captured by the image capture unit.

According to the 27th aspect of the present invention, in the image capture device according to the 25th or 26th aspect, it is preferable that the setting unit sets a region upon the image capture unit for capture of an image of the line, and sets the image capture condition for this region for capture of the image of the line.

According to the 28th aspect of the present invention, in the image capture device according to the 27th aspect, it is preferable that as the image capture condition, the setting unit increases a frame rate for the region that captures the image of the line to be higher than a frame rate for a region other than the region that captures the image of the line.

According to the 29th aspect of the present invention, in the image capture device according to the 27th or 28th aspect, it is preferable that as the image capture condition, the setting unit lowers a pixel decimation ratio for the region that captures the image of the line to be lower than a pixel decimation ratio for a region other than the region that captures the image of the line.

According to the 30th aspect of the present invention, an image capture device that is mounted to a vehicle, comprises: an image capture unit; and a setting unit that sets a partial region within an imaging region of the image capture unit corresponding to traveling of the vehicle, and an image capture condition for pixel of the partial region that has been set, based upon at least one of a state exterior to the vehicle and a state of the vehicle.

According to the 31st aspect of the present invention, in the image capture device according to the 30th aspect, it is preferable that as the image capture condition for the partial region that has been set, the setting unit raises a frame rate to be higher than a frame rate of a region other than the partial region that has been set.

According to the 32nd aspect of the present invention, in the image capture device according to the 30th or 31st aspect, it is preferable that as the image capture condition for the partial region that has been set, the setting unit lowers a pixel decimation ratio to be lower than a pixel decimation ratio of the region other than the partial region that has been set.

According to the 33rd aspect of the present invention, in the image capture device according to the 30th or 32nd aspect, it is preferable that the state of the vehicle is a traveling state of the vehicle.

According to the 34th aspect of the present invention, in the image capture device according to the 33rd aspect, it is preferable that the traveling state of the vehicle is at least one of a direction of travel of the vehicle, and a speed of the vehicle.

According to the 35th aspect of the present invention, in the image capture device according to the 33rd aspect, it is preferable that the traveling state of the vehicle is a distance from the vehicle to a leading vehicle ahead of the vehicle.

According to the 36th aspect of the present invention, in the image capture device according to the 30th aspect, it is preferable that the state exterior to the vehicle is a state of a vehicle other than the vehicle.

According to the 37th aspect of the present invention, in the image capture device according to the 36th aspect, it is preferable that the state of s vehicle other than the vehicle is a driving mode of a vehicle other than the vehicle.

According to the 38th aspect of the present invention, in the image capture device according to the 30th aspect, it is preferable that the state exterior to the vehicle is a state of a road.

According to the 39th aspect of the present invention, in the image capture device according to the 38th aspect, it is preferable that the state of the road is a state of a line that specifies a lane upon the road along which the vehicle is traveling.

According to the 40th aspect of the present invention, a vehicle to which an image capture device is mounted, comprises: a detection unit that detects at least one of a state exterior to the vehicle and a state of the vehicle; an image capture unit; and a setting unit that sets a partial region within an imaging region of the image capture unit corresponding to traveling of the vehicle, and an image capture condition for pixel of the partial region that has been set, based upon at least one of a state exterior to the vehicle and a state of the vehicle, as detected by the detection unit.

According to the 41st aspect of the present invention, in the vehicle according to the 40th, it is preferable that the detection unit detects a traveling state of the vehicle.

According to the 42nd aspect of the present invention, in the vehicle according to the 41st, it is preferable that as the traveling state of the vehicle, the detection unit detects at least one of a direction of travel of the vehicle, and a speed of the vehicle.

According to the 43rd aspect of the present invention, in the vehicle according to the 41st, it is preferable that as the traveling state of the vehicle, the detection unit detects a distance from the vehicle to a leading vehicle ahead of the vehicle.

According to the 44th aspect of the present invention, in the vehicle according to the 43rd, it is preferable that as the traveling state of the vehicle, the detection unit detects the distance from the vehicle to the leading vehicle ahead of the vehicle based upon an image captured by the image capture unit.

According to the 45th aspect of the present invention, in the vehicle according to the 40th, it is preferable that the detection unit detects a state of a vehicle other than the vehicle.

According to the 46th aspect of the present invention, in the vehicle according to the 45th, it is preferable that the detection unit detects a driving mode of a vehicle other than the vehicle.

According to the 47th aspect of the present invention, in the vehicle according to the 40th, it is preferable that the detection unit detects a state of a road.

According to the 48th aspect of the present invention, in the vehicle according to the 47th, it is preferable that the detection unit detects the state of the road based upon an image captured by the image capture unit.

According to the 49th aspect of the present invention, in the vehicle according to the 47th, it is preferable that as the state of the road, the detection unit detects a state of a line that specifies a lane upon the road along which the vehicle is traveling.

According to the 50th aspect of the present invention, in the vehicle according to any one of the 40th through 49th aspects, it is preferable that as the image capture condition for the partial region that has been set, the setting unit raises a frame rate to be higher than a frame rate for a region other than the partial region that has been set.

According to the 51st aspect of the present invention, in the vehicle according to any one of the 40th through 50th aspects, it is preferable that as the image capture condition for the partial region that has been set, the setting unit lowers a pixel decimation ratio to be lower than a pixel decimation ratio for a region other than the partial region that has been set.

BRIEF DESCRIPTION OF DRAWINGS

FIG. 13 is a figure showing an example of a table of initial setting values;

FIG. 18 is a figure for explanation of a flag Em;

FIG. 19 is a figure for explanation of distances Z;

FIG. 21 is a figure for explanation of a turn signal direction and change of the size of the region for attention;

FIG. 29A is a figure showing a case of high beam, and FIG. 29B is a figure showing a case of low beam;

FIG. 30 is a flow chart showing an example of processing upon change to a third traveling environment;

FIG. 34 is a flow chart showing an example of processing upon change to a fifth traveling environment;

FIG. 35A is a figure showing a situation before change of vehicle lane, and FIG. 35B is a figure showing a situation during change of vehicle lane;

FIG. 40A is a figure for explanation of the positional relationship of certain automobiles, FIG. 40B is a figure schematically showing a photographic subject image formed by a forward-facing camera, and FIG. 40C is a figure schematically showing a photographic subject image formed by a rearward-facing camera;

DESCRIPTION OF EMBODIMENTS

Embodiments of the present invention will now be explained with reference to the drawings.

Embodiment #1

Situation in Use of a Camera

Figure 1:
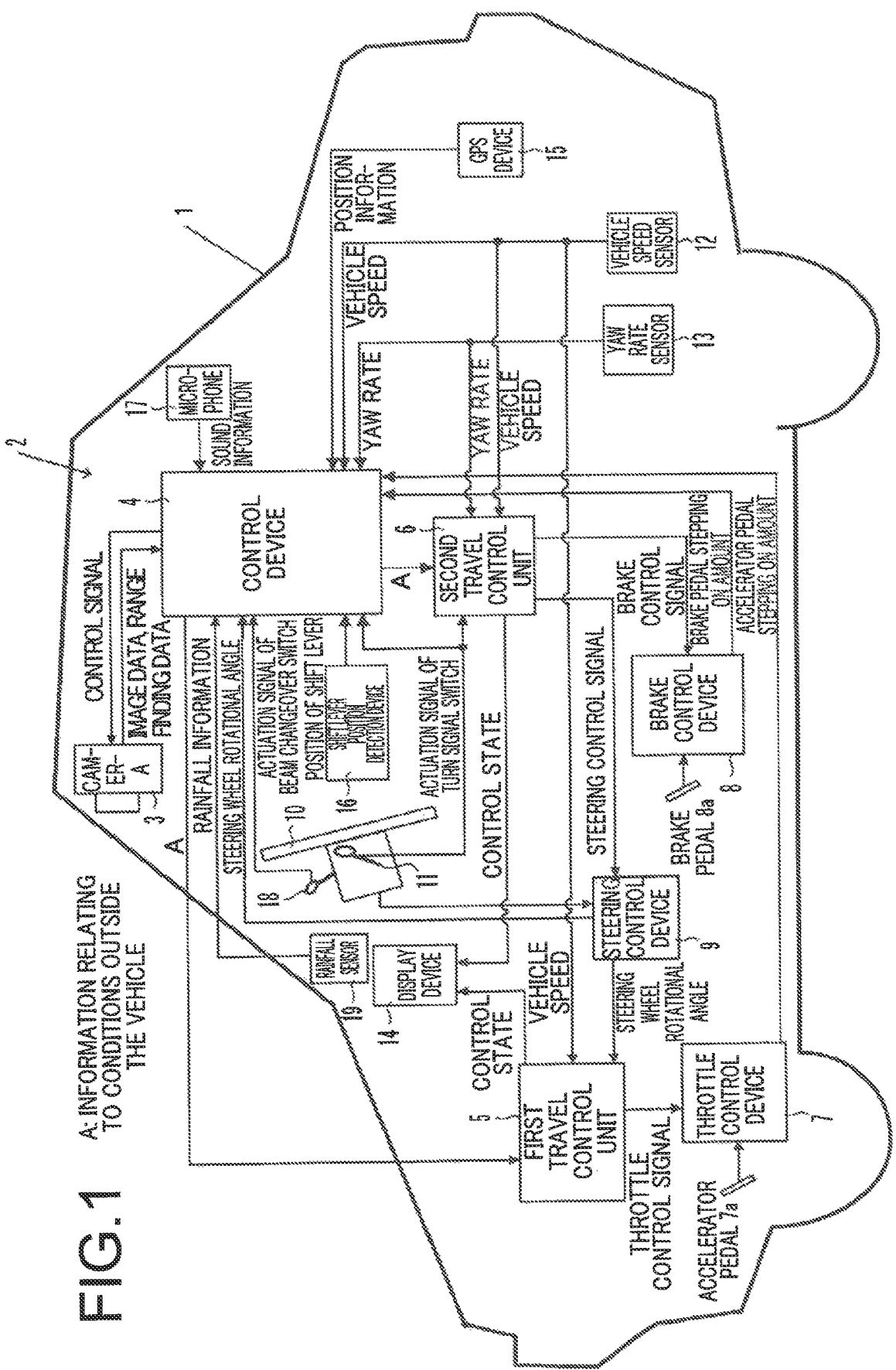
FIG. 1 is a figure showing the general structure of a driving support device for a vehicle.

FIG. 1 is a figure showing the general structure of a driving support device 2 of a vehicle 1 to which a camera 3 is mounted, according to a first embodiment of the present invention. In FIG. 1, the driving support device 2 is mounted to a vehicle 1 such as an automobile or the like. The driving support device 2 comprises a camera 3, a control device 4, a first travel control unit 5, a second travel control unit 6, and so on.

It should be understood that although, in this explanation, an example is explained in which an internal combustion engine is taken as being the source of drive power, it would also be acceptable for an electric motor to be the source of drive power, or the vehicle could be a so-called hybrid vehicle.

The camera 3 comprises an image capture optical system that has a plurality of lenses and an imaging element (in this embodiment, this is a stacked imaging element (refer to FIG. 3)), and that is attached, for example, within the passenger compartment to the front of the roof. The camera 3 is pointed toward the front of the vehicle 1, and the height at which it is attached (i.e. the distance from the ground surface to the camera 3) may, for example, be adjusted to 1.4 m. The camera 3 acquires images in the direction of travel of the vehicle 1, and, on the basis of the images that have thus been acquired, performs measurement (i.e. range finding) of the distances to various photographic subjects (i.e. objects) at a plurality of positions within the photographic screen. This distance measurement is calculated by range finding calculation, using the image signals from pixels for focus detection that are provided upon the stacked imaging element. These pixels for focus detection and range finding will be described hereinafter. The image data and range finding data acquired by the camera 3 are sent to the control device 4. It should be understood that the camera 3 may alternatively be provided external to the vehicle; or cameras 3 that are both internal to and external to the vehicle may be used together in cooperation; or an appropriate plural number of cameras may be provided. To cite examples, it will be acceptable to arrange for white line detection that will be described hereinafter to be performed using a camera 3 that is external to the vehicle; and it will be acceptable to arrange for recognition of objects and/or obstructions to be performed in cooperation by cameras 3 that are both internal to and external to the vehicle.

Figure 2:
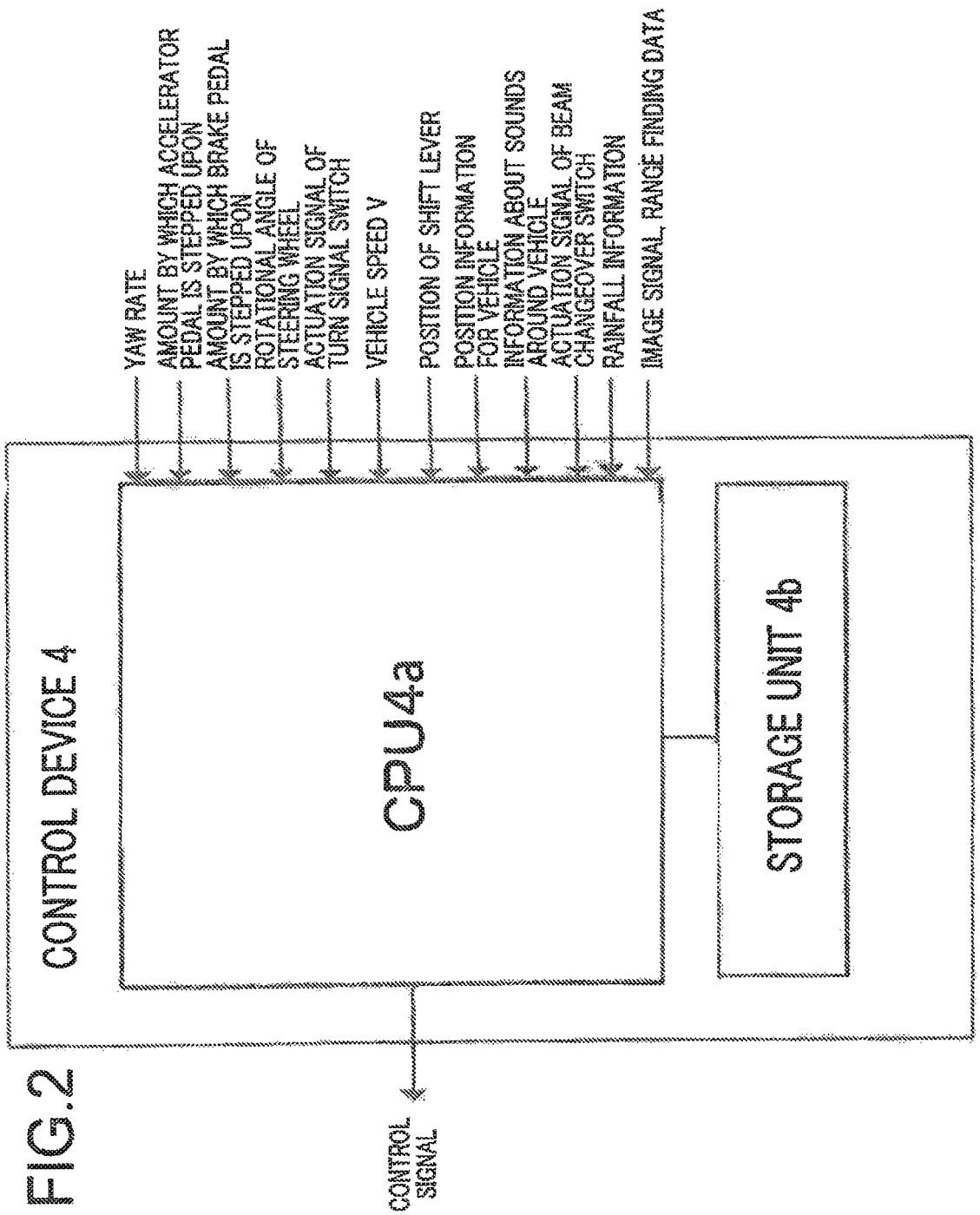
FIG. 2 is a block diagram showing an example of the structure of a control device.

As shown in FIG. 2, the control device 4 includes a CPU 4a and a storage unit 4b. On the basis of programs of various types stored in the storage unit 4b, the CPU 4a performs calculations of various types using control parameters stored in the storage unit 4b and/or detection signals or the like from various sensors that will be described hereinafter The first travel control unit 5 performs constant speed traveling control and following travel control on the basis of commands from the control device 4. Constant speed traveling control is control in which the vehicle 1 is made to travel at a constant speed on the basis of a predetermined control program. And following travel control is control in which, while constant speed traveling control is being performed, if the speed of a leading vehicle in front that has been recognized by the control device 4 is less than or equal to a target speed that has been set for the vehicle 1, then the vehicle 1 is made to travel in a state in which it maintains a constant inter-vehicle distance with respect to the leading vehicle.

And the second travel control unit 6 performs driving support control on the basis of commands from the control device 4. This driving support control is control, on the basis of a predetermined control program, to output steering control signals to the steering control device 9 so as to make the vehicle 1 travel along the road, and control to output brake control signals to the brake control device 8 so as to avoid collisions between the vehicle 1 and various objects.

A throttle control device 7, a brake control device 8, a steering control device 9, a steering wheel 10, a turn signal switch 11, a vehicle speed sensor 12, a yaw rate sensor 13, a display device 14, a GPS device 15, a shift lever position detection device 16, and a microphone 17 are also shown in FIG. 1.

It should be understood that a beam changeover switch 18 and a rainfall sensor 19 are structures that are not essential to this first embodiment.

The throttle control device 7 controls the opening amount of a throttle valve not shown in the figures, according to the amount by which an accelerator pedal 7a is stepped upon. Moreover, the throttle control device 7 also performs control of the opening amount of the throttle valve mentioned above, according to a throttle control signal sent from the first travel control unit 5. The throttle control device 7 also sends a signal specifying the amount by which the accelerator pedal 7a is being stepped upon to the control device 4.

The brake control device 8 controls the opening amount of a brake valve not shown in the figures according to the amount by which a brake pedal 8a is being stepped upon. Moreover, the brake control device 8 also performs control of the opening amount of the brake valve mentioned above, according to a brake control signal sent from the second travel control unit 6. The brake control device 8 also sends a signal specifying the amount by which the brake pedal 8a is being stepped upon to the control device 4.

The steering control device 9 controls the steering angle of a steering system not shown in the figures, according to the rotational angle of the steering wheel 10. Moreover, the steering control device 9 also performs control of the steering angle of the steering system mentioned above, according to a steering control signal sent from the second travel control unit 6. The steering control device 9 also sends signals specifying the rotational angle of the steering wheel 10 to the first travel control unit 5 and to the control device 4.

The turn signal switch 11 is a switch for operating turn signal devices (i.e. winkers) not shown in the figures. These turn signal devices are blinking light emission devices for indicating changes of the course of the vehicle 1. When the turn signal switch 11 is actuated by someone in the vehicle 1, actuation signals from the turn signal switch 11 are sent to a turn signal device, to the second travel control unit 6, and to the control device 4. And the vehicle speed sensor 12 detects the speed V of the vehicle 1, and sends its detection signal to the first travel control unit 5, to the second travel control unit 6, and to the control device 4.

The yaw rate sensor 13 detects the rate of yawing of the vehicle 1, and sends its detection signal to the second travel control unit 6 and to the control device 4. The rate of yawing is the rate of change of the rotational angle of the vehicle 1 around its yaw direction. And the display device 14 displays information showing the control states of the first travel control unit 5 and of the second travel control unit 6 and so on. This display device 14 may, for example, be built as a HUD (Head Up Display) that projects information upon the windscreen. It should be understood that it would also be acceptable to utilize a display unit of a navigation device not shown in the figures as the display device 14.

The GPS device 15 receives radio waves from the GPS satellites, and calculates the position of the vehicle 1 (i.e. its latitude, longitude, and so on) by performing predetermined calculations using information carried by those radio waves. The position information calculated by the GPS device 15 is sent to a navigation device not shown in the figures, and to the control device 4. And the shift lever position detection device 16 detects the position of a shift lever not shown in the figures that is actuated by someone riding in the vehicle 1 (for example to park (P), reverse (R), drive (D) and so on). Information specifying the position of the shift lever detected by the shift lever position detection device 16 is sent to the control device 4.

The microphone 17 may, for example, include a front microphone, a right side microphone, and a left side microphone. The front microphone has directivity only to capture sound forward of the vehicle 1. The right side microphone has directivity only to capture sound to the right side of the vehicle 1. And the left side microphone has directivity only to capture sound to the left side of the vehicle 1. The various streams of audio information captured by the microphone 17 (forward, to the right side, and to the left side) are all sent to the control device 4.

Detection of Objects

The control device 4 performs image processing as described below upon the images from the camera 3, in order to detect the road upon which the vehicle 1 is traveling and various objects. First, the control device 4 creates a distance image (i.e. a depth distribution image) on the basis of the range finding data for a plurality of positions within the photographic screen. And, on this basis of the distance image data, the control device 4 performs per se known grouping processing, performs comparison with three dimensional frames (i.e. windows) of road shape data, side wall data, object data and so on stored in advance in the storage unit 4b, and detects white line data (including data for white lines extending along the road and data for white lines that cut across the road (i.e. stop lines: intersection information)) and side wall data such as guard rails and curbs and so on present along the road, and also detects objects and obstructions, such as bicycles, ordinary vehicles, large sized vehicles, pedestrians, electricity poles, and so on, and classifies them as objects of other types.

In the following explanation, both white colored and yellow colored lines upon the path of travel will be termed "white lines". Moreover solid lines and broken lines will also be included as "white lines".

Driving Support

On the basis of the information detected as described above, in other words the white line data, the guard rail side wall data, and the object data, the control device 4 recognizes objects and obstructions that are upon the path of travel or that may become obstacles, and performs the driving support control described above for the second travel control unit 6 on the basis of the results of this recognition. In other words, the control device causes the vehicle 1 to travel along the road, and causes the vehicle 1 to avoid colliding with objects.

Travel Control

The control device 4 may, for example perform estimation of the path of travel of the subject vehicle in the following four ways.

(1) Estimation of the Path of Travel of the Subject Vehicle on the Basis of White Lines If white line data for both the left and right sides of the path of traveling, or for only one of the left side and the right side thereof, is obtained from the images acquired by the camera 3, and if it is possible to estimate the shape of the vehicle lane in which the vehicle 1 is traveling from this white line data, then the control device 4 estimates the path of travel of the subject vehicle in parallel with the white line or lines in consideration of the width of the vehicle 1 and the position of the vehicle 1 within the current vehicle lane.

(2) Estimation of the Path of Travel of the Subject Vehicle on the Basis of Side Wall Data Such as a Guard Rail, a Curb or the Like If side wall data for both the left side and the right side of the path of traveling, or for only one of the left side and the right side thereof, is obtained from the images acquired by the camera 3, and if it is possible to estimate the shape of the vehicle lane in which the vehicle 1 is traveling from this side wall data, then the control device 4 estimates the path of travel of the subject vehicle in parallel with the side wall or walls in consideration of the width of the vehicle 1 and the position of the vehicle 1 within the current vehicle lane.

(3) Estimation of the Path of Travel of the Subject Vehicle on the Basis of the Track of a Leading Vehicle The control device 4 estimates the path of travel of the subject vehicle on the basis of the past traveling track of a leading vehicle in front, which is stored in the storage unit 4b. The leading vehicle is that vehicle, among the objects that are traveling in the same direction as the vehicle 1, to which the vehicle 1 is closest.

(4) Estimation of the Path of Travel of the Subject Vehicle on the Basis of the Traveling Track of the Vehicle 1

The control device 4 estimates the path of travel of the subject vehicle on the basis of the operational state of the vehicle 1. For example, on the basis of the detection signal from the yaw rate sensor 13 and the detection signal from the vehicle speed sensor 12, the path of travel of the subject vehicle may be estimated using the yaw curvature. The yaw curvature Cua is calculated according to the equation Cua=dψ/dt/V. Here, dψ/dt is the above described yaw rate (i.e. the rate of change of the rotational angle in the yaw direction), and V is the speed of the vehicle 1.

According to a predetermined traveling control program stored in the storage unit 4b, for each of the objects described above, and on the basis of the path of travel of the subject vehicle, the control device 4 estimates the region of traveling of the vehicle 1 at the position where the object is present, compares this region of traveling with the positions of the objects, and determines whether or not each of the objects is within the region of traveling. Furthermore, the control device 4 recognizes the vehicle leading in front described above on the basis of the result of image capture by the camera 3. In other words, from among the objects that are present within the region of traveling and that are traveling in the forward direction (i.e. the same direction as that of the vehicle 1), the control device 4 takes the closest vehicle to the vehicle 1 as being the leading vehicle.

The control device 4 outputs inter-vehicle distance information for the leading vehicle and the vehicle 1 and vehicle speed information for the leading vehicle to the first travel control unit 5 as information relating to conditions exterior to the vehicle. Here, the vehicle speed information for the leading vehicle is calculated on the basis of the vehicle speed V of the vehicle 1 which is acquired at predetermined intervals, and change of the distance to the leading vehicle (i.e. of the inter-vehicle distance) which is range-found, at the predetermined intervals described above, on the basis of images acquired by the camera 3 in synchrony with the timings of acquisition of the vehicle speed V.

The first travel control unit 5 sends a throttle control signal to the throttle control device 7, so that the vehicle speed V detected by the vehicle speed sensor 12 converges to a predetermined vehicle speed (i.e. to a target speed) that is set in advance. Due to this, the throttle control device 7 feedback controls the opening amount of the throttle valve not shown in the figures, so as to make the vehicle 1 travel automatically at a constant speed.

Moreover if, while traveling control is being performed in the constant speed state, the vehicle speed information for the leading vehicle inputted from the control device 4 is less than or equal to the target speed set for the vehicle 1, then the first travel control unit 5 outputs a throttle control signal to the throttle control device 7 on the basis of the inter-vehicle distance information inputted from the control device 4. In concrete terms, the first travel control unit 5 sets an appropriate target value for the inter-vehicle distance on the basis of the inter-vehicle distance from the vehicle 1 to the leading vehicle, the vehicle speed of the leading vehicle, and the vehicle speed V of the vehicle 1, and sends a throttle control signal to the throttle control device 7, so that the inter-vehicle distance that is range-found on the basis of the images acquired by the camera 3 converges to the target value for the inter-vehicle distance described above. Due to this, the throttle control device 7 feedback controls the opening amount of the throttle valve not shown in the figures, so as to cause the vehicle 1 to travel while following the leading vehicle in front.

Explanation of a Stacked Imaging Element

Figure 3:
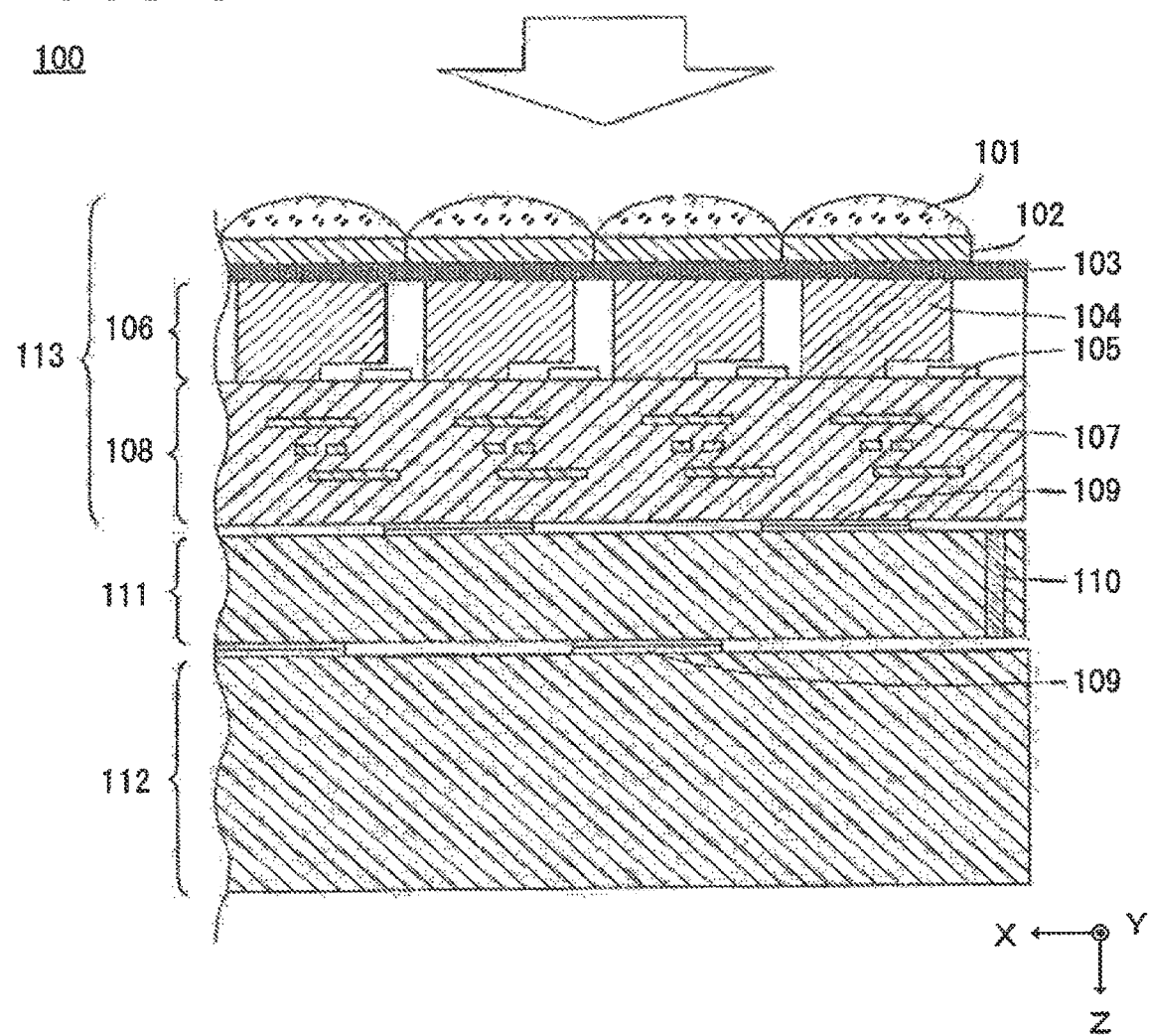
FIG. 3 is a sectional view of a stacked imaging element.

A stacked imaging element 100 incorporated in the camera 3 described above will now be explained. It should be understood that this stacked imaging element 100 is of a type described in International Publication WO13/164915, previously filed by the same applicant as the present application. FIG. 3 is a sectional view of this stacked imaging element 100. The imaging element 100 comprises a backside-illumination type image capture chip 113 that outputs pixel signals corresponding to incident light, a signal processing chip 111 that processes these pixel signals, and a memory chip 112 that stores the pixel signals. This image capture chip 113, signal processing chip 111, and memory chip 112 are laminated together, and are mutually electrically connected together by bumps 109 that are made from Cu or the like and that are electrically conductive.

It should be understood that, as shown in the figure, incident light is principally incident along the +Z axis direction shown by the outlined white arrow sign. In this embodiment, the surface of the image capture chip 113 on its side upon which the incident light is incident (i.e. its imaging surface) will be referred to as its rear surface. Furthermore, as shown by the coordinate axes in the figure, the direction leftward upon the drawing paper and orthogonal to the Z axis will be taken as being the +X axis direction, and the direction toward the viewer from the drawing paper and orthogonal to the Z axis and to the X axis will be taken as being the +Y axis direction. In some of the following figures, coordinate axes are shown so that the orientations of these figures can be understood with respect to the reference coordinate axes of FIG. 3.

One example of the image capture chip 113 is an MOS image sensor of the backside-illumination type. APD layer is disposed on the rear surface side of a wiring layer 108. This PD layer 106 comprises a plurality of PDs (photodiodes) that are arranged two-dimensionally and that accumulate charge according to incident light, and transistors 105 provided to correspond to these PDs 104.

Via a passivation layer 103, color filters 102 are provided upon the incident light side of the PD layer 106. These color filters 102 are of a plurality of types that pass mutually different wavelength regions, and they respectively correspond to the PDs 104 and are arrayed in a specific arrangement. The arrangement of the color filters 102 will be described hereinafter. Each group consisting of a color filter 102, a PD 104, and a transistor 105 constitutes a single pixel.

A micro lens 101 is provided corresponding to each of these pixels, on the incident light side of its color filter 102. This micro lens 101 condenses incident light upon its corresponding PD 104.

A wiring layer 108 includes wiring 107 that transmits the pixel signals from the PD layer 106 to the signal processing chip 111. This wiring 107 may be multi-layered, and could also include both passive elements and active elements.

A plurality of bumps 109 are disposed on the surface of the wiring layer 108. The positions of this plurality of bumps 109 are matched to the positions of a plurality of other bumps 109 that are provided upon the opposing surface of the signal processing chip 111, and are joined to the bumps 109 with which they are positionally aligned and are electrically connected thereto by the image capture chip 113 and the signal processing chip 111 being put under pressure, or the like.

In a similar manner, a plurality of bumps 109 are disposed upon the mutually opposing surfaces of the signal processing chip 111 and the memory chip 112. Due to these bumps 109 being mutually positionally aligned, and due to pressure being applied to the signal processing chip 111 and the memory chip 112 or the like, these bumps 109 that are mutually positionally aligned with one another are joined together and are electrically connected together.

It should be understood that the joining between the bumps 109 is not limited to Cu bump joining due to solid phase diffusion; it would also be acceptable to connect the micro bumps together by solder melting. Moreover, for example, it will be sufficient to provide around one bump 109 or so for each one block that will be described hereinafter. Accordingly the size of the bumps 109 may be greater than the pitch of the PDs 104. Also, bumps that are larger than the bumps 109 corresponding to the pixel regions may be provided together in peripheral regions other than the pixel regions in which the pixels are arranged.

The signal processing chip 111 is provided with TSVs (Trans Silicon Vias) 110 that mutually connect circuits provided upon its front surface and upon its rear surface. It is desirable for the TSVs to be provided in peripheral regions. Moreover, TSVs 110 are also provided in peripheral regions of the image capture chip 113 and the memory chip 112.

Figure 4:
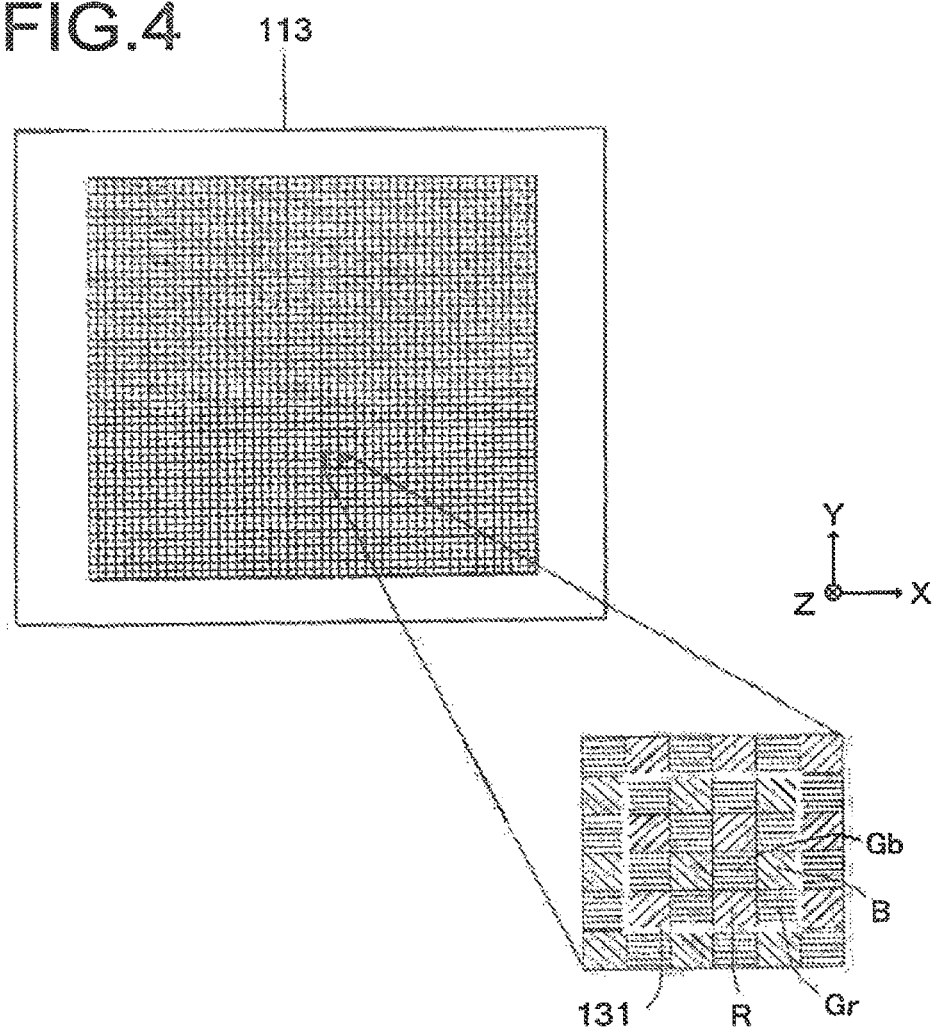
FIG. 4 is a figure for explanation of a pixel array and unit regions on an image capture chip.

FIG. 4 is a figure for explanation of the pixel array and the unit regions 131 of the image capture chip 113. In particular, this figure shows the situation when this image capture chip 113 is observed from its rear surface (i.e. from its imaging surface). For example, 20,000,000 or more pixels may be arranged in this pixel region in the form of a matrix. In the FIG. 4 example, 4×4 adjacent pixels, i.e. 16 adjacent pixels, constitute one unit region 131. The lattice lines in the figure conceptually show the way in which each unit region 131 is formed by grouping adjacent pixels together. The number of pixels that form each unit region 131 is not limited to being as above; for example, there could be around 1000 pixels arranged as 32×64 pixels, or there could be more or fewer thereof.

As shown in the enlarged view of a part of the pixel region, a number of so-called Bayer arrays are included in the unit region 131 in FIG. 4, arranged both vertically and horizontally, and each being made up from four pixels: two green colored pixels Gb and Gr, a blue colored pixel B, and a red colored pixel R. The green colored pixels Gb and Gr are pixels that have green colored filters as their color filters 102, and that receive light in the green colored wavelength band from the incident light. In a similar manner, the blue colored pixels B are pixels that have blue colored filters as their color filters 102 and that receive light in the blue colored wavelength band, while the red colored pixels R are pixels that have red colored filters as their color filters 102 and that receive light in the red colored wavelength band.

In this embodiment, a plurality of blocks are defined so that at least one unit region 131 is included in each block, and each of these blocks can control the pixels included in it with control parameters that are mutually different. In other words, with the pixel groups belonging to some block and the pixel groups belonging to a different block, it is possible to acquire image capture signals for which the image capture conditions are different. Examples of such control parameters are frame rate, gain, decimation ratio, number of rows or number columns for addition of the pixel signals, charge accumulation time or number of times for accumulation, number of digitized bits (i.e. word length), and so on. This imaging element 100 not only performs decimation in the row direction (the X axis direction on the image capture chip 113), but also can, at will, perform decimation in the column direction (the Y axis direction on the image capture chip 113). Furthermore, a control parameter could also be a parameter for image processing after the image signals from the pixels have been acquired.

Figure 5:
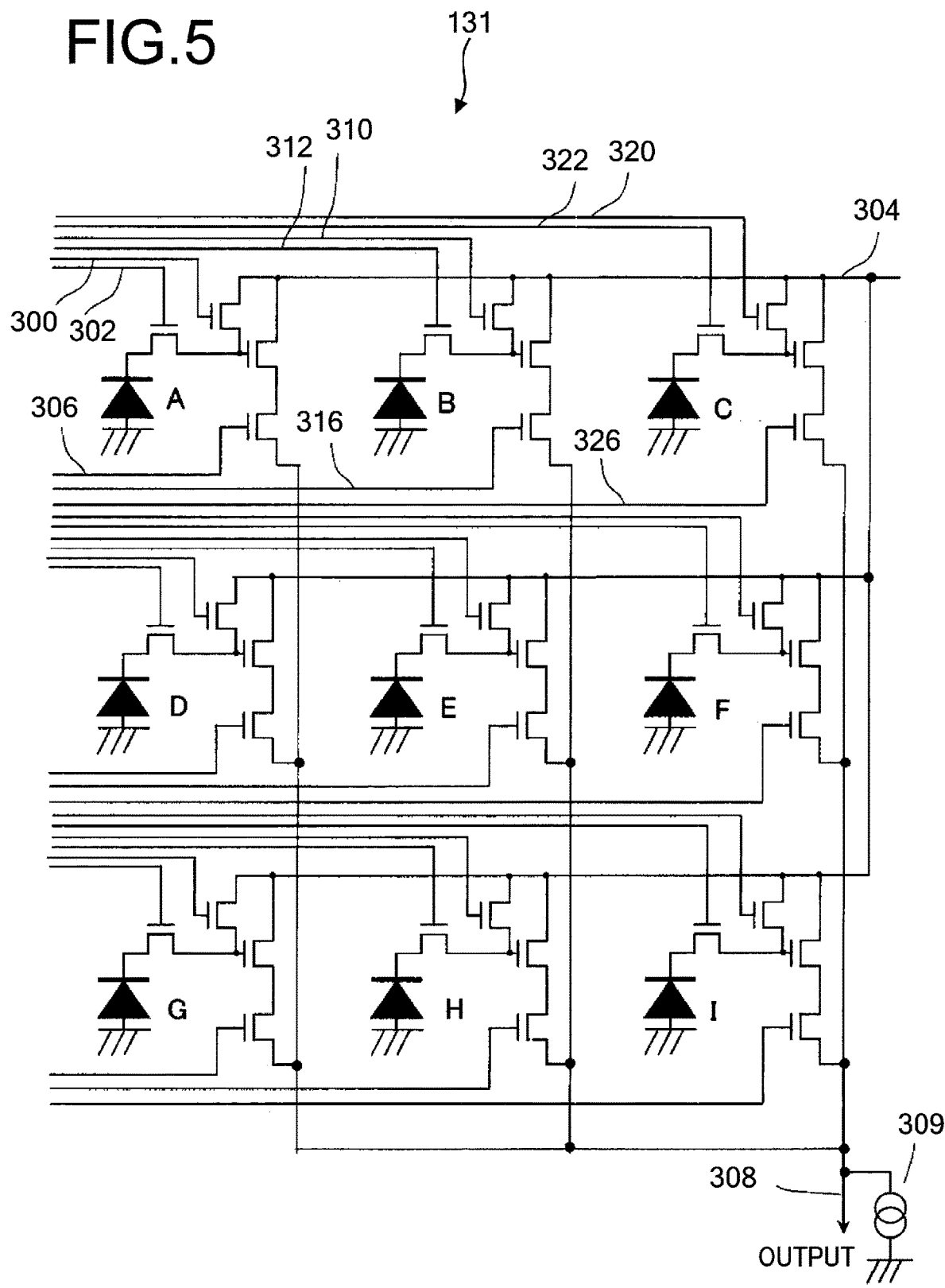
FIG. 5 is a figure for explanation of circuitry for a unit region.

FIG. 5 is a figure for explanation of the circuit for one of the unit regions 131. In the FIG. 5 example, one unit region 131 is constituted by 3×3 adjacent pixels, i.e. by 9 adjacent pixels. It should be understood that the number of pixels that are included in each unit region 131 as described above is not limited to being nine as above; there could be fewer or more. The two dimensional positions of the pixels in the unit region 131 are denoted by the reference symbols A through I.

Reset transistors for the pixels included in the unit region 131 are provided so that they can be turned ON and OFF individually. In FIG. 5, a reset wire 300 is provided for turning the reset transistor for the pixel A ON and OFF, and a reset wire 310 for turning the reset transistor for the pixel B ON and OFF is provided separately from the abovementioned reset wire 300. In a similar manner, a reset wire 320 for turning the reset transistor for the pixel C ON and OFF is provided separately from the abovementioned reset wires 300 and 310. Dedicated reset wires are also similarly provided for turning the respective reset transistors for the other pixels D through I ON and OFF.

Transfer transistors for the pixels included in the unit region 131 are also provided for each of the pixels individually, so that they can be turned ON and OFF. In FIG. 5, a transfer wire 302 for turning the transfer transistor for the pixel A ON and OFF, a transfer wire 312 for turning the transfer transistor for the pixel B ON and OFF, and a transfer wire 322 for turning the transfer transistor for the pixel C ON and OFF are provided separately. Dedicated transfer wires are also provided for turning the respective transfer transistors for the other pixels D through I ON and OFF.

Furthermore, selection transistors for the pixels included in the unit region 131 are also provided so that they can be turned ON and OFF for each of the pixels individually. In FIG. 5, a selection wire 306 for turning the selection transistor for the pixel A ON and OFF, a selection wire 316 for turning the selection transistor for the pixel B ON and OFF, and a selection wire 326 for turning the selection transistor for the pixel C ON and OFF are provided separately. Dedicated selection wires are also provided for turning the respective selection transistors for the other pixels D through I ON and OFF.

It should be understood that a power supply wire 304 is connected to all the pixels A through I included in the unit region 131 in common. In a similar manner, an output wire 308 is connected to all the pixels from the pixel A through I included in the unit region 131 in common. Moreover, while the power supply wire 304 is connected between a plurality of unit regions in common, an individual output wire 308 is provided for each of the output regions 131. A load current source 309 may be provided on the side of the image capture chip 113, or may be provided on the side of the signal processing chip 111.

By turning the reset transistors and the transfer transistors of the unit region 131 ON and OFF individually, it is possible to control charge accumulation for the pixels A through I included in the unit region 131 independently, including their times of starting charge accumulation, their times of ending charge accumulation, and their transfer timings. Furthermore, by turning the selection transistors of the unit region 131 ON and OFF individually, it is possible to output pixel signals for the pixels A through I via the common output wire 308.

Here, the so-called rolling shutter method is per se known for controlling charge accumulation for the pixels A through I included in the unit region 131 in a regular sequence for rows and columns. When, according to the rolling shutter method, the columns are specified after having selected each row of pixels, then, in the example shown in FIG. 5, the pixel signals are outputted in the order "ABCDEFGHI".

By taking the unit regions 131 as reference and building the circuit in this manner, it is possible to control the charge accumulation time for each unit region 131. To put this in another manner, it is possible to output pixel signals according to different frame rates for each of the unit regions 131. Moreover, due to the fact that, while charge accumulation (image capture) is being performed by a unit region 131 that is included in one partial area upon the image capture chip 113, a unit region included in another area is being rested, it is possible to perform image capture with only a predetermined area of the image capture chip 113, and to output pixel signals for that area. Furthermore, by changing over the area for which charge accumulation (image capture) is performed (i.e. the subject area for accumulation control) between frames, it is possible to output pixel signals by performing image capture sequentially for different areas of the image capture chip.

Figure 6:
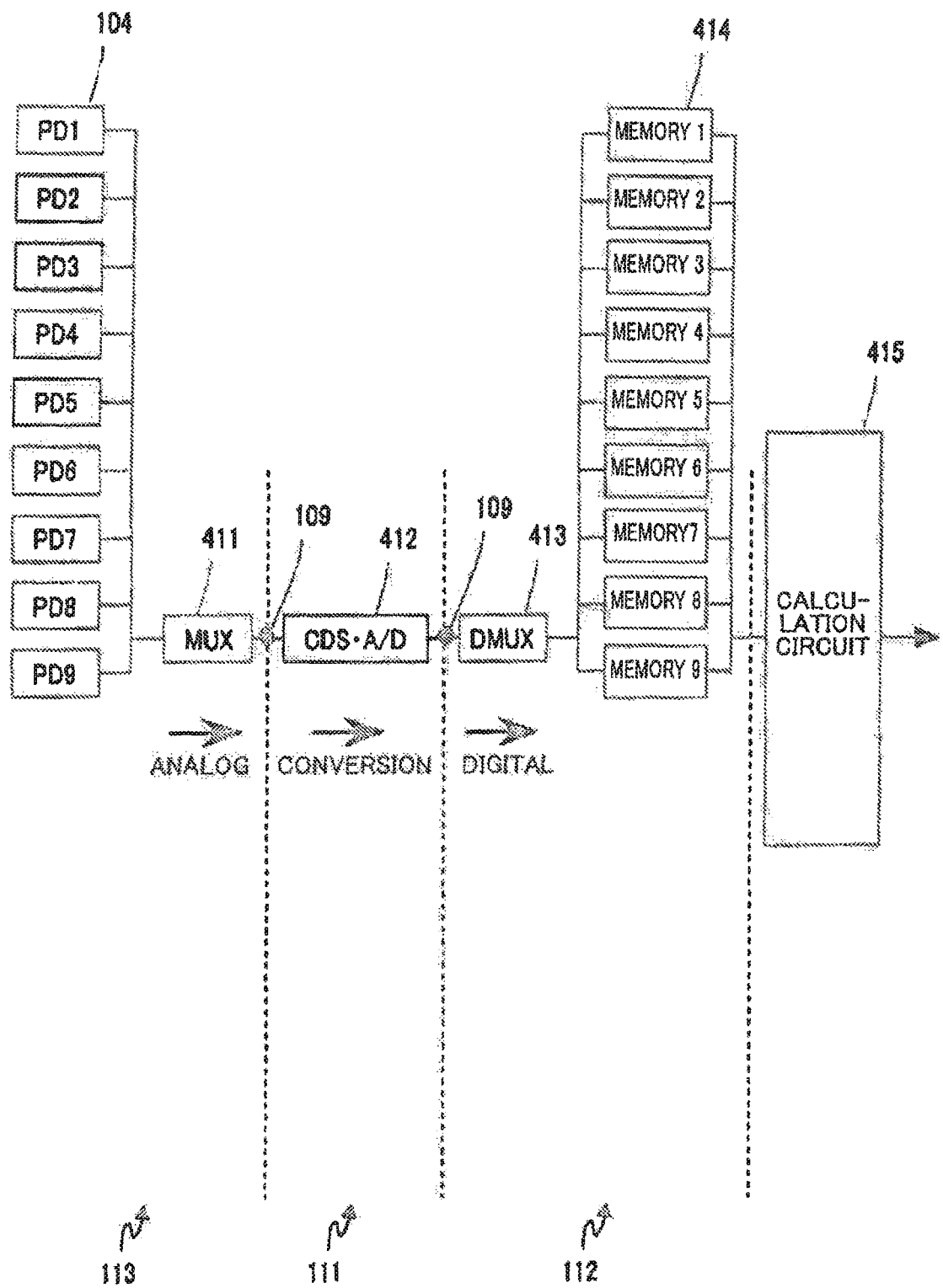
FIG. 6 is a block diagram showing the functional structure of the imaging element.

FIG. 6 is a block diagram showing the functional structure of an imaging element 100 corresponding to the circuit shown in the FIG. 5 example. An analog multiplexer 411 selects the 9 PDs 104 that make up the unit region 131 in order, and outputs their respective pixel signals to the output wire 308 that is provided to correspond to that unit region 131. The multiplexer 411 is provided upon the image capture chip 113 together with the PDs 104.

The pixel signals outputted via the multiplexer 411 are CDS and A/D converted by a signal processing circuit 412 that is formed upon the signal processing chip 111 and that performs correlated double sampling (CDS) and analog/digital (A/D) conversion. After having been A/D converted, the pixel signals are passed to a demultiplexer 413, and are stored in pixel memories 414 corresponding to each of the pixels. The demultiplexer 413 and the pixel memories 414 are formed upon the memory chip 112.

A calculation circuit 415 processes the pixel signals stored in the pixel memories 414 and passes them over to an image processing unit which is a subsequent stage. This calculation circuit 415 could be provided upon the signal processing chip 111, or could be provided upon the memory chip 112.

It should be understood that, while in FIG. 6 only the connections for a single unit region 131 are shown, actually such connections are provided for each unit region 131, and perate in parallel. However, it would also be acceptable not to provide a calculation circuit 415 for each unit region 131, but, for example, for a single calculation circuit 415 to perform sequential processing while referring in order to the values in the pixel memories 414 corresponding to each unit region 131.

As described above, an output wire 308 is provided to correspond to each of the unit regions 131. Since, in this imaging element 100, the image capture chip 113, the signal processing chip 111, and the memory chip 112 are laminated together, accordingly it is possible to route the wiring without enlarging the chips in the surface direction by employing electrical connections between these chips using the bumps 109.

Explanation of the Range Finding

Figure 7:
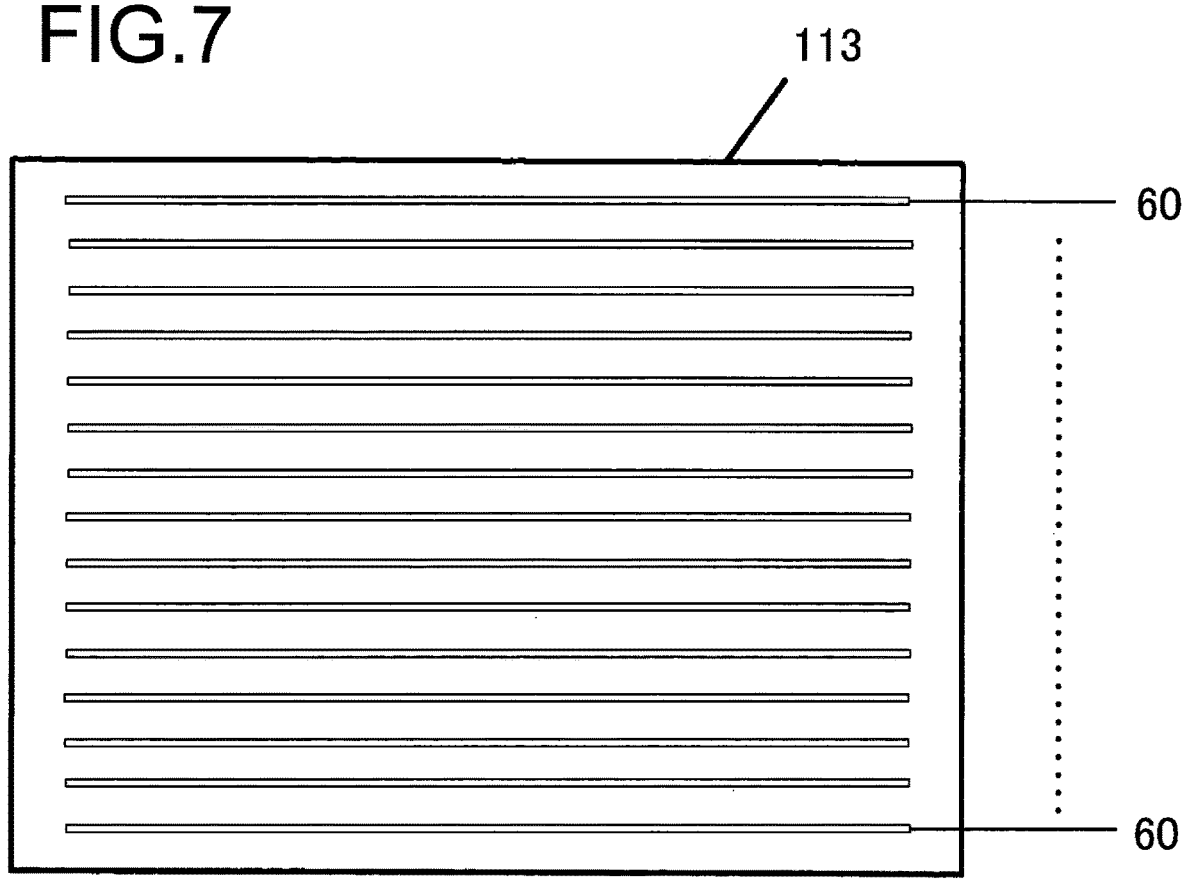
FIG. 7 is a block diagram showing an example of the structure of a camera.

FIG. 7 is a figure showing an example of the positions of pixels for focus detection upon the imaging surface of the imaging element 100. In this embodiment, pixels for focus detection are provided in separate lines along the X axis direction of the image capture chip 113 (i.e. along its horizontal direction). In the FIG. 7 example, fifteen focus detection pixel lines are provided at predetermined intervals. The pixels for focus detection that make up the focus detection pixel lines 60 output image signals for range finding. Normal pixels for image capture are provided at the pixel positions on the image capture chip 113 other than these focus detection pixel lines 60. These pixels for image capture perform monitoring for moving objects or obstructions external to the vehicle and output image signals for extra-vehicle monitoring.

Figure 8:
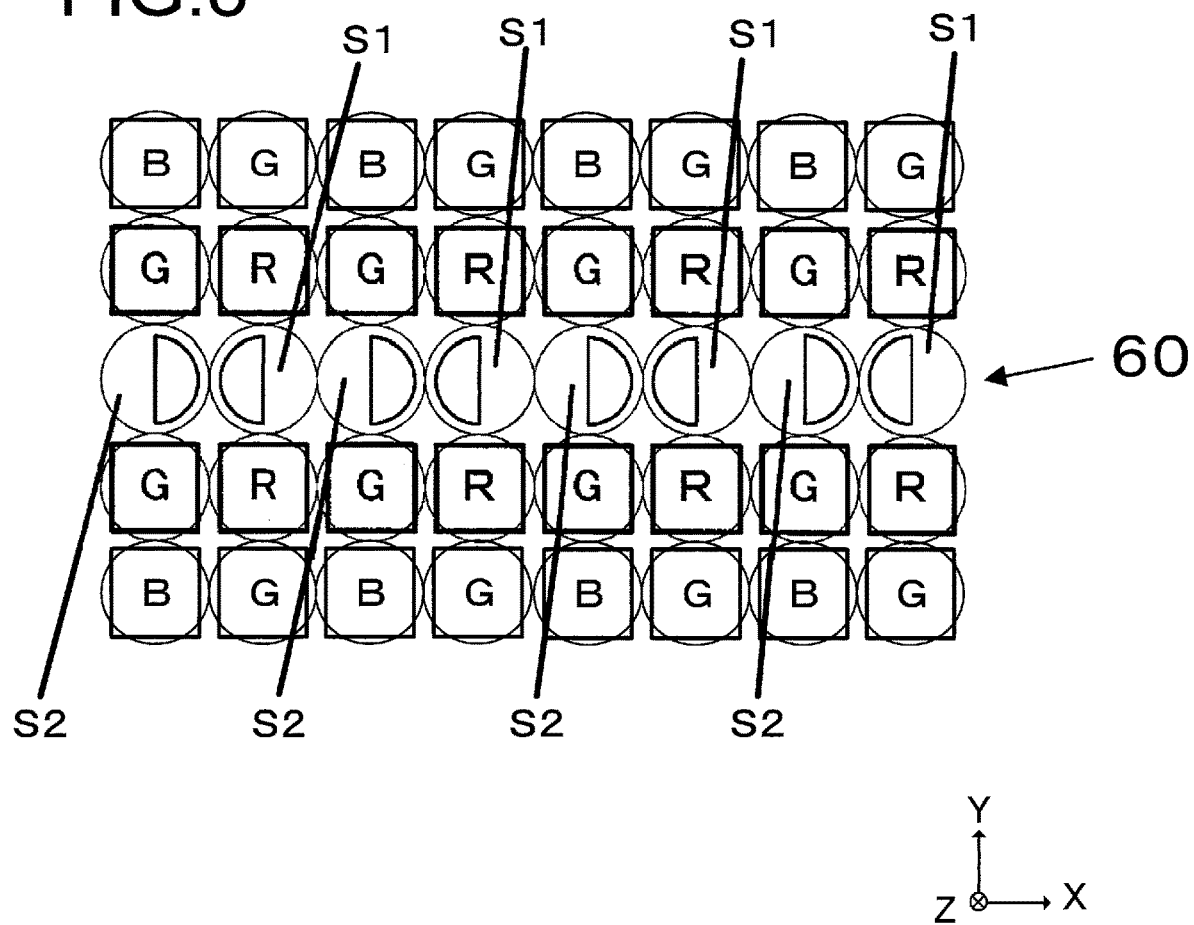
FIG. 8 is a figure showing in magnified view a region that includes a portion of a pixel line for focus detection.

FIG. 8 is a figure showing in magnified view a region that includes a portion of one of the focus detection pixel lines 60 described above. In FIG. 8, red colored pixels R, green colored pixels G (Gb and Gr), blue colored pixels B, pixels for focus detection S1, and pixels for focus detection S2 are shown by way of example. The red colored pixels R, the green colored pixels G (Gb and Gr), and the blue colored pixels B are arranged according to the rule for a Bayer array described above.

The square shaped regions that are shown by way of example for the red colored pixels R, the green colored pixels G (Gb and Gr), and the blue colored pixels B are light reception regions of the pixels for image capture. The pixels for image capture receive light fluxes through the exit pupil of an image capture optical system 31 (refer to FIG. 9). In other words, each of the red colored pixels R, each of the green colored pixels G (Gb and Gr), and each of the blue colored pixels B has a square shaped mask opening portion, and light that passes these mask opening portions arrives at the respective light reception sections of the pixels for image capture.

It should be understood that the shapes of the light reception regions (i.e. of the mask opening portions) of the red colored pixels R, the green colored pixels G (Gb and Gr), and the blue colored pixels B are not limited to being quadrilateral; they could, for example, be circular.

Semicircular shaped regions on the pixels for focus detection S1 and on the pixels for focus detection S2 indicate the light receiving regions of these pixels for focus detection. In other words, the pixels for focus detection S1 have semicircular shaped mask opening portions on the left sides of their pixel positions in FIG. 8, and light that has passed through these mask opening portions reaches the light reception sections of the pixels for focus detection S1. On the other hand, the pixels for focus detection S2 have semicircular shaped mask opening portions on the right sides of their pixel positions in FIG. 8, and light that has passed through these mask opening portions reaches the light reception sections of the pixels for focus detection S2. In this manner, each of the pixels for focus detection S1 and the pixels for focus detection S2 receives one of a pair of light fluxes that have passed through different regions of the exit pupil of the image capture optical system 31 (refer to FIG. 9).

It should be understood that the positions of the focus detection pixel lines upon the image capture chip 113 are not to be considered as being limited to the positions shown by way of example in FIG. 7. Moreover, the number of the focus detection pixel lines is also not to be considered as being limited by the FIG. 7 example. Yet further, the shapes of the mask opening portions of the pixels for focus detection S1 and of the pixels for focus detection S2 are not to be considered as being limited to being semicircular; for example, it would also be acceptable to arrange to form them in rectangular shapes which are obtained by dividing the quadrilateral shaped light receiving regions (i.e. the mask opening portions) on certain ones of the pixels R for image capture, the pixels G for image capture, or the pixels B for image capture in the horizontal direction.

Furthermore, the focus detection pixel lines on the image capture chip 113 could also be provided as lined up along the Y axis direction (i.e. the vertical direction) of the image capture chip 113. An imaging element upon which pixels for image capture and pixels for focus detection are arrayed two dimensionally as in FIG. 8 is per se known, and accordingly the details of these pixels are not shown in the figure and will not be explained.

It should be understood that, in the FIG. 8 example, a so-called 1PD construction is explained in which each of the pixels for focus detection S1 and S2 receives one of a pair of light fluxes for focus detection. Instead of this as for example disclosed in Japanese Laid-Open Patent Publication 2007-282107, it would also be acceptable to arrange to employ a so-called 2PD construction, in which each of the pixels for focus detection receives both of a pair of light fluxes for focus detection. By using a 2PD construction in this manner, it becomes possible to read out image data from the pixels for focus detection as well, so that the focus detection pixels do not become defective pixels.

In this embodiment, on the basis of the image signals for range finding that are outputted from the pixels for focus detection S1 and the pixels for focus detection S2, the focus adjustment state (i.e. the defocusing amount) of the image capture optical system 31 (refer to FIG. 9) is calculated by detecting the amount of image deviation (i.e. the phase difference) between a pair of images due to a pair of light fluxes that have passed through different regions of the image capture optical system.

Generally, in a so-called front focused state in which the image capture optical system 31 focuses a sharp image of an object (for example, of a leading vehicle in front) ahead of a prearranged focal plane, the pair of images described above are closer to one another; and, conversely, in a so-called back focused state in which a sharp image of the object is focused behind the prearranged focal plane, they are further away from one another. And in a focused state in which a sharp image of the object is at the prearranged focal plane, the pair of images described above relatively coincide with one another. Accordingly, the relative amount of positional deviation between the pair of objects corresponds to the distance (depth information) to the object.

Since calculation of the defocusing amount on the basis of the phase difference described above is per se known in the camera field, accordingly detailed explanation thereof will be omitted. Here, it is possible to obtain the distances from the camera 3 to various objects by obtaining the amount of defocusing for each object, since the defocusing amount and the distance to the object are in one-to-one correspondence. In other words, distance measurement (i.e. range finding) is performed to each of the objects mentioned above at a plurality of positions in the photographic screen. The relationship between the amount of defocusing and the distance to the object is prepared in advance as an equation or as a lookup table, and is stored in a non-volatile memory 35$b$ (refer to FIG. 9).

Explanation of the Camera

Figure 9:
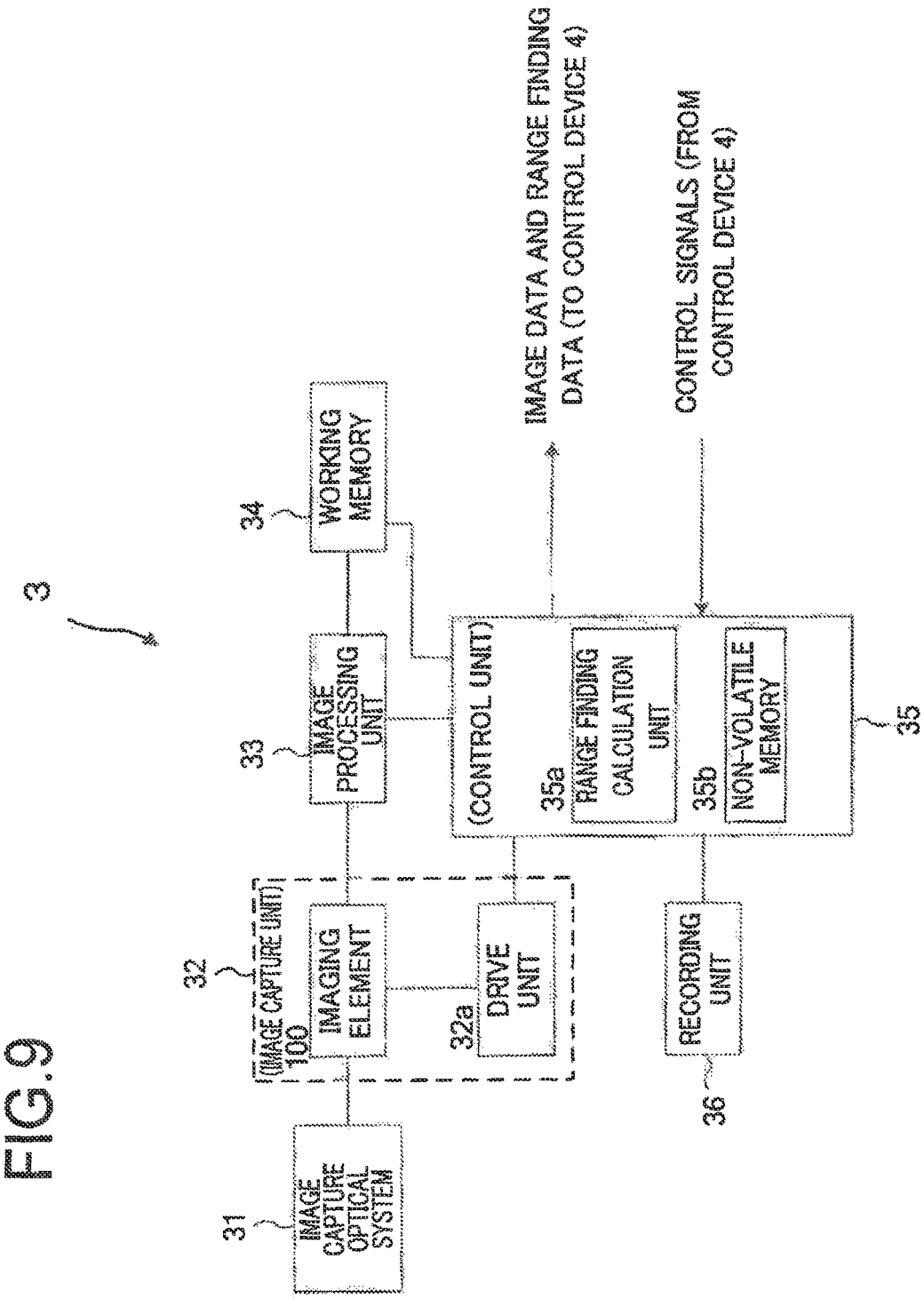
FIG. 9 is a block diagram showing an example of the structure of a camera that includes an imaging element.

FIG. 9 is a block diagram showing an example of the structure of a camera 3 that incorporates the imaging element 100 described above. In FIG. 9, the camera 3 comprises an image capture optical system 31, an image capture unit 32, an image processing unit 33, a working memory 34, a control unit 35, and a recording unit 36.

The image capture optical system 31 conducts a light flux from the photographic field to the image capture unit 32. This image capture unit 32 includes the imaging element 100 described above and a drive unit 32$a$, and photoelectrically converts the image of an object that has been focused upon the image capture chip 113 by the image capture optical system 31. The drive unit 32$a$ generates the necessary drive signals for performing charge accumulation control independently for each of the block units described above upon the imaging element 100 (i.e. upon the image capture chip 113). Commands for the positions and the shapes of the blocks described above, for their ranges, for heir charge accumulation times, and so on are transmitted from the control unit 35 to the drive unit 32$a$.

In cooperation with the working memory 34, the image processing unit 33 performs image processing upon the image data captured by the image capture unit 32. For example, in addition to performing image processing such as contour enhancement processing and gamma correction and so on, the image processing unit 33 may also perform color detection for objects included in the image.

The working memory 34 temporarily stores the image data and so on before and after processing. And the recording unit 36 records the image data and so on upon a storage medium that consists of a non-volatile memory or the like. The control unit 35 may, for example, be built around a CPU, and controls the entire operation of the camera 3 according to control signals from the control device 4. For example, the control unit may perform predetermined exposure calculation on the basis of the image signals captured by the image capture unit 32, and may command the drive unit 32$a$ to provide times for charge accumulation by the image capture chip 113 as required for appropriate exposure.

The control unit 35 includes a range finding calculation unit 35$a$ and the non-volatile memory 35$b$. As described above, the range finding calculation unit 35$a$ performs measurement of the distance to (i.e. finds the range of) each of the objects described above at a plurality of positions in the photographic screen. And the image data that has been acquired by the camera 3 and the range finding data that has been calculated by the camera 3 are sent to the control device 4 (refer to FIG. 1). The non-volatile memory 35$b$ stores the program executed by the control unit 35$a$ and the information required for range finding.

Control of the Imaging Element Blocks

The control device 4 causes the imaging element 100 (i.e. the image capture chip 113) of the camera 3 to perform charge accumulation control independently for each of the block units described above. For doing this, the following signals are inputted from the various sections of the vehicle 1 to the control device 4 (refer to FIG. 2).

(1) The Amount by Which the Accelerator Pedal 7a is Being Stepped Upon

A signal that specifies the amount by which the accelerator pedal 7a is being stepped upon is inputted from the throttle control device 7 to the control device 4.

(2) The Amount by which the Brake Pedal 8a is Being Stepped Upon

A signal that specifies the amount by which the brake pedal 8a is being stepped upon is inputted from the brake control device 8 to the control device 4.

(3) The Rotational Angle of the Steering Wheel 10

A signal that specifies the rotational angle of the steering wheel 10 is inputted from the steering control device 9 to the control device 4. The ratio of the rotational angle of the steering wheel 10 to the steering angle of the steering system depends upon the gearing ratio of the steering.

(4) The Speed V of the Vehicle 1

The detection signal from the vehicle speed sensor 12 is inputted to the control device 4.

(5) The Actuation Signal of the Turn Signal Switch 11

The actuation signal of the turn signal switch 11 is inputted to the control device 4.

(6) The Position to which the Shift Lever is Operated

A signal is inputted to the control device 4 specifying the position to which the shift lever is actuated, as detected by the shift lever position detection device 16.

(7) The Position Information for the Vehicle 1

Position information that has been measured by the GPS device 15 is inputted from the GPS device 15 to the control device 4.

(8) Information About Sound Around the Vehicle 1

Sound information captured by the microphone 17 from the front of the vehicle, from its right side, and from its left side is inputted to the control device 4.

Figure 10:
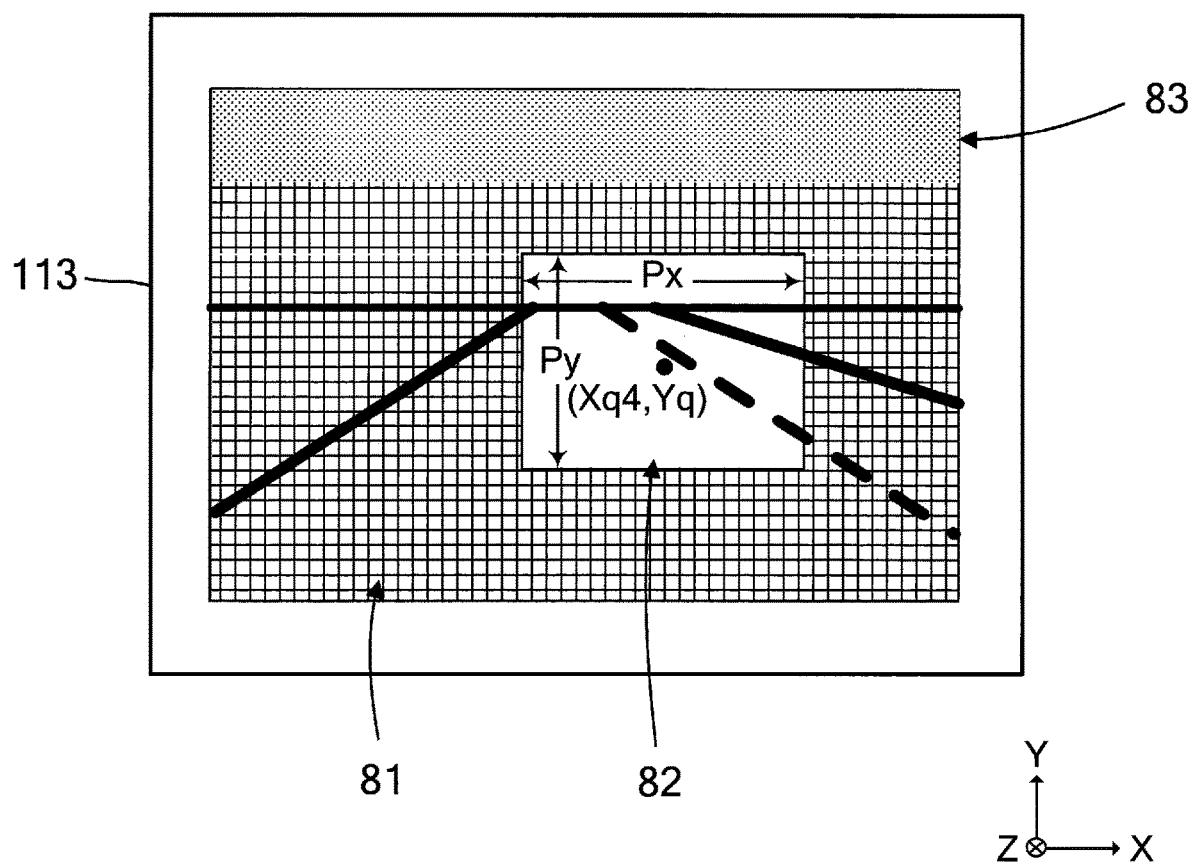
FIG. 10 is a figure showing examples of an imaging surface, an imaging region and a region of attention, and an inactive region upon an image capture chip.

FIG. 10 is a figure showing examples of the imaging surface of the image capture chip 113, regions (an imaging region 81 and a region of attention 82) upon the image capture chip 113 in which charge accumulation (i.e. image capture) is performed, and a region (an inactive region 83) in which charge accumulation (i.e. image capture) in the row direction and the column direction is not performed. The region of attention 82 is a region in which charge accumulation (i.e. image capture) is performed under different conditions from those in the imaging region 81. The sizes and positions of the imaging region 81 and the region of attention 82 upon the image capture chip 113 are also included in the image capture conditions.

The control device 4 executes control by setting first conditions for each of the unit regions 131 included in the imaging region 81 so that they perform image capture, and also executes control by setting second conditions for each of the unit regions 131 included in the region of attention 82 so that they perform image capture. Moreover, the control device does not execute any activity in connection with the unit regions 131 included in the inactive region 83, so that they do not perform image capture.

It should be understood that it would also be acceptable to provide a plurality of regions of interest 82, and it would be acceptable for the conditions for image capture to be different between each of this plurality of regions of interest. Moreover, it would also be acceptable not to provide any inactive region 83.

Explanation of the Flow Charts

Figure 11:
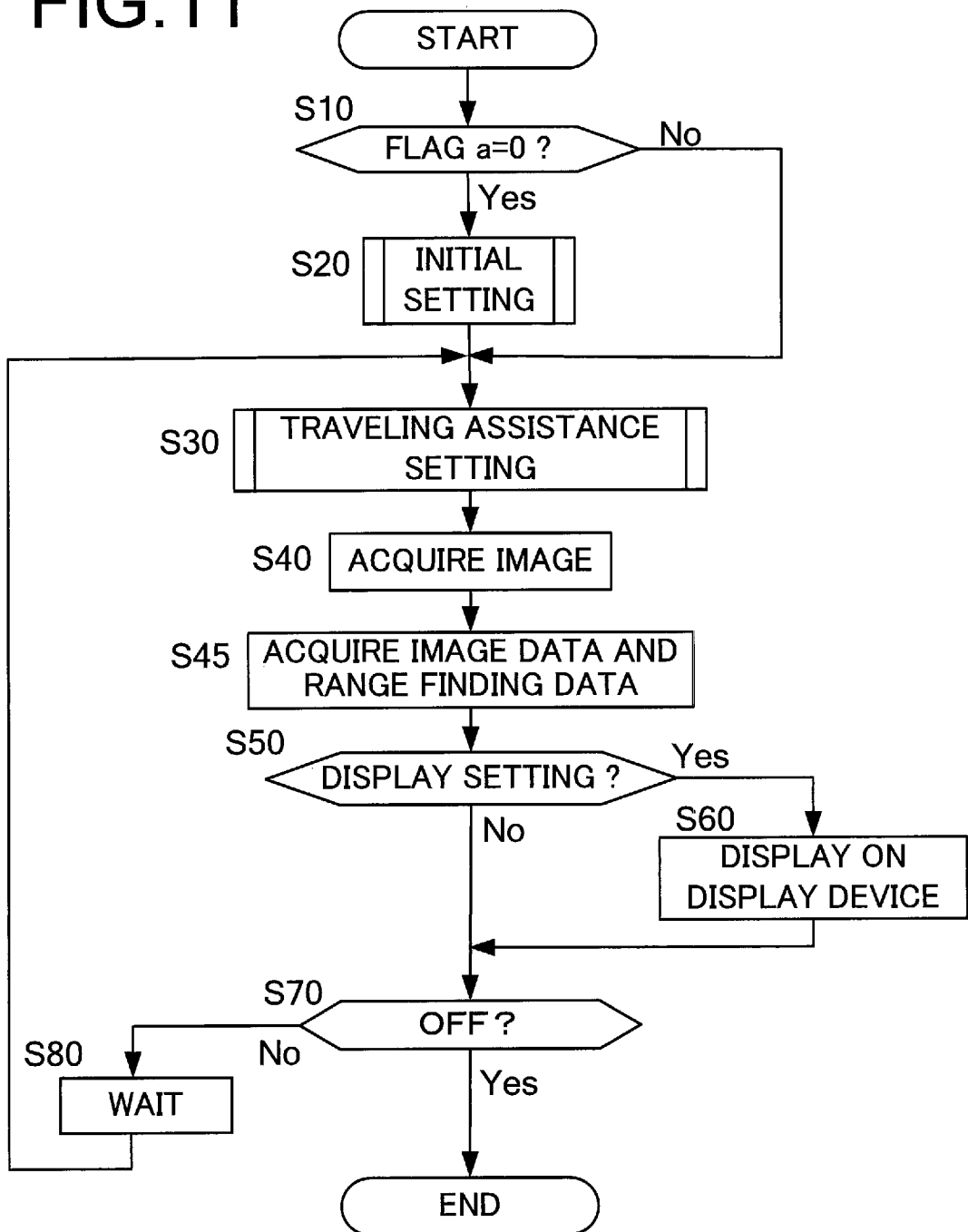
FIG. 11 is a flow chart for explanation of the flow of a camera control procedure executed by a control unit.
Figure 12:
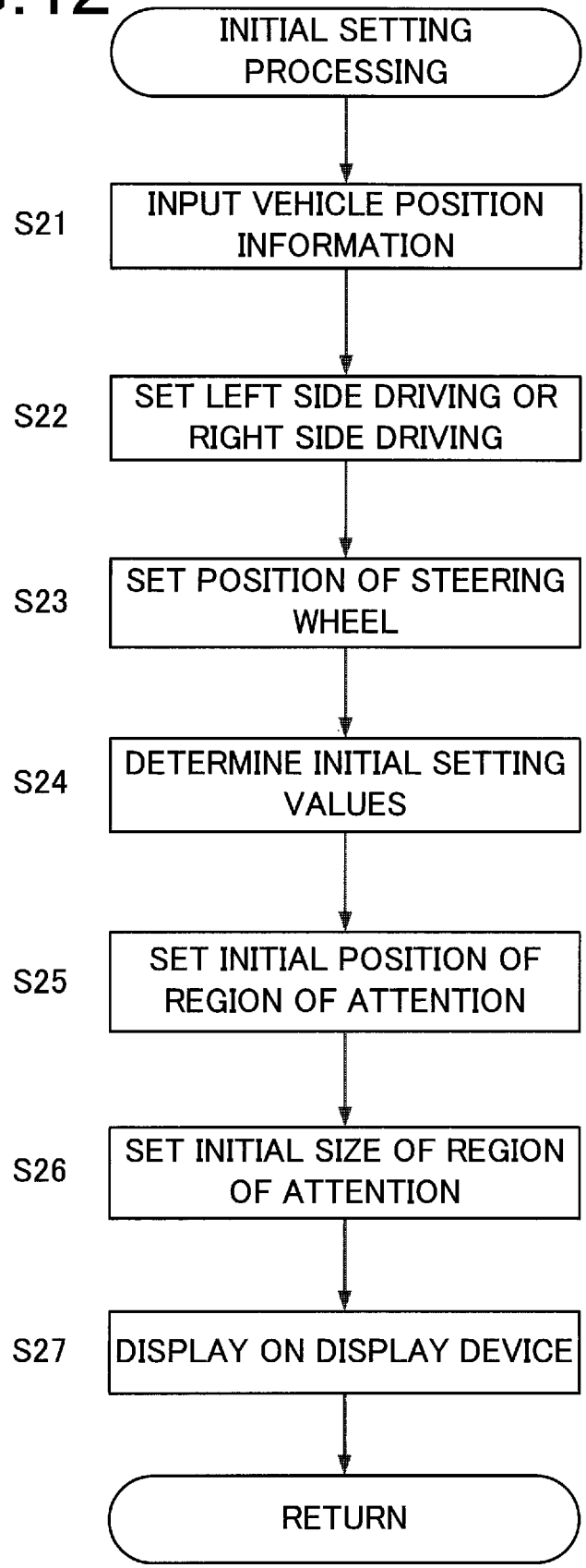
FIG. 12 is a flow chart for explanation of the details of initial setting processing.
Figure 17:
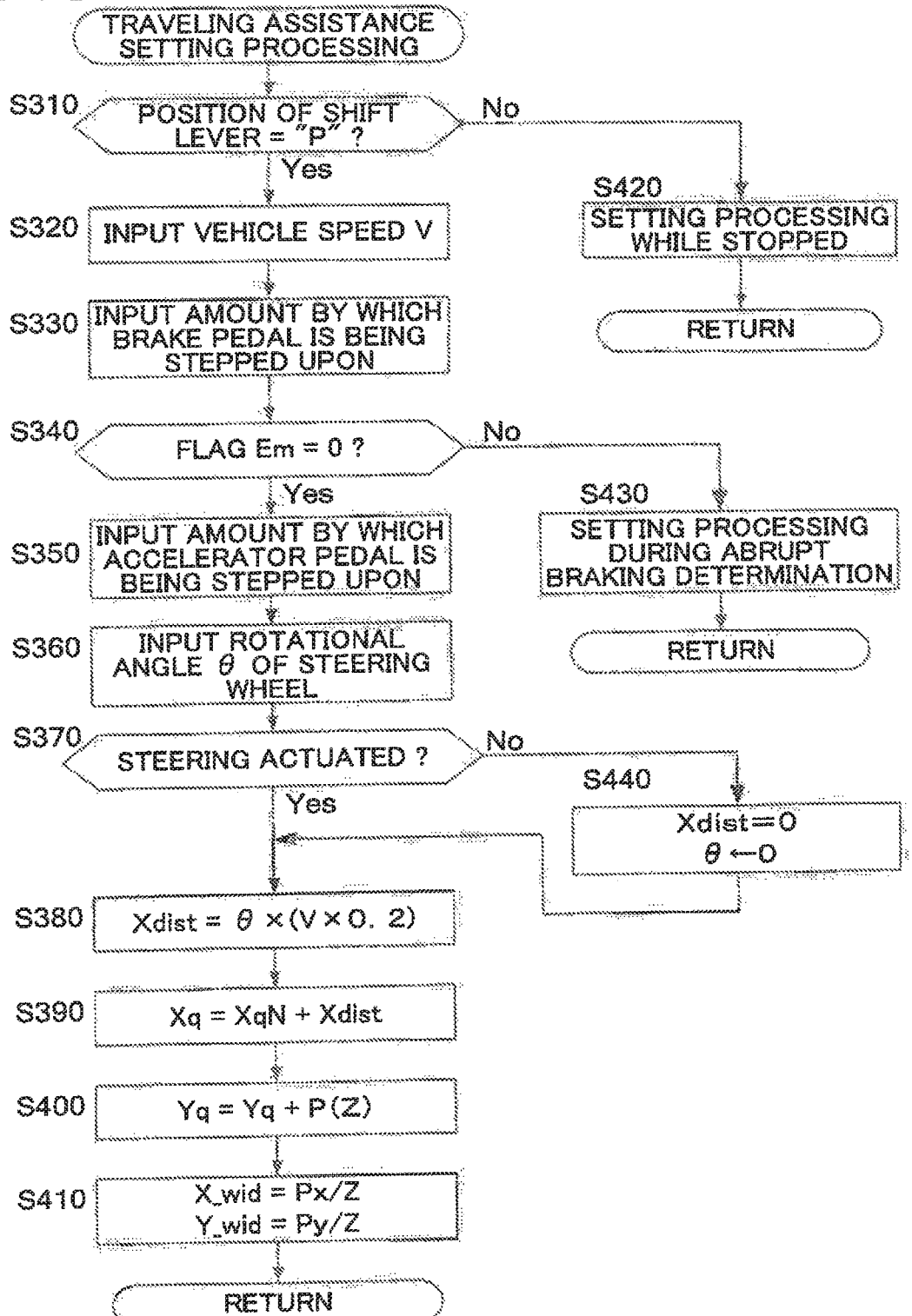
FIG. 17 is a flow chart for explanation of the details of traveling assistance setting processing.

Now, the way in which the imaging region 81 and the region of attention 82 are determined will be explained in the following with reference to the flow charts (FIGS. 11, 12, and 17). FIG. 11 is a flow chart for explanation of the flow of a control procedure for the camera 3 that is executed by the control device 4. The program for executing the processing of the flow chart of FIG. 11 is stored in the storage unit 4b of the control device 4. The control device 4 may, for example, start the program for performing the processing of FIG. 11 when the supply of power from the vehicle 1 is started, or when the engine is started.

In step S10 of FIG. 11, the control device 4 makes a decision as to whether or not a flag a=0. The flag a is a flag that is set to 1 if initial setting has terminated, and that is set to 0 if initial setting has not yet terminated. If the flag a=0 so that the control device 4 reaches an affirmative decision in step S10, then the flow of control proceeds to step S20, whereas if the flag so that a negative decision is reached in the step S10 then the flow of control is transferred to a step S30.

In step S20 the control device 4 performs initial setting processing, and then the flow of control proceeds to step S30. The details of this initial setting processing will be described hereinafter. In step S30, the control device 4 performs traveling assistance setting processing, and then the flow of control proceeds to step S40. In the traveling assistance setting processing, an imaging region 81 and a region of attention 82 upon the imaging element 100 are determined. The details of this traveling assistance setting processing will be described hereinafter.

In step S40, the control device 4 sends a command to the camera 3, and drives the imaging region 81 and the region of attention 82 on the imaging element 100 under respective predetermined conditions, so as to perform acquisition of an image. In this embodiment, for example, as the vehicle speed V increases from zero, the control device 4 may set the frame rate of the region of attention 82 to be higher, its gain to be higher, its decimation ratio to be lower, and its charge accumulation time to be shorter, as compared to the case for the imaging region 81. Along with image capture being performed by the camera 3 in this manner, also distance measurement (i.e. range finding) is performed at a plurality of positions in the photographic screen, as described above.

It should be understood that it is not necessary for all of the frame rate, the gain, the decimation ratio, the charge accumulation time and so on to be different between the imaging region 81 and the region of attention 82; it will be acceptable if only at least one of them is different. Moreover, it would also be acceptable for the control device 4 to establish a setting for no decimation to be performed for the region of attention 82.

In step S45, the control device 4 acquires the image data and the range finding data from the camera 3, and then the flow of control proceeds to step S50. In step S50, the control device 4 makes a decision as to whether or not a setting for information display is established. If display setting is established, then the control device 4 reaches an affirmative decision in step S50, and the flow of control proceeds to step S60. But if display setting is not established, then the control device 4 reaches a negative decision in step S50, and the flow of control is transferred to step S70.

In step S60, the control device 4 sends display information to the display device 14 (refer to FIG. 1), and then the flow of control proceeds to step S70. This display information may be, for example, a message saying "stopped", "doing emergency stop", "turning right", or "turning left" that is displayed upon the display device 14, according to the information corresponding to the state of the vehicle 1 determined during the traveling assistance setting processing (S30).

It should be understood that, instead of outputting such display information, or along with outputting such display information, it would also be acceptable to arrange to output an audio signal for replaying the message described above to an audio replay device not shown in the figures. In this case, it would also be acceptable to employ an audio device of a navigation device not shown in the figures as the audio replay device not shown in the figures.

In step S70, the control device 4 makes a decision as to whether or not OFF actuation has been performed. Upon receipt of, for example, an OFF signal from the vehicle 1 (for example, an OFF signal for the engine), the control device 4 reaches an affirmative decision in step S70 and performs predetermined OFF processing, and then the processing in FIG. 11 terminates. But if, for example, the control device 4 does not receive an OFF signal from the vehicle 1, then it reaches a negative decision in step S70 and the flow of control proceeds to step S80. In step S80, the control device 4 waits for a predetermined time period (for example 0.1 seconds), and then the flow of control returns to step S30. When the flow of control returns to step S30, the processing described above is repeated.

The Initial Setting Processing

FIG. 12 is a flow chart for explanation of the details of step S20 of the FIG. 11 flow chart (i.e. the initial setting processing). In step S21 of FIG. 12, the control device 4 inputs position information for the vehicle 1 from the GPS device 15 (refer to FIG. 1), and then the flow of control proceeds to step S22. In step S22, on the basis of the latitude and longitude included in this position information, the control device 4 sets a flag that shows whether the traffic lane along which the vehicle 1 is to travel is on the left or the right of the road, in other words whether the vehicle travels along the left side or the right side of the road. In concrete terms, the control device 4 determines the name of the country in which the vehicle 1 is being used on the basis of the latitude and the longitude. And, by reference to a database not shown in the figures, the flag is set that shows whether driving on the roads in that country is on the left side or on the right side. This database that specifies the relationship between the country name and left or right side driving is stored in advance in the storage unit 4*b*.

In step S23, the control device 4 sets a flag that indicates the position where the steering wheel 10 is attached to the vehicle 1 (i.e. on the right thereof or on the left thereof), and then the flow of control proceeds to step S24. Information that specifies whether this vehicle is right hand drive or left hand drive is stored in advance in the storage unit 4*b* as specification information for the vehicle 1. In step S24, the control device 4 determines the initial setting value on the basis of a table such as that shown by way of example in FIG. 13. It should be understood that the order of steps S21 and S23 could be changed.

According to FIG. 13, four initial setting values from "1" to "4" are prepared, according to the combination of the position of attachment of the steering wheel in the vehicle 1 (i.e. whether the vehicle is right hand drive or left hand drive) and the position of the traffic lane on the road (i.e. upon the right side or upon the left side). In the case of a right hand drive steering wheel and driving on the left, the initial setting value is "4".

In step S25, the control device 4 sets an initial position for the region of attention 82. This initial position of the region of attention 82 is positioned according to the initial setting value. In concrete terms, the control device 4 takes the initial position of the region of attention 82 as being (Xq1, Yq) when the initial setting value is "1", takes the initial position of the region of attention 82 as being (Xq2, Yq) when the initial setting value is "2", takes the initial position of the region of attention 82 as being (Xq3, Yq) when the initial setting value is "3", and takes the initial position of the region of attention 82 as being (Xq4, Yq) when the initial setting value is "4".

In this explanation, in the coordinate system that specifies the imaging region 81, the position of the region of attention 82 is given by the coordinates (Xq, Yq) of the center of the region of attention 82. FIG. 10 shows an example of the region of attention when the initial setting value is "4", and, since this is the case of a right hand drive steering wheel and driving on the left, the initial position (Xq4, Yq) is determined so that the region of attention 82 is set toward the driver's seat side (i.e. toward the right) in the left side traffic lane.

Figure 14:
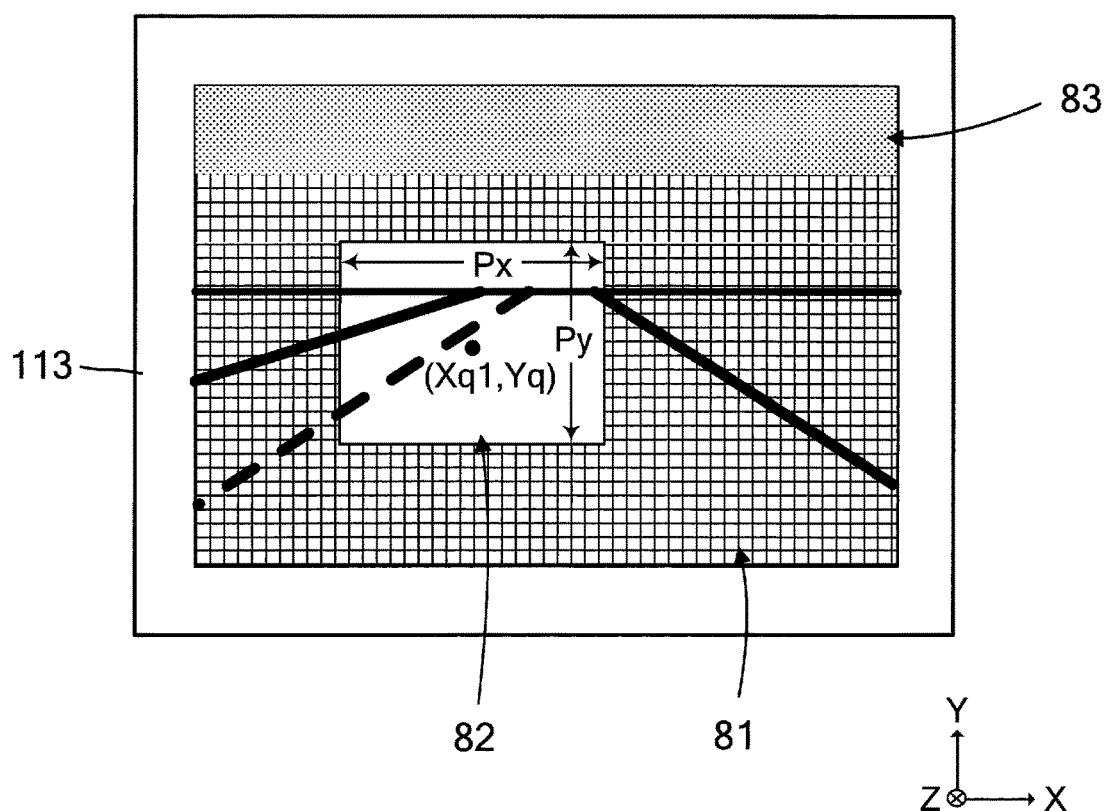
FIG. 14 is a figure showing examples of the imaging surface, the imaging region and the region of attention, and the inactive region of the image capture chip.

FIG. 14 shows an example of the region of attention 82 when the initial setting value is "1", and, since this is the case of a left hand drive steering wheel and driving on the right, the initial position (Xq1, Yq) is determined so that the region of attention 82 is set toward the driver's seat side (i.e. toward the left) in the right side traffic lane.

Figure 15:
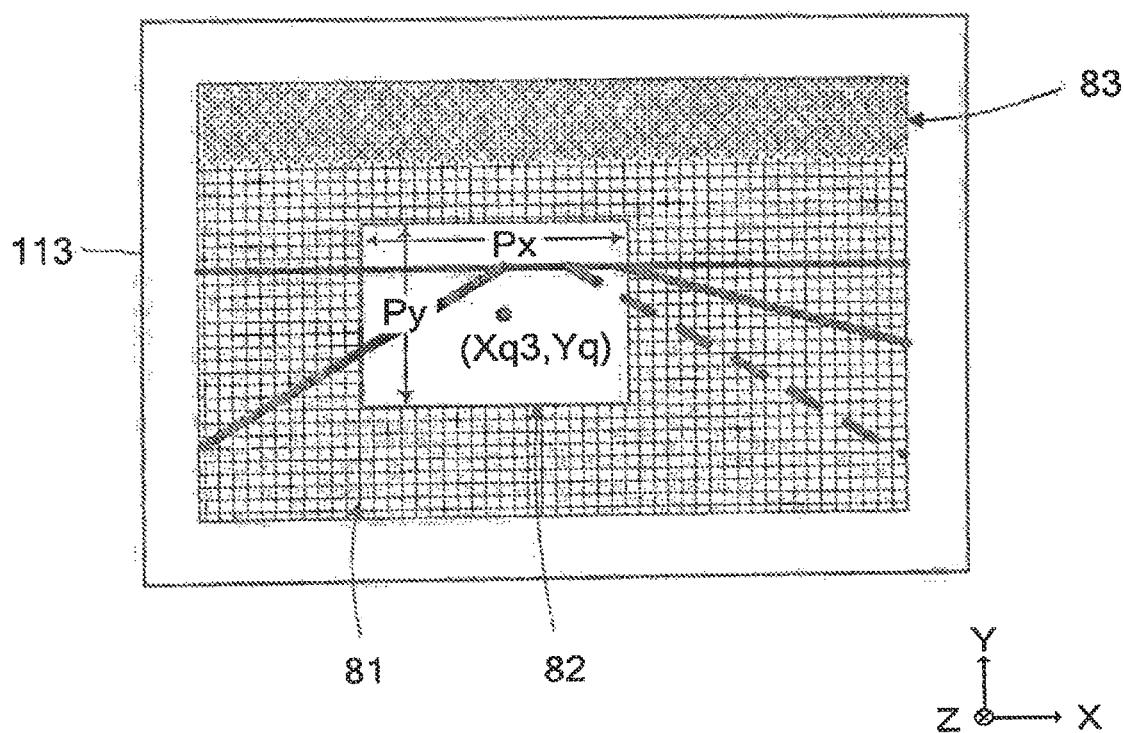
FIG. 15 is a figure showing examples of the imaging surface, the imaging region and the region of attention, and the inactive region of the image capture chip.

FIG. 15 shows an example of the region of attention 82 when the initial setting value is "3", and, since this is the case of a left hand drive steering wheel and driving on the left, the initial position (Xq3, Yq) is determined so that the region of attention 82 is set toward the driver's seat side (i.e. toward the left) in the left side traffic lane.

Figure 16:
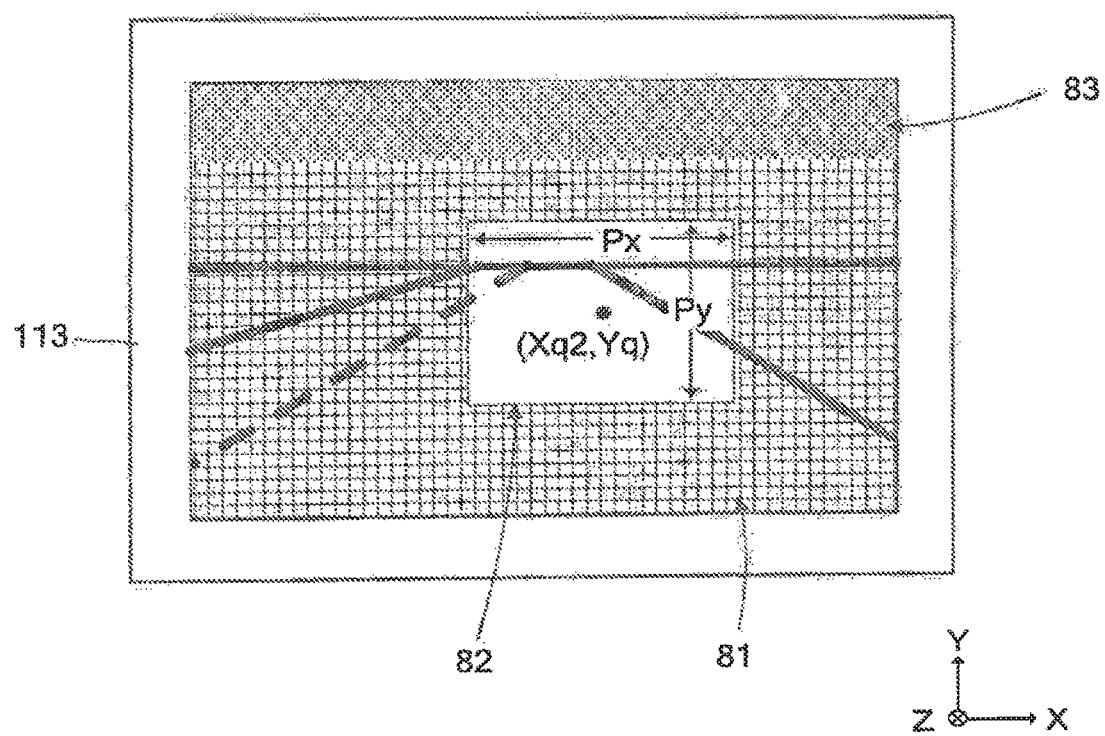
FIG. 16 is a figure showing examples of the imaging surface, the imaging region and the region of attention, and the inactive region of the image capture chip.

And FIG. 16 shows an example of the region of attention 82 when the initial setting value is "2", and, since this is the case of a right hand drive steering wheel and driving on the right, the initial position (Xq2, Yq) is determined so that the region of attention 82 is set toward the driver's seat side (i.e. toward the right) in the right side traffic lane.

In step S26 of FIG. 12, the control device sets the initial size of the region of attention 82. In this embodiment, the initial size of the region of attention 82 (i.e. Px (in the X axis direction)×Py (in the Y axis direction)) is determined on the basis of the size of an object (for example, the size of the leading vehicle in front). If the leading vehicle is included in the image acquired by the camera 3, then the control device 4 estimates the size of the leading vehicle on the basis of the height of the image of the leading vehicle that has been captured by the image capture chip 113, the focal length of the image capture optical system 31 which is already known, and the distance L from the vehicle 1 to the leading vehicle that has been obtained by range finding. And, the numbers of pixels in the image obtained upon the imaging chip 113 (i.e. Px (in the X axis direction)×Py (in the Y axis direction)) by imaging a leading vehicle with an estimated size (for example, width 3 (m)×height 1.4 (m)) from its rear 1 (m) away are taken as being its initial size.

Px and Py are calculated according to the following Equations (1) and (2):

$$Px = ox \times L \quad (1)$$

$$Py = oy \times L \quad (2)$$

Here, ox is the number of pixels in the X axis direction in the image of the leading vehicle L (m) away that has been captured by the image capture chip 113. And oy is the number of pixels in the Y axis direction in the image of the leading vehicle L (m) away that has been captured by the image capture chip 113. L is the inter-vehicle distance from the vehicle 1 to the leading vehicle.

It should be understood that, in the coordinate system that specifies the imaging region 81, the value Yq described above that specifies the initial position corresponds to the center of the height of the image obtained upon the image capture chip (in this example, a location at a height of 0.7 (m) on the leading vehicle) by imaging the above described leading vehicle from 1 (m) away.

In step S27, the control device 4 outputs display information to the display device 14 (refer to FIG. 1) and sets the flag a to 1, and then the processing of FIG. 12 terminates. This display information is information that specifies the end of the initial setting processing: for example, the message "initial setting completed" is displayed upon the display device 14.

The Traveling Assistance Setting Processing

FIG. 17 is a flow chart for explanation of the details of the traveling assistance setting processing. If, in step S310 of FIG. 17, the information specifying the position of the shift lever inputted from the shift lever position detection device 16 (refer to FIG. 1) is "P" (i.e. parking), then the control device 4 reaches an affirmative decision in step S310, and the flow of control proceeds to step S320. But if the information specifying the position of the shift lever inputted from the shift lever position detection device 16 (refer to FIG. 1) is not "P", then the control device 4 reaches a negative decision in step S310, and the flow of control is transferred to step S420. It should be understood that it would also be acceptable to arrange to apply the decision of this step S310 to the case when the shift lever is in "N" (i.e. neutral).

In step S320, the control device 4 inputs the vehicle speed V from the vehicle speed sensor 21, and then the flow of control proceeds to step S330. The control device 4 may, for example, change the frame rate of the region of attention 82 according to the vehicle speed V. As described above, when the frame rate of the region of attention 82 is set to be higher as compared to the frame rate of the imaging region 81, then the control device 4 sets the frame rate of the region of attention 82 to be higher as the vehicle speed V increases, and sets the frame rate of the region of attention 82 to be lower as the vehicle speed V decreases. In this case, it would also be acceptable to arrange for the control device 4 to apply control so as to make the frame rate of the imaging region 81 outside the region of attention 82 also be proportionate to the vehicle speed V. In step S330, the control device 4 inputs the amount by which the brake pedal 8a is being stepped upon from the brake control device 8 (refer to FIG. 1), and then the flow of control proceeds to step S340.

In step S340, on the basis of the vehicle speed V and the amount by which the brake pedal 8a is being stepped upon (i.e. the angle through which it is being depressed), the control device 4 makes a decision as to whether or not a flag Em=0. The flag Em is a flag that is set as shown by way of example in FIG. 18, on the basis of the vehicle speed V and the amount of change of the amount by which the brake pedal 8a is being stepped upon (i.e. the angle through which it is being depressed). In this embodiment, it is determined that emergency braking (i.e. abrupt braking) is being performed if Em=1, while it is determined that normal braking is being performed if Em=0. If Em=0 then the control device 4 reaches an affirmative decision in step S340 and the flow of control proceeds to step S350. But if Em=1 then the control device 4 reaches a negative decision in step S340 and the flow of control is transferred to step S430.

It should be understood that, instead of the amount of change of the amount by which the brake pedal 8a is being stepped upon (i.e. of the angle through which it is being depressed), it would also be acceptable to arrange to determine that Em=1 on the basis of the amount of change of the opening amount of a brake valve not shown in the figures. Moreover, it would also be acceptable to arrange to determine that Em=1 on the basis of the amount of change of the vehicle speed V, or to arrange to determine that Em=1 on the basis of the amount of change of the deceleration ratio of a speed change mechanism not shown in the figures.

In step S350, the control device 4 inputs the amount by which the accelerator pedal 7a is being stepped upon from the throttle control device 7 (refer to FIG. 1), and then the flow of control proceeds to step S360. And in step S360 the control device 4 inputs the rotational angle θ of the steering wheel 10 from the steering control device 9, and then the flow of control proceeds to step S370. In step S370, the control device 4 makes a decision as to whether or not steering actuation has been performed. If the rotational angle θ is greater than a predetermined value then the control device 4 reaches an affirmative decision in step S370 and the flow of control proceeds to step S380, while if the rotational angle θ is less than or equal to the predetermined value then a negative decision is reached in step S370 and the flow of control is transferred to step S440.

In step S380, the control device 4 calculates the amount of shifting $X_{dist}$ of the region of attention 82 in the X axis direction on the basis of the rotational angle θ of the steering wheel 10 and the vehicle speed V, according to the following Equation (3):

$$X_{dist} = \theta \times (V \times 0.2) \tag{3}$$

According to Equation (3) above, the shifting amount $X_{dist}$ becomes greater, the greater is the steering angle of the steering system (in other words, the rotational angle θ of the steering wheel 10), and the greater is the vehicle speed V.

In step S390, the control device 4 calculates the position (i.e. the X coordinate) of the region of attention 82 during traveling on the basis of the initial position (XqN, Yq) of the region of attention 82 that was set during the initial setting processing, according to the following Equation (4):

$$Xq = XqN + X_{dist} \tag{4}$$

Here, N is one of the initial setting values 1 through 4 that was determined during the initial setting processing.

$X_{dist}$ is the shifting amount of the region of attention 82 in the X axis direction as calculated in step S380, and corresponds to a number of pixels in the X axis direction. Due to the processing in step S390, the position of the region of attention 82 changes according to steering actuation. Moreover, the position of the region of attention 82 also changes according to the magnitude of the vehicle speed V.

In step S400, on the basis of the initial position (XqN, Yq) of the region of attention 82 that was set in the initial setting processing, the control device 4 calculates the position (the Y coordinate) of the region of attention 82 during traveling according to the following Equation (5):

$$Yq = Yq + P(Z) \tag{5}$$

Here, P(Z) is the shifting amount of the region of attention 82 in the Y axis direction, and is a number of pixels in the Y axis direction corresponding to the depth Z (m). For example, this function may specify to how many pixels in the Y axis direction an image of a road of depth 20 (m) corresponds. The relationship P(Z) between the depth Z and the number of pixels is stored in advance in the storage unit 4b (refer to FIG. 2).

In general, when the direction of travel along a flat straight road is imaged, the number of pixels in the Y axis direction corresponding to the image of the road upon the image capture chip 113 increases as the depth Z (m) from the vehicle 1 becomes deeper. Therefore, the value of Yq that corresponds to the center in height of the image obtained by imaging the above described leading vehicle from 1 (m) away increases as the leading vehicle to which attention should being directed becomes further away (i.e. as the depth Z becomes deeper).

The control device 4 determines the depth Z of the leading vehicle to which attention should be directed according to the following Equation (6):

$$Z = Za + Zb \quad (6)$$

Here, Za is the braking distance (m) upon a dry road, and Zb is the braking distance (m) upon a wet road surface. Za and Zb may, for example, be based on the values shown in FIG. 19. In this embodiment, the position of the region of attention 82 is determined so that the leading vehicle at the depth Z in front of the vehicle 1 (in other words, at the position separated by Z (m) from the vehicle 1) is included in the region of attention 82. This is based upon the idea of directing attention further away than the distance that is required for stopping the vehicle if emergency braking is applied. Values (Za+Zb) of the depth Z corresponding to vehicle speeds V are stored in advance in the storage unit 4b (refer to FIG. 2). According to the processing of step S400, the position of the region of attention 82 changes according to change of the vehicle speed V.

For the region of attention 82 whose position has changed in this manner, at least one of the frame rate, the gain, the decimation ratio, the charge accumulation time, and so on is changed between the imaging region 81 and the region of attention 82.

In step S410, on the basis of the initial size (Px×Py) of the region of attention 82 that was set in the initial setting processing, the size (X_wid, Y_wid) of the region of attention 82 during traveling is calculated according to the following Equations (7) and (8), and then the processing of FIG. 17 terminates.

$$X\_wid = Px/Z \quad (7)$$

$$Y\_wid = Py/Z \quad (8)$$

Here, Px is the number of pixels in the X axis direction set in step S26, and Py is the number of pixels in the Y axis direction set in step S26. According to the above Equations (7) and (8), the size (X_wid, Y_wid) of the region of attention 82 during traveling becomes smaller than the initial size (Px×Py) of the region of attention 82, the further away the leading vehicle to which attention should be directed becomes (i.e. the deeper the depth Z becomes). According to the processing of step S410, the size of the region of attention 82 changes according to change of the vehicle speed V.

For the region of attention 82 whose size has been changed in this manner, at least one of the frame rate, the gain, the decimation ratio, the charge accumulation time, and so on is different between the imaging region 81 and the region of attention 82.

In step S420 to which the flow of control is transferred when a negative decision is reached in step S310 described above, the control device 4 performs setting processing while stopped, and the processing of FIG. 17 terminates. This setting processing while stopped determines the position of the region of attention 82 so that a vehicle in front that is separated by, for example, 1 (m) is included in the region of attention 82. Moreover, the size of the X axis direction of the region of attention 82 is set to a maximum, so that objects in positions close to the side portions of the vehicle 1 are also, to the greatest possible extent, included in the region of attention 82.

In step S430 to which the flow of control is transferred when a negative decision is reached in step S340 described above, the control device 4 performs setting processing during abrupt braking determination, and then the processing of FIG. 17 terminates. In this setting processing during abrupt braking determination, for example, in the region of attention 82, decimation is stopped, the frame rate is raised to maximum, the charge accumulation time is shortened, and the gain is set to be higher.

It should be understood that it would also be acceptable to arrange for the control device 4 to increase the frame rate of the imaging region 81 outside the region of attention 82. Moreover, the control device 4 may issue a command to the camera 3 for performing recording, so as to store in the recording unit 36 the images acquired by the camera 3 during a predetermined time period (for example, 5 seconds to 15 seconds) after a negative decision has been reached in step S340.

After abrupt stopping, the control device 4 further shifts the region of attention 82 to the initial position for the region of attention 82 that was set during the initial setting processing (step S25 of FIG. 12), and also changes the size of the region of attention 82 to the initial size (Px×Py) of the region of attention 82 that was set during the initial setting processing (step S26 of FIG. 12). Due to this, the position and the size of the region of attention 82 that were changed due to the vehicle speed V during traveling are returned to a position and size that are appropriate when the vehicle is stopped.

In step S440 to which the flow of control is transferred when a negative decision is reached in step S370 described above, the control device 4 performs setting for not shifting the position of the region of attention 82 (i.e. its X coordinate) during traveling. In other words, if the rotational angle θ of the steering wheel 10 is less than or equal to a predetermined value, θ is set to 0, and also the value of $X_{dist}$ is set to 0. That is, if the actuation angle of the steering wheel 10 is less than the predetermined value, the position of the region of attention 82 (i.e. its X coordinate) is preserved unchanged. Due to this, it becomes easier to alleviate the processing burden during fine steering actuation which is not actuation for turning.

Figure 20A:
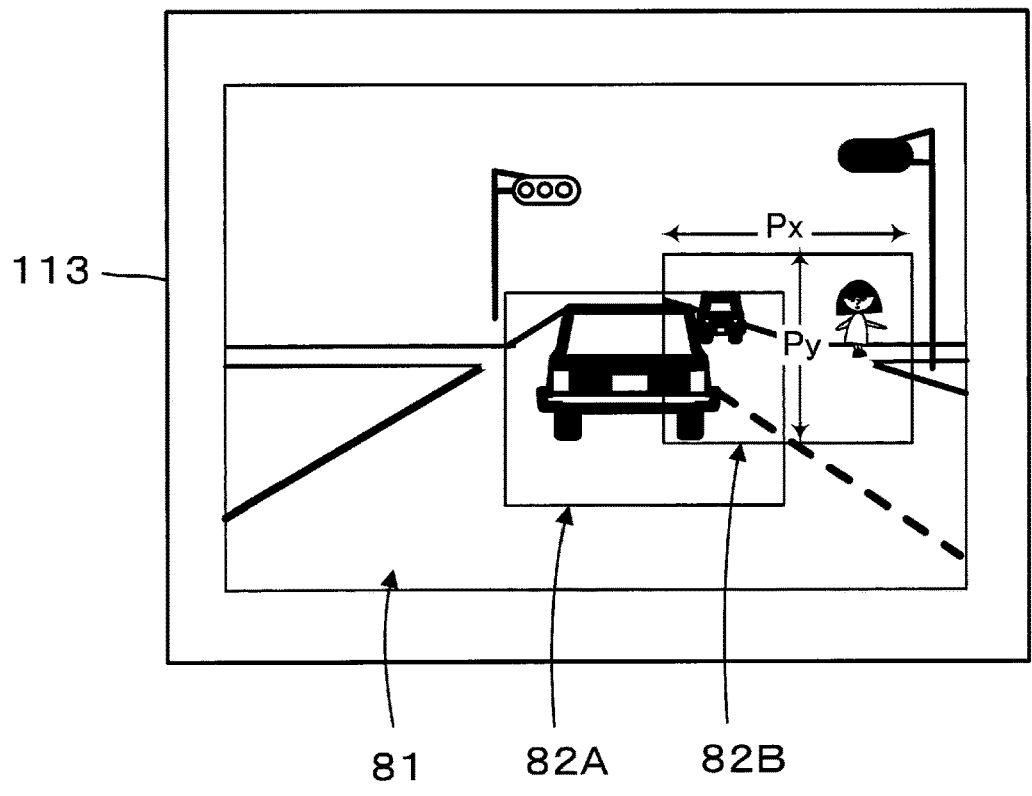
FIG. 20A is a figure showing an example of shifting of the position of the region of attention and change of its size when a right turn is to be made upon a normal road at an intersection.

FIG. 20A is a figure showing an example of shifting of the position of the region of attention 82 and change of the size of the region of attention 82 when a right turn is to be made on a normal road at an intersection. According to the traveling assistance setting processing described above, if the vehicle 1 is waiting behind a leading vehicle in front in order to perform a right turn, the region of attention 82A is its initial position, and the size of the region of attention 82A is approximately the same as its initial size (Px×Py). When, in the state in which the vehicle 1 is moving forward, the driver starts to actuate the steering toward the right direction, then the position of the region of attention 82B shifts slantingly rightward and upward. And, since the vehicle speed V is low, accordingly the size of the region of attention 82A is also approximately the same as its initial size (Px×Py).

Figure 20B:
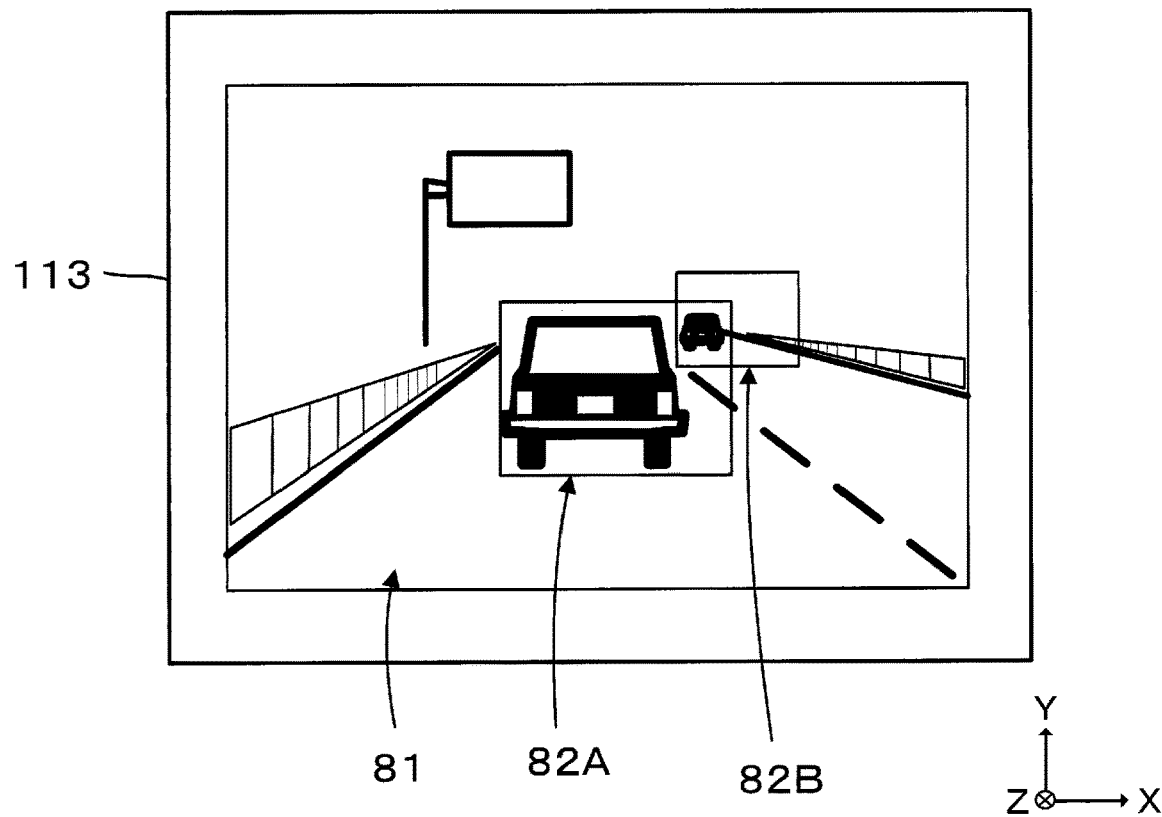
FIG. 20B is a figure showing an example of shifting of the position of the region of attention and change of its size when changing vehicle lane upon a high speed road while accelerating.

And FIG. 20B is a figure showing an example of shifting of the position of the region of attention 82 and change of the size of the region of attention 82 when changing vehicle lane and accelerating into the overtaking vehicle lane on the right side of a high speed road. According to the traveling assistance setting processing described above, if the vehicle 1 is traveling at high speed, then the position of the region of attention 82A is higher than its initial position, and the size of the region of attention 82A is smaller as compared to its initial size (Px×Py). When, in the state in which the vehicle 1 is accelerating, the driver actuates the steering toward the right direction, then the position of the region of attention 82B shifts slantingly rightward and upward. And, since the vehicle speed V is high, accordingly the size of the region of attention 82A is yet smaller. It should be understood that FIGS. 20A and 20B are an example when driving on the left side, and these figures could also be employed with appropriate modification in the case of turning left when driving on the right side, or in the case of changing vehicle lane when driving on the right side. Moreover, it would also be acceptable to arrange to detect the sight line of the driver with the use of a sight line detection device not shown in the figures (for example, a sight line detection device on the steering wheel), and to set a region at which the driver is not looking, or a region that constitutes a blind area, as the region of attention 82.

It is to be understood that, for the above sight line detection, the use of any sight line detection method would be acceptable, such as a corneal reflection method in which the direction of sight line of the driver is detected by reflecting infra-red rays from his cornea, or a limbus tracking method in which the difference in light reflectance between the cornea and the sclera is employed, or an image analysis method of detecting the sight line of the driver by picking up an image of his eyeball with a camera and performing image processing thereupon, or the like.

According to this first embodiment, the following beneficial operational effects are obtained.

(1) Since there are provided the control device 4 that recognizes at least one of the specifications of the vehicle 1 to which the system is mounted and operations upon the actuation unit of the vehicle 1, the image capture unit 32 that has at least the region of attention 82 and the imaging region 81 and that captures the exterior of the vehicle 1, and the control device 4 that sets the image capture conditions of the region of attention 82 and the image capture conditions of the imaging region 81 to be different on the basis of the results of recognition by the control device 4, accordingly it is possible to set the image capture conditions for the camera 3 in an appropriate manner.

(2) Since the control device 4 recognizes the position where the steering wheel 10 is attached to the vehicle (i.e. on its right or on its left side), accordingly it is possible to set the image capture conditions for the camera 3 according to the position in which the driver is riding in the vehicle.

(3) Since the setting unit sets the frame rate for the region of attention 82 and the frame rate for the imaging region 81 to be different according to the position of the steering wheel 10, accordingly it is possible to increase the frame rate for a region of attention 82 that is, for example, on the side of the driver's seat (i.e. on the right) or the like, so that it is possible to set the image capture conditions for the camera 3 in an appropriate manner.

(4) Since the control device 4 is provided that detects information related to the vehicle speed V of the vehicle 1, and this control device 4 sets the image capture conditions for the region of attention 82 and the image capture conditions for the imaging region 81 to be different according to the result of detection of information related to the vehicle speed V, accordingly it is possible to set the image capture conditions of the camera 3 in an appropriate manner according to the vehicle speed V.

(5) Since, when the information related to the vehicle speed V increases and when it decreases, the control device 4 varies at least one of the image capture conditions for the region of attention 82 and the image capture conditions for the imaging region 81, accordingly it is possible to set the image capture conditions of the camera 3 in an appropriate manner by, for example, making the frame rate higher, the faster is the vehicle speed V.

(6) Since, when the rotational angle θ of the steering wheel 10 exceeds the predetermined value, the control device 4 varies at least one of the frame rate for image capture in the region of attention 82 and the frame rate for image capture in the imaging region 81 by increasing it, accordingly it is possible to vary the image capture conditions of the camera 3 during turning operation.

(7) Since the control device 4 that transmits display information to the display device 14 of the vehicle 1 on the basis of the results of image capture by the image capture unit 32 is provided, accordingly it is possible to provide necessary information to someone who is riding in the vehicle 1.

(8) Since, when the rotational angle θ of the steering wheel 10 does not reach the predetermined value, the control device 4 maintains the setting of at least one of the frame rate for image capture in the region of attention 82 and the frame rate for image capture in the imaging region 81, accordingly it is possible to avoid changing the image capture conditions during minute steering actuation when the vehicle is not actually turning. Due to this, for example, it is possible to prevent the frame rate of the region of attention 82 from being minutely changed more often than necessary, and this is helpful for alleviating the processing burden.

(9) Since the control device 4 includes at least one of frame rate of image capture, gain, decimation, pixel signal addition, charge accumulation, bit length, size of the imaging region, and position of the imaging region in the image capture conditions that are to be different between the image capture condition for the region of attention 82 and the image capture condition for the imaging region 81, accordingly it is possible to set the image capture conditions of the camera 3 in an appropriate manner.

(10) Since the control device 4 changes at least one of the center position of the region of attention 82 and the center position of the imaging region 81 on the basis of the result of detection of information related to the vehicle speed V, accordingly it is possible to set the image capture conditions of the camera 3 in an appropriate manner, such as to change the position of the region of attention 82 along with change of the vehicle speed V or the like.

(11) Since the control device 4 changes at least one of the size of the region of attention 82 and the size of the imaging region 81 on the basis of the result of detection of information related to the vehicle speed V, accordingly it is possible to set the image capture conditions of the camera 3 in an appropriate manner, such as to change the size of the region of attention 82 along with change of the vehicle speed V or the like.

(12) Since the control device 4 sets the imaging region 81 to surround the region of attention 82, accordingly it is possible to set the image capture conditions of the camera 3 in an appropriate manner.

(13) Since the steering wheel 10 is provided and serves as an actuation unit of the vehicle 1, and since the control device 4 changes at least one of the center position of the region of attention 82 and the center position of the imaging region 81 on the basis of actuation of the steering wheel, accordingly it is possible to set the image capture conditions of the camera 3 in an appropriate manner, such as to change the position of the region of attention 82 along with change of the course of the vehicle 1 or the like.

It should be understood that while, in the embodiment described above, the camera 3 was controlled under the control of the control device 4, it would also be acceptable to arrange for a part of the control of the camera 3 to be performed by the control unit 35 of the camera 3.

One or a plurality of variant embodiments such as the following may also be combined with the first embodiment described above.

Variant Embodiment #1

In the traveling assistance setting processing, it would also be acceptable to arrange for the control device 4 to change the position of the region of attention 82 and the size of the region of attention 82 according to an actuation signal from the turn signal switch 11. As shown by way of example in FIG. 21, the control device 4 may change the size of the region of attention 82 and/or set the image capture conditions for the region of attention 82 on the basis of the initial setting value that was determined in step S24, and the direction of the turn signal resulting from actuation of the turn signal switch 11.

For example, to explain with reference to FIG. 10, when the steering wheel is on the right side of the vehicle and the vehicle is driving on the left side of the road so that the initial setting value is "4", and if the turn signal is indicating the left direction, then the control device 4 performs control so as to include the left edge of the road in the region of attention 82. In concrete terms, the control device 4 widens the region of attention 82 of FIG. 10 toward the left side. This widening of the region of attention 82 toward the left side is in order to prevent involvement in an accident while turning left. Conversely, if the turn signal is indicating the right direction, then the control device 4 performs control so as to include the opposite vehicle lane in the region of attention 82. In concrete terms, the control device 4 widens the region of attention 82 of FIG. 10 toward the right side.

To explain with reference to FIG. 14, when the steering wheel is on the left side of the vehicle and the vehicle is driving on the right side of the road so that the initial setting value is "1", and if the turn signal is indicating the left direction, then the control device 4 performs control so as to include the opposite vehicle lane in the region of attention 82. In concrete terms, the control device 4 widens the region of attention 82 of FIG. 14 toward the left side. Conversely, if the turn signal is indicating the right direction, then the control device 4 performs control so as to include the right edge of the road in the region of attention 82. In concrete terms, the control device 4 widens the region of attention 82 of FIG. 14 toward the right side. This widening toward the right side is in order to prevent involvement in an accident while turning right.

To explain with reference to FIG. 16, when the steering wheel is on the right side of the vehicle and the vehicle is driving on the right side of the road so that the initial setting value is "2", and if the turn signal is indicating the left direction, then the control device 4 performs control so as to include the opposite vehicle lane in the region of attention 82. In concrete terms, the control device 4 greatly widens the region of attention 82 of FIG. 16 toward the left side. Conversely, if the turn signal is indicating the right direction, then the control device 4 performs control so as to include the right edge of the road in the region of attention 82. In concrete terms, the control device 4 somewhat widens the region of attention 82 of FIG. 16 toward the right side. This widening toward the right side is in order to prevent involvement in an accident while turning right.

And to explain with reference to FIG. 15, when the steering wheel is on the left side of the vehicle and the vehicle is driving on the left side of the road so that the initial setting value is "3", and if the turn signal is indicating the left direction, then the control device 4 performs control so as to include the left edge of the road in the region of attention 82. In concrete terms, the control device 4 somewhat widens the region of attention 82 of FIG. 15 toward the left side. This widening toward the left side is in order to prevent involvement in an accident while turning left. Conversely, if the turn signal is indicating the right direction, then the control device 4 performs control so as to include the opposite vehicle lane in the region of attention 82. In concrete terms, the control device 4 greatly widens the region of attention 82 of FIG. 15 toward the right side.

Figure 22:
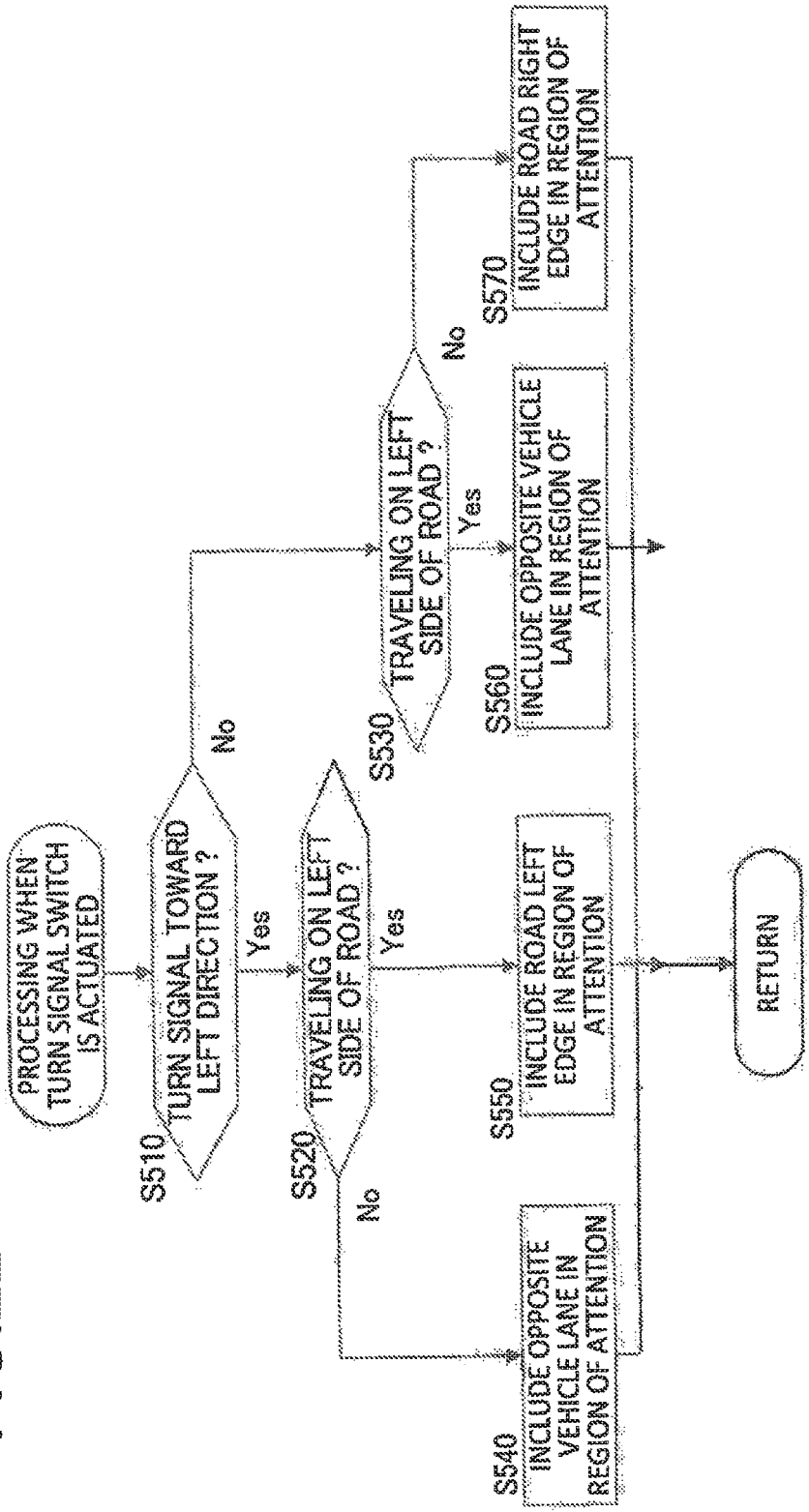
FIG. 22 is a flow chart for explanation of processing according to a Variant Embodiment #1 when a turn signal switch is actuated.

FIG. 22 is a flow chart for explanation of the processing according to this Variant Embodiment #1 when the turn signal switch 11 is actuated. During traveling assistance setting processing, the control device 4 starts the processing of FIG. 22 as a subroutine when an actuation signal from the turn signal switch 11 is inputted. In step S510 of FIG. 22 the control device 4 makes a decision as to whether or not the direction of the turn signal is toward the left. If the turn signal direction is toward the left, then the control device 4 reaches an affirmative decision in step S510 and the flow of control proceeds to step S520, while if the turn signal direction is toward the right, then the control device 4 reaches a negative decision in step S510 and the flow of control is transferred to step S530.

In step S520 the control device 4 makes a decision as to whether or not the position of the traffic lane is to the left side. If the vehicle is traveling on the left side, then the control device 4 reaches an affirmative decision in step S520 and the flow of control is transferred to step S550, while if the vehicle is traveling on the right side, then the control device 4 reaches a negative decision in step S520 and the flow of control is transferred to step S540.

In step S540 the control device 4 controls the image capture unit 32 so that the opposite vehicle lane is included in the region of attention 82, and then the processing of FIG. 22 terminates. And in step S550 the control device 4 controls the image capture unit 32 so that the left edge of the road is included in the region of attention 82, and then the processing of FIG. 22 terminates.

In step S530 the control device makes a decision as to whether or not the position of the traffic lane is to the left side. If the vehicle is traveling on the left side, then the control device 4 reaches an affirmative decision in step S530 and the flow of control is transferred to step S560, while if the vehicle is traveling on the right side, then the control device 4 reaches a negative decision in step S530 and the flow of control is transferred to step S570.

In step S560 the control device 4 controls the image capture unit 32 so that the opposite vehicle lane is included in the region of attention 82, and then the processing of FIG. 22 terminates. And in step S570 the control device 4 controls the image capture unit 32 so that the right edge of the road is included in the region of attention 82, and then the processing of FIG. 22 terminates.

It should be understood that, if the turn signal switch 11 is turned OFF after the processing of FIG. 22 has been executed, then the control device 4 cancels the changing of the size of the region of attention 82 due to FIG. 22. Moreover, if the turn signal switch 11 is turned ON, then, even if the vehicle speed V is zero, as compared to the imaging region 81, settings are made to raise the frame rate for the region of attention 82, to increase the gain, to lower the decimation ratio, and to shorten the charge accumulation time. However, if at least one of the frame rate, the gain, the decimation ratio, the charge accumulation time, or the like is to be made to be different between the imaging region 81 and the region of attention 82, then only the image capture conditions that are to be different are changed.

Since, according to Variant Embodiment #1 as explained above, settings are established according to actuation of the turn signal switch 11 in order to make the image capture conditions for the region of attention 82 and the image capture conditions for the imaging region 81 to be different, accordingly, if for example the vehicle is turning right or left at an intersection, then the opposite vehicle lane is included in the region of attention 82 so that it is possible reliably to detect oncoming vehicles, and/or the road edge is included in the region of attention 82 so that it is possible to prevent involvement in an accident, and as a result it is possible to set the region of attention 82 in an appropriate manner. Furthermore, the frame rate for the region of attention 82 is set to be higher as compared to that for the imaging region 81 and so on, so that it is possible to set the image capture conditions for the imaging region 81 and for the region of attention 82 in an appropriate manner.

Variant Embodiment #2

It would also be acceptable to provide a structure in which, in the traveling assistance setting processing, the control device 4 changes the position of the region of attention 82 and the size of the region of attention 82 according to change in the distance between an object such as a bicycle, an ordinary vehicle, a large sized vehicle, a pedestrian or the like, and the vehicle 1.

In Variant Embodiment #2, when, for example, the vehicle 1 gets nearer to a leading vehicle in front so that the distance L to the leading vehicle (i.e. the inter-vehicle distance) becomes shorter, the control device 4 determines the position of the region of attention 82 so as to include the leading vehicle in the region of attention 82. Here, change of the inter-vehicle distance L from the vehicle 1 to the leading vehicle is obtained on the basis of the images acquired by the camera 3 at predetermined time intervals synchronized with the timing of acquisition of the vehicle speed V, by the range finding calculation unit 35a of the camera 3 repeatedly range finding the distance L (i.e. the inter-vehicle distance) to the leading vehicle within the photographic screen.

The control device 4 calculates the position (i.e. the Y coordinate) of the region of attention 82 during travel by using the inter-vehicle distance L, instead of the depth Z in the above Equation (5). Due to this, in the case of picking up an image of a leading vehicle in front on a flat straight road, the value of Yq that specifies the position of the region of attention 82 in the Y axis direction upon the image capture chip 113 increases as the inter-vehicle distance L becomes longer, and decreases as the inter-vehicle distance L becomes shorter.

Furthermore, since the leading vehicle is photographed by the camera 3 as being larger when the inter-vehicle distance L changes to become shorter, accordingly the control device 4 sets the size of the region of attention 82 to be larger. Conversely, since the leading vehicle is photographed by the camera 3 as being smaller when the inter-vehicle distance L changes to become longer, accordingly the control device 4 sets the size of the region of attention 82 to be smaller. The control device 4 calculates the size of the region of attention 82 during traveling by substituting the inter-vehicle distance L into Equations (7) and (8) above, instead of the depth Z.

While according to the processing of FIG. 17 described above the size of the region of attention 82 is set to be smaller when the vehicle speed V becomes faster, in this Variant Embodiment #2, if the inter-vehicle distance L to a leading vehicle in front is short, the size of the region of attention 82 is set to be large even if the vehicle speed V is high, and accordingly it is possible to include the leading vehicle in the region of attention 82 in an appropriate manner. Due to this, detection of change of the traveling state of the leading vehicle on the basis of the images acquired by the camera 3 becomes simpler and easier, as compared to the case when the size of the region of attention 82 continues to be set to be small.

Also for the region of attention 82 whose size and position are changed in this manner, it will be acceptable to change at least one of the frame rate, the gain, the decimation ratio, the charge accumulation time, or the like between the imaging region 81 and the region of attention 82.

Variant Embodiment #3

If an object such as a bicycle, an ordinary vehicle, a large sized vehicle, a pedestrian or the like is detected in the vicinity of the vehicle 1, even outside the previously set region of attention 82, it would also be acceptable for the control device 4 to set the region of attention 82 anew so as to include this object. In Variant Embodiment #3, when an object that has been detected has moved, the control device 4 sets the region of attention 82 anew so as to include this object. For example, if the distance between the object that has been detected and the vehicle 1 has become closer and is within a predetermined distance, then the control device 4 may set the region of attention 82 anew so as to include this object. And, if the distance between the object that has been detected and the vehicle 1 has become further away and is greater than or equal to the predetermined distance, then the control device 4 may cancel the setting of the region of attention 82 that includes this object.

Also for the region of attention 82 whose size and position have been set in this manner, it will be acceptable for at least one of the frame rate, the gain, the decimation ratio, the charge accumulation time, or the like to be made to be different between the imaging region 81 and the region of attention 82.

Since, according to this Variant Embodiment #3, the control device 4 is provided to detect moving objects in the surroundings of the vehicle 1 on the basis of the information from the camera 3, and since this control device changes at least one of the image capture conditions for the region of attention 82 or the image capture conditions for the imaging region 81 on the basis of the result of this detection of moving objects, accordingly it is possible to set the image capture conditions for the camera 3 in an appropriate manner according to the presence or absence of moving objects.

Furthermore since, when on the basis of information from the camera 3 it has been detected that the distance between the vehicle 1 and a moving object has become closer and is within the predetermined distance, the control device 4 changes at least one of the frame rate for image capture of the region of attention 82 and the frame rate for image capture of the imaging region 81 in the increase direction, accordingly detection of the change of the movement state of the moving object on the basis of the images acquired by the camera 3 becomes simple and easy.

Variant Embodiment #4

It would also be acceptable to set the region of attention 82 anew on the basis of the color of the image acquired by the camera 3. The control device 4 may set a region in the image that includes a red colored object to be the region of attention 82. By adding this region that includes a red colored object to the region of attention 82, it is possible to include, for example, a red light signal, an alarm on a railroad crossing, a red lamp on an emergency vehicle, or the like within the region of attention 82.

Also for the region of attention 82 that has been set in this manner, it will be acceptable for at least one of the frame rate, the gain, the decimation ratio, the charge accumulation time, or the like to be made to be different between the imaging region 81 and the region of attention 82.

Variant Embodiment #5

It would also be acceptable to set the region of attention 82 anew on the basis of sound information in the sound captured by the microphone 17 of the vehicle 1. If for example a level of sound information on the right side of the vehicle 1 that is greater than a predetermined value is inputted, then the control device 4 may widen the region of attention 82 toward the right side in the imaging region 81, or may reset the region of attention 82 toward the right side in the imaging region 81. This provision of the region of attention 82 toward the right side is in order to collect information relating to conditions outside the vehicle 1 on its right side.

Moreover, if for example a level of sound information on the left side of the vehicle 1 that is greater than a predetermined value is inputted, then the control device 4 may widen the region of attention 82 toward the left side in the imaging region 81, or may reset the region of attention 82 toward the left side in the imaging region 81. This provision of the region of attention 82 toward the left side is in order to collect information relating to conditions outside the vehicle 1 on its left side.

Also for the region of attention 82 that has been set in this manner, it will be acceptable for at least one of the frame rate, the gain, the decimation ratio, the charge accumulation time, or the like to be made to be different between the imaging region 81 and the region of attention 82.

Variant Embodiment #6

While, in the first embodiment, a case in which a region of attention 82 that includes a leading vehicle was set, it would also be acceptable to arrange to set a region of attention 82 that includes a vehicle oncoming toward the vehicle 1. In this Variant Embodiment #6, from among the objects that are present within the travel region described above and that are traveling in the opposite direction (i.e. that are oncoming to the vehicle 1), the control device 4 will recognize the vehicle that is closest to the vehicle 1 as being an oncoming vehicle.

In the image acquired by the camera 3, the control device 4 sets the region that corresponds to the position of the oncoming vehicle described above as being the region of attention 82. The control device 4 may particularly set the region of attention 82 to include the number plate of the oncoming vehicle, and/or to include the face of the driver of the oncoming vehicle who is sitting in the driver's seat and is driving.

By setting a region that includes the number plate of the oncoming vehicle or the face of the driver of the oncoming vehicle as the region of attention 82, it is possible to include the oncoming vehicle that is approaching the vehicle 1 in the region of attention 82 in an appropriate manner.

Also for the region of attention 82 that has been set in this manner, it will be acceptable for at least one of the frame rate, the gain, the decimation ratio, the charge accumulation time, or the like to be made to be different between the imaging region 81 and the region of attention 82.

Variant Embodiment #7

While, in the first embodiment, an example was explained in which the imaging region 81 included the region of attention 82 (i.e. surrounded the region of attention 82), it would also be acceptable to arrange to set the imaging region 81 and the region of attention 82 to be side by side, left and right. It would then be possible to vary the sizes and the positions of the imaging region 81 and the region of attention 82 by moving the boundary line between the imaging region 81 and the region of attention 82 left or right. Also with a region of attention 82 that has been set in this manner, it will be acceptable for at least one of the frame rate, the gain, the decimation ratio, the charge accumulation time, or the like to be made to be different between the imaging region 81 and the region of attention 82.

And while, in the first embodiment, as distance measurement performed by the camera 3, a technique was employed for performing range finding calculation by using image signals from pixels for focus detection that were provided upon the imaging element 100, it would also be possible to employ a technique for performing distance measurement by using two images from a stereo camera. Moreover, it would also be possible to employ a technique for performing distance measurement by using a millimeter wave radar separate from the camera 3.

Embodiment #2

In this embodiment, in order to make it easy to find a line upon the road when the traveling environment changes, as for example when traveling in a tunnel or during rainfall or the like, charge accumulation control for the imaging element 100 (i.e. of the image capture chip 113 (refer to FIG. 3)) of the camera 3 (refer to FIGS. 1 and 9) is performed independently for each of the block units described above.

In addition to detecting objects as explained in the first embodiment, the control device 4 also performs detection as described below. That is, from the image data acquired by the camera 3, the control device 4 performs shape detection, color detection, and brightness detection of objects included in the image. In concrete terms, the control device 4 detects data for lines such as white lines or guard rails or the like that are provided along the road. Moreover, on the basis of the brightness situation for each unit region 131 of the image capture chip 113, the control device 4 detects tail lamp (tail light) data representing the state of lighting of the leading vehicle in front.

Furthermore, in this embodiment, the beam changeover switch 18 and the rainfall sensor 19 of FIG. 1 are employed, although they were not utilized in the first embodiment. The beam changeover switch 18 is an actuation member for changing over the angle of illumination of the lighting equipment (i.e. the headlights) of the vehicle between at least two stages in the vertical direction. For example, the beam changeover switch may change over the headlamp beams between shining in an approximately horizontal direction (i.e. "high beam") and shining in a direction lower than the horizontal direction (i.e. "low beam"). The actuation signal from the beam changeover switch 18 is sent both to the lighting equipment not shown in the figure, and to the control device 4.

The rainfall sensor 19 is a detector that detects droplets of rain by an optical method or by an electrostatic capacitance method, and is attached inside the vehicle or outside the vehicle. The detection signal from the rainfall sensor 19 (i.e. rainfall information) is sent to the control device 4.

Figure 23:
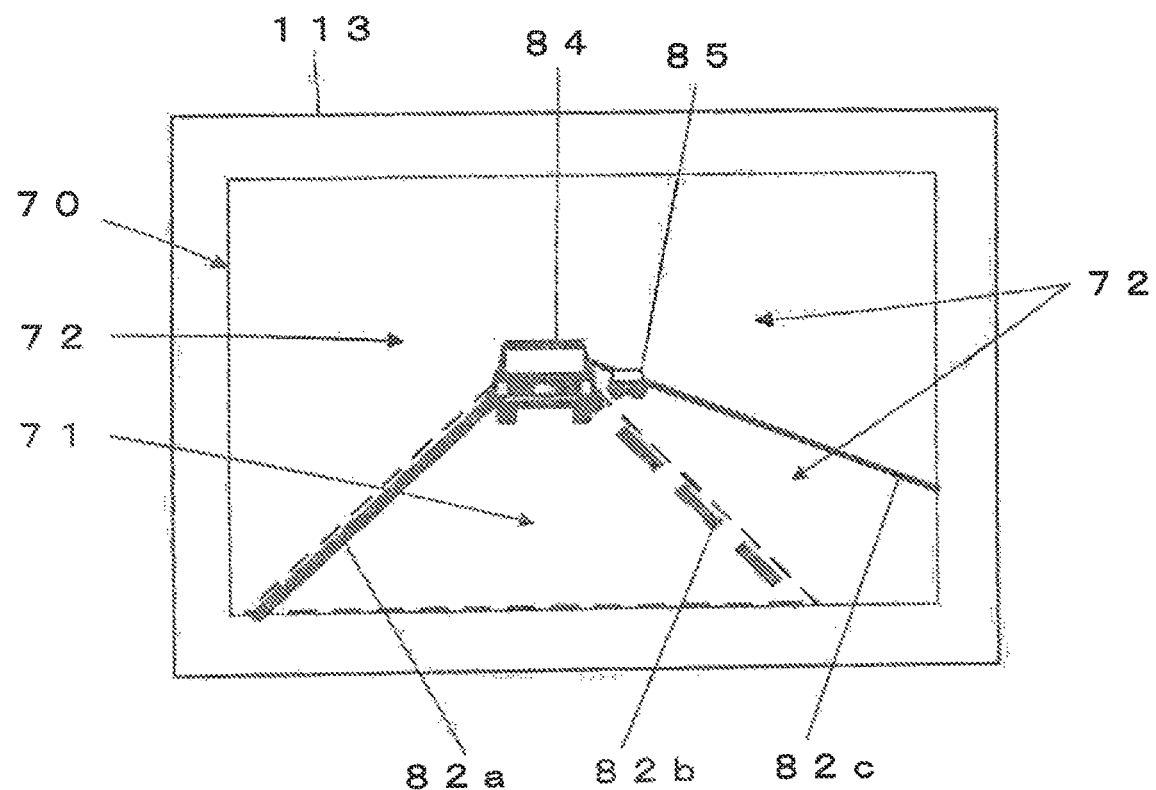
FIG. 23 is a figure schematically showing an image upon the imaging surface of the image capture chip.

FIG. 23 is a figure schematically showing an image of a photographic subject (i.e. of an object) that is focused upon the image capture chip 113. While actually an inverted image is focused, this is shown in the figure as an erect image, for the convenience of understanding. In FIG. 23, the vehicle 1 is traveling behind a leading vehicle 84 that is in front. Images of white lines 82a, 82b, and 82c that are provided upon the road, of the leading vehicle 84 in front, and of an oncoming vehicle 85 are included upon the imaging surface 70 of the image capture chip 113 (i.e. its photographic region). Among these objects, the white lines 82a and 82b that indicate the boundaries of the vehicle traffic lane upon which the vehicle 1 is traveling (i.e. the lane of travel) are objects that are particularly important during detection of the path of travel by the control device 4. Accordingly, in this explanation, an imaging region that includes the white lines 82a and 82b is termed the "region of attention 71".

It should be understood that there are some reference numerals in FIGS. 23, 27, 29, 31, 33 and so on that are the same as ones used in the preceding drawings, but these reference numerals apply to the explanation of the second embodiment.

The control device 4 sets different conditions for the region of attention 71 upon the imaging surface 70 and for the region 72 outside that region (i.e. the region to which particular attention is not drawn), so as to perform charge accumulation (i.e. image capture). Here, the sizes and positions of the region of attention 71 and the region without particular attention 72 upon the imaging surface 70 of the image capture chip 113 are included in the image capture conditions.

Along with setting first conditions and controlling image capture for the unit regions 131 (refer to FIG. 4) that are included in the region of attention 71, the control device 4 also sets second conditions and controls image capture for the unit regions 131 that are included in the region without particular attention 72.

Figure 24:
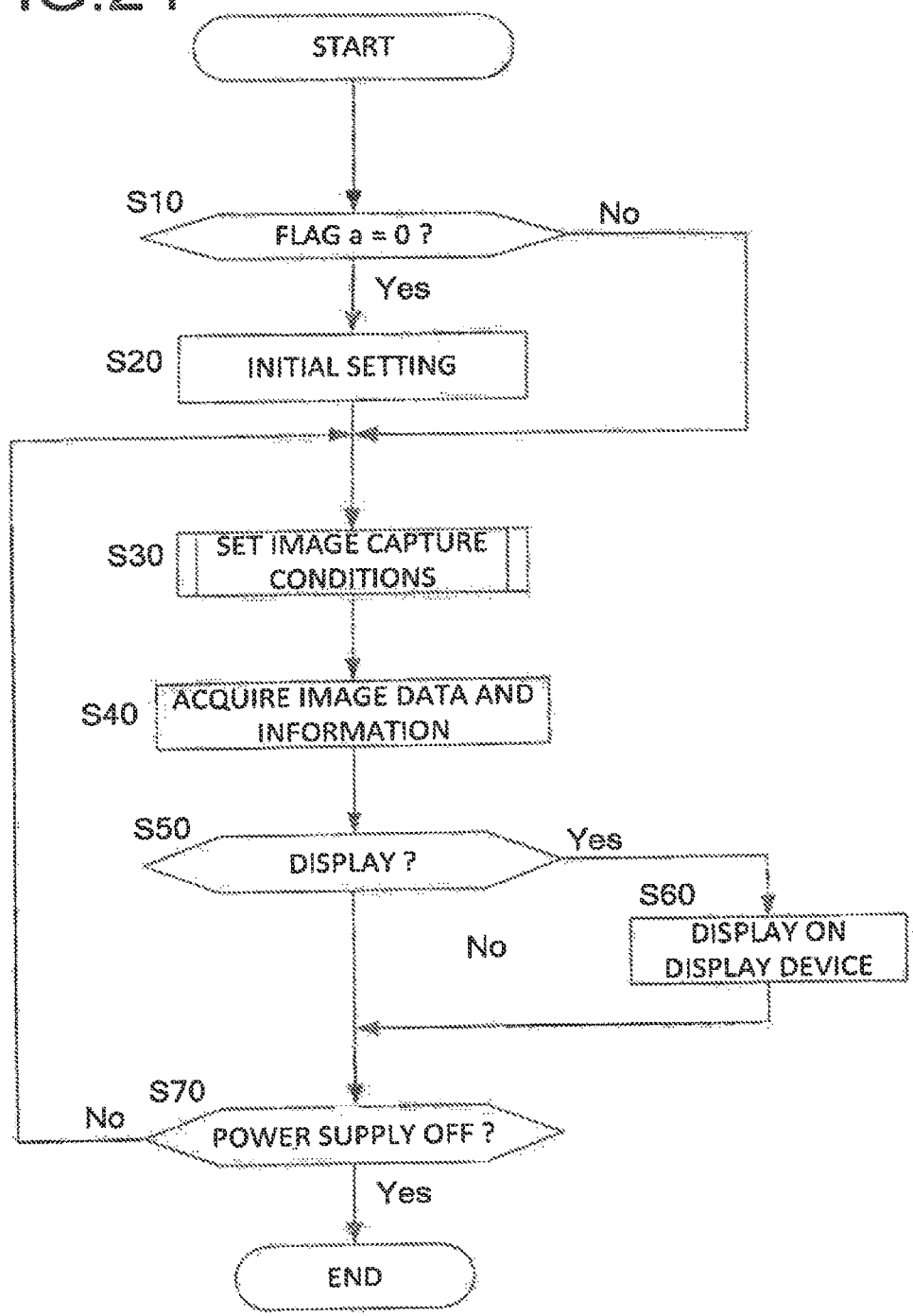
FIG. 24 is a flow chart for explanation of the overall flow of a camera control procedure executed by the control unit.
Figure 25:
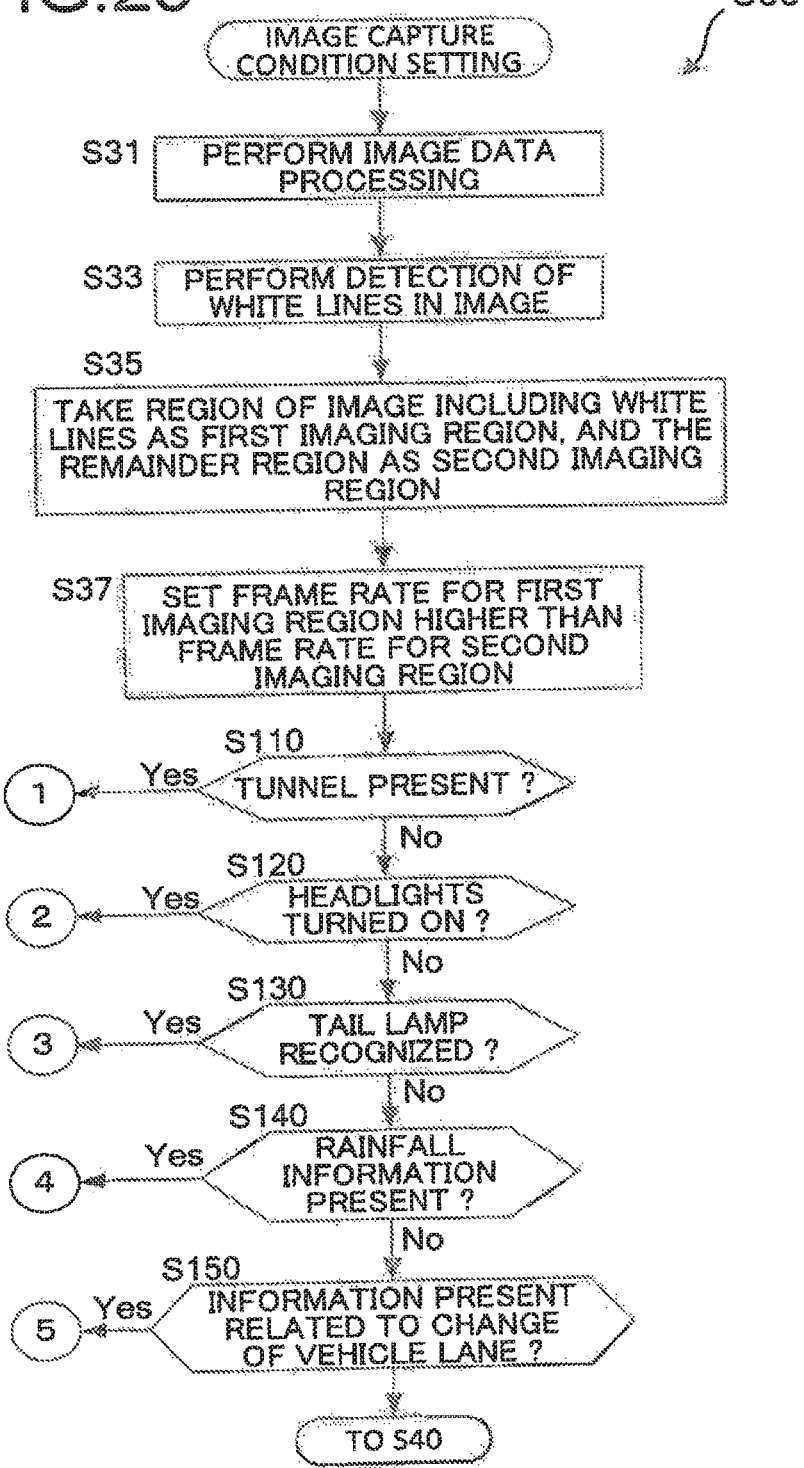
FIG. 25 is a flow chart for explanation of the details of image capture condition setting processing.

It should be understood that it would also be acceptable to provide a plurality of regions of attention 71 and/or a plurality of regions without particular attention 72, and also it would be acceptable to provide, within the region of attention 71 or within the region without particular attention 72, a plurality of regions for which the charge accumulation control conditions (i.e. the image capture conditions) are different. Furthermore, in the row direction and the column direction of the imaging surface 70, it would also be acceptable to provide one or more inactive regions in which charge accumulation (i.e. image capture) is not performed
Explanation of the Flow Charts The control procedure for the camera 3 and the setting of the image capture conditions will now be mainly explained in the following with reference to flow charts thereof (FIGS. 24 and 25). FIG. 24 is a flow chart for explanation of the overall flow of a control procedure for the camera 3, executed by the control device 4. A program for executing the processing of the flow chart of FIG. 24 is stored in the storage unit 4b of the control device 4. The control device 4 may start this program that performs the processing of FIG. 24, for example, when the supply of power from the vehicle 1 is started (i.e. when the system goes ON), or when the engine is started.

In step S10 of FIG. 24, the control device 4 makes a decision as to whether or not a flag a is equal to zero. The flag a is a flag that is set to 1 if the initial setting has been completed, and that is set to zero if the initial setting has not yet been completed. If the flag a is zero then the control device reaches an affirmative decision in step S10 and the flow of control proceeds to step S20, while if the flag a is not zero then a negative decision is reached in step S10 and the flow of control is transferred to step S30.

In step S20, the control device 4 performs initial setting of the camera 3, and then the flow of control proceeds to step S30. This initial setting is setting that is determined in advance for causing the camera 3 to perform predetermined operation. Due to this, the camera 3 sets the same image capture conditions for the entire area of the imaging surface of the imaging element 100; for example, the camera 3 may start image capture at a frame rate of 60 frames per second (i.e. 60 fps).

In step S30, the control device 4 performs image capture condition setting processing, and then the flow of control proceeds to step S40. This image capture condition setting processing is processing in which a region of attention 71 (refer to FIG. 23) and a region without particular attention 72 outside it (also refer to FIG. 23) are set upon the imaging element 100, and image capture conditions are determined for each of these. The details of this image capture condition setting processing will be described hereinafter. In this embodiment, for the region of attention 71, as compared to the region without particular attention 72, the frame rate is set to be higher, the gain is set to be higher, the decimation ratio is set to be lower, and the charge accumulation time is set to be shorter. The camera 3 performs image capture on the basis of these settings, and also performs the distance measurement (i.e. the range finding) described above.

It should be understood that it is not necessary for all of the frame rate, the gain, the decimation ratio, the charge accumulation time, and so on to be different between the region of attention 71 and the region without particular attention 72; it will be acceptable if even only at least one of these parameters is different.

In step S40 of FIG. 24, the control device 4 acquires image data and range finding data acquired by the camera 3 after the image capture condition setting processing, and also acquires information from various sections within the vehicle 1, and then the flow of control proceeds to step S50. In step S50, the control device 4 makes a decision as to whether or not setting for display of this information has been made. If setting for display has been made, then the control device 4 reaches an affirmative decision in step S50 and the flow of control proceeds to step S60. But if setting for display has not been made, then the control device 4 reaches a negative decision in step S50 and the flow of control is transferred to step S70.

In step S60, the control device 4 outputs display information to the display device 14 (refer to FIG. 1), and then the flow of control proceeds to step S70. This display information is information corresponding to the state of the vehicle 1 as determined during the image capture condition setting processing (in step S30); for example, messages such as "entering a tunnel" or "headlights have been turned on" may be displayed upon the display device 14.

It should be understood that, instead of outputting the display information, or along with outputting the display information, it would also be acceptable to arrange to output an audio signal for replaying the message described above via an audio replay device not shown in the figure. In this case as well, as the audio replay device not shown in the figures, it would be acceptable to use an audio device of a navigation device, not shown in the figures.

In step S70, the control device 4 makes a decision as to whether or not OFF actuation has been performed. When, for example, an OFF signal (for example, a system OFF signal or an engine OFF signal) is received from the vehicle 1, the control device 4 reaches an affirmative decision in step S70 and performs predetermined OFF processing, and then the processing of FIG. 24 terminates. But if, for example, the control device 4 does not receive an OFF signal from the vehicle 1, then a negative decision is reached in step S70 and the flow of control returns to step S30. Upon return to step S30, the processing described above is repeated.

Image Capture Condition Setting Processing

The details of the image capture condition setting processing (in step S30) will now be explained with reference to the flow chart of FIG. 25. In this embodiment, 5 examples are shown in which change of the traveling environment (i.e. of the road state) of the vehicle 1 occurs, and the image capture conditions related to the region of attention and the region without particular attention are determined.

In step S31 of FIG. 25, the control device 4 performs the image processing described above upon the image data acquired by the camera 3, and then the flow of control proceeds to step S33. In step S33, the control device 4 detects the white line data described above from the image data, and then the flow of control proceeds to step S35. As described above, the control device 4 takes a region that includes the white line 82a and the white line 82b within the photographic region 70 as being the region of attention 71. To explain this with reference to FIG. 23, the region (shown by the broken line) having a trapezoidal shape and including three elements, i.e. the white line 82a, the white line 82b, and the region between the white line 82a and the white line 82b is taken as the region of attention 71.

In step S35, the control device 4 takes the region of attention 71 described above as a first imaging region 71, and takes the region other than this first imaging region 71 as a second imaging region 72, and then the flow of control proceeds to step S37.

In step S37, the control device 4 sends commands to the camera 3, and sets the frame rate for the first imaging region 71 to be higher than the frame rate for the second imaging region 72. For example, the frame rate for the first imaging region 71 may be set to 120 frames per second (120 fps), while the frame rate for the second imaging region 72 is set to 60 frames per second (60 fps). This is done in order to enhance the frequency at which information is acquired related to the white lines, which are the objects to which attention should particularly be directed while traveling. The processing up to step S37 explained above is an example of processing in a normal traveling environment (for example, traveling during the day in sunny weather).

Figure 26:
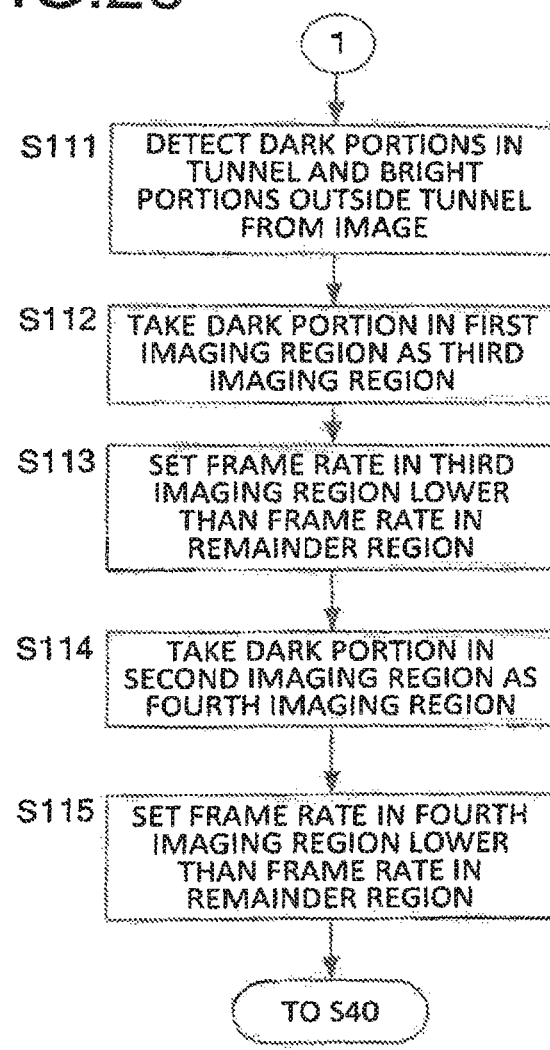
FIG. 26 is a flow chart showing an example of processing upon change to a first traveling environment.

If the traveling environment is different from the normal one, then the control device 4 changes the image capture conditions for the region of attention and for the region without particular attention described above. FIG. 26 is a flow chart showing an example of processing upon change to a first traveling environment (i.e. to a first road state). And FIG. 27 is a figure schematically showing an image of a photographic subject (i.e. of objects) that is imaged upon the image capture chip 113 when the vehicle 1 is approaching the entry of a tunnel 83.

In step S110 of FIG. 25, the control device 4 decides whether or not a tunnel is present. If an entry to or an exit from a tunnel is included in the image acquired by the camera 3, then the control device 4 reaches an affirmative decision in step S110, and the flow of control is transferred to step S111 of FIG. 26. But if no entry to or exit from any tunnel is included in the image acquired by the camera 3, then the control device 4 reaches a negative decision in step S110, and the flow of control proceeds to step S120. It should be understood that if, although an affirmative decision was reached in step S110 when making this decision during the previous iteration of this routine, this has changed to a negative decision in step S110 this time, then the control device 4 cancels the setting of the frame rate that will be described hereinafter on the basis of the flow chart of FIG. 26.

In step S111 of FIG. 26, from the image acquired by the camera 3, the control device 4 detects the bright portion external to the tunnel 83 and the dark portion internal to the tunnel 83, and then the flow of control proceeds to step S112. For example, the control device 4 may detect bright portions and dark portions (shown by sloping lines) from the image of the photographic subject shown by way of example in FIG. 27.

Figure 27:
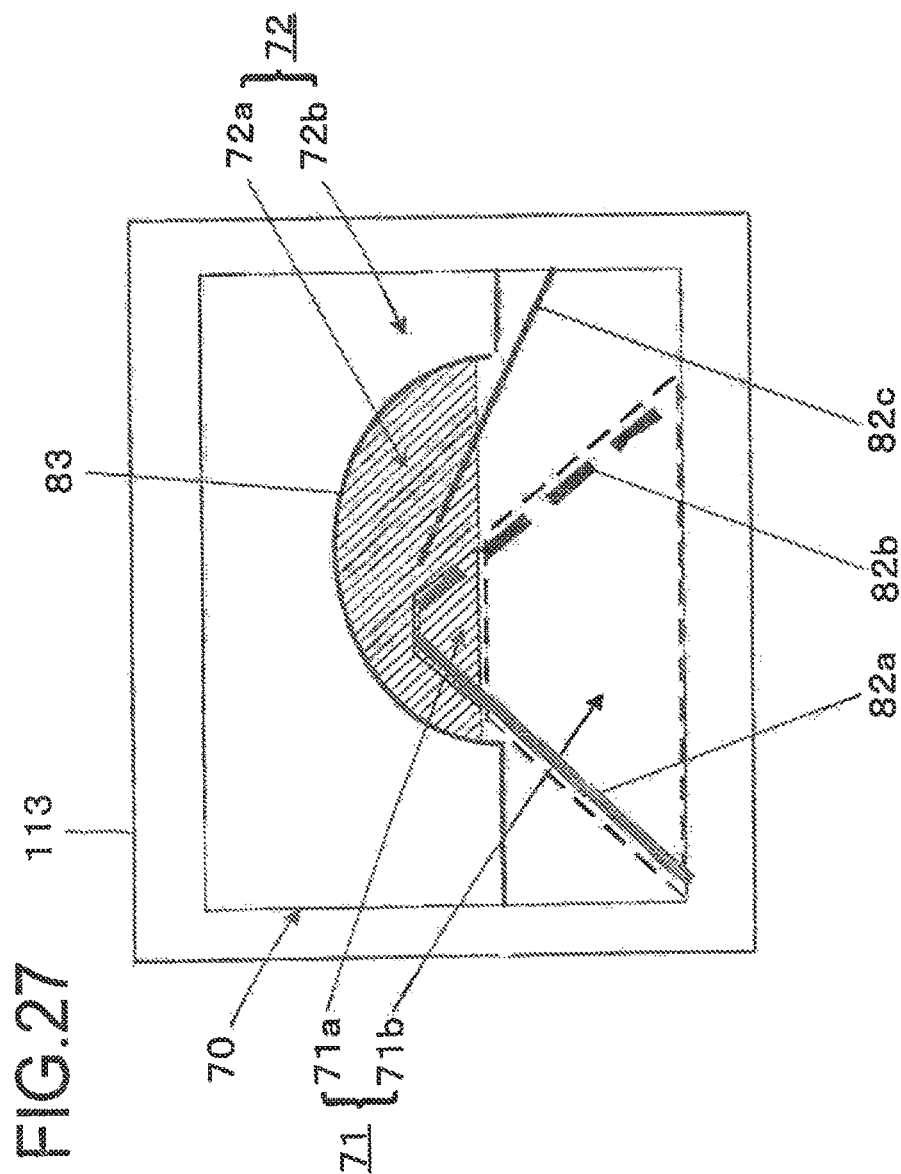
FIG. 27 is a figure schematically showing an image upon the imaging surface of the image capture chip.

Then in step S112 of FIG. 26 the control device 4 takes the region of the dark portion in the first imaging region 71 as being a third imaging region 71a, and takes the region in the first imaging region 71 other than the third imaging region 71a as being a remainder region 71b as shown in FIG. 27. In other words, the first imaging region 71 is divided into the third imaging region 71a and the remainder region 71b.

In step S113, the control device 4 sends a command to the camera 3, and sets the frame rate in the third imaging region 71a to be lower than the frame rate in the remainder region 71b. For example, the control device 4 may reduce the frame rate in the third imaging region 71a to 60 fps. This is done in order to obtain clear image information from the dark third imaging region 71a which represents the interior of the tunnel 83. On the other hand, the frame rate of the remainder region 71b is kept just as it is at 120 fps.

In step S114, the control device 4 further takes the dark portion in the second imaging region 72 as being a fourth imaging region 72a, and takes the region in the second imaging region 72 other than the fourth imaging region 72a as being a remainder region 71b as shown in FIG. 27. In other words, the second imaging region 72 is divided into the fourth imaging region 72a and the remainder region 72b.

In step S115, the control device 4 sends a command to the camera 3, and sets the frame rate in the fourth imaging region 72a to be lower than the frame rate in the remainder region 72b. For example, the control device 4 may reduce the frame rate in the fourth imaging region 72a to 30 fps. This is done in order to obtain clear image information from the dark fourth imaging region 72a which represents the interior of the tunnel 83. And then the control device 4 advances the flow of control to step S40 (of FIG. 24).

It should be understood that while, in the explanation given above, the case of a tunnel entry was explained, the same holds for the case of a tunnel exit. However, in the case of a tunnel entry and in the case of a tunnel exit, the relationship between the bright portions of the image and its dark portions is opposite: the image of the exterior of the tunnel as seen from the interior of the tunnel becomes the bright portion.

Figure 28:
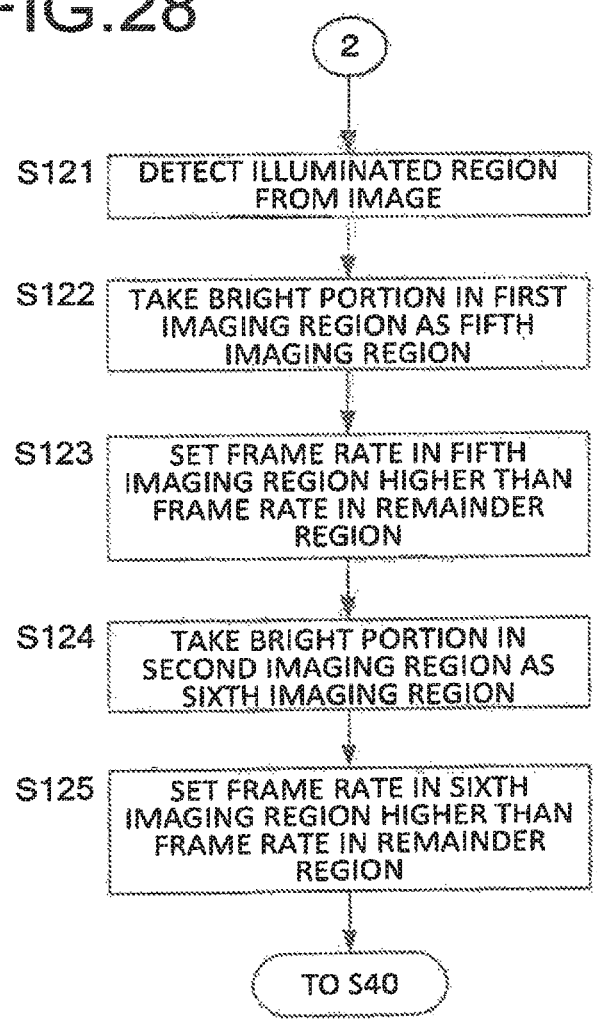
FIG. 28 is a flow chart showing an example of processing upon change to a second traveling environment.
Figure 29A:
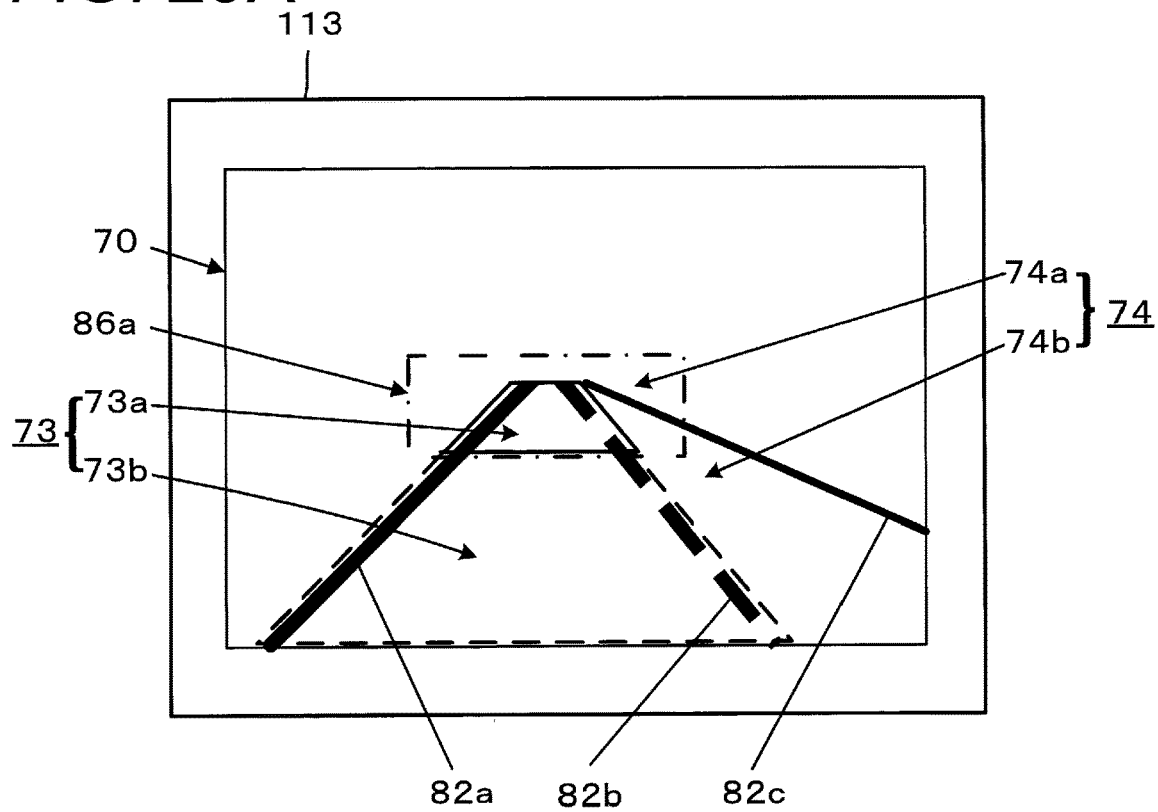
FIGS. 29A and 29B schematically show images upon the imaging surface of the image capture chip.
Figure 29B:
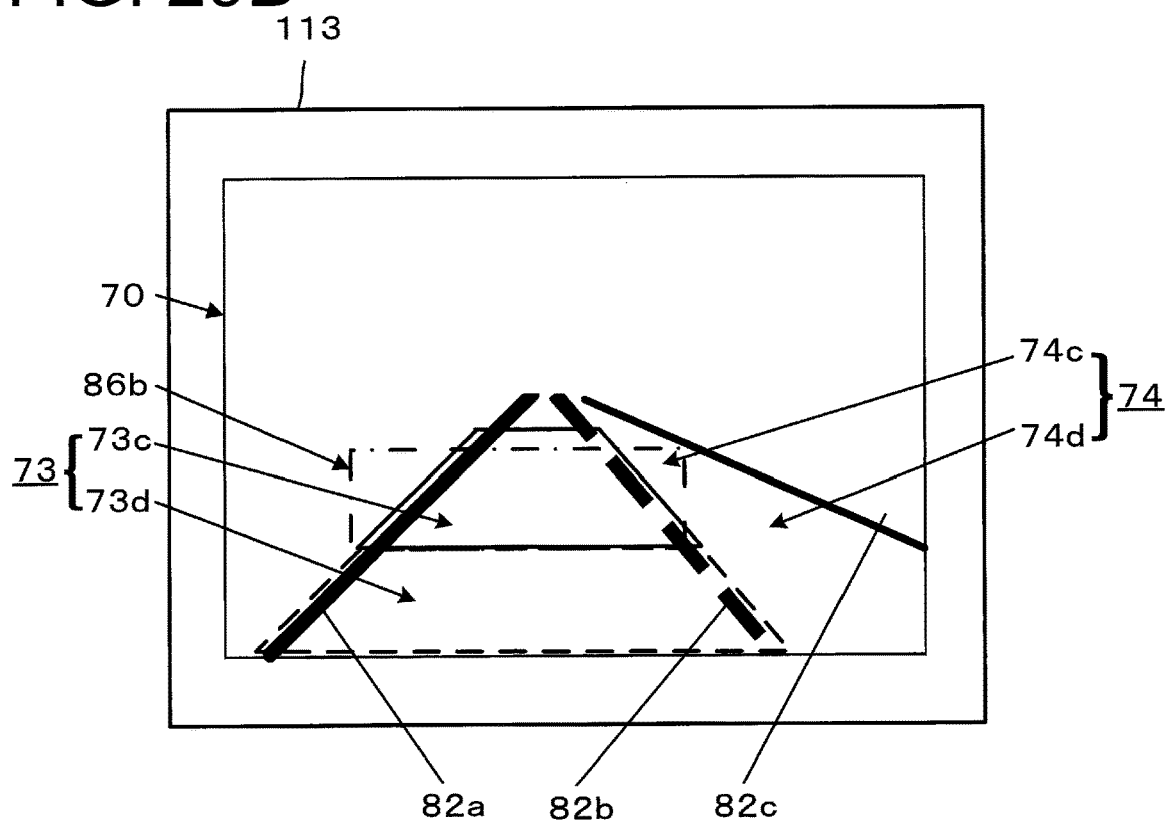

FIG. 28 is a flow chart showing an example of processing upon change to a second traveling environment (i.e. to a second road state). And FIGS. 29A and 29B schematically show images of a photographic subject that are focused upon the imaging surface of the image capture chip 113 when the headlights of the vehicle 1 are turned on: FIG. 29A is a figure showing the case of high beam, and FIG. 29B is a figure showing the case of low beam In step 120 of FIG. 25, the control device 4 makes a decision as to whether or not the vehicle headlights are turned on. If a bright portion due to the headlights is included in the image acquired by the camera 3, then the control device 4 reaches an affirmative decision in step S120 and the flow of control is transferred to step S121 of FIG. 28. But if no bright portion due to the headlights is included in the image acquired by the camera 3, then the control device 4 reaches a negative decision in step S120 and the flow of control proceeds to step S130. And if, although an affirmative decision was reached in step S120 when making this decision during the previous iteration of this routine, this changes to a negative decision in step S120 this time, then the control device 4 cancels the setting of the frame rate that will be described hereinafter on the basis of the flow chart of FIG. 28.

It should be understood that, instead of determining that the headlights are turned on based upon detection of a bright portion in the image, it would also be acceptable to arrange to determine that the headlights are turned on based upon turning on operation by the driver. In this case, if the beam changeover switch 18 is changed over to the high beam side, then the control device 4 treats the position of the illuminated region 86a in FIG. 29A as a bright portion of the image acquired by the camera 3. Moreover, if the beam changeover switch 18 is changed over to the low beam side, then the control device 4 treats the position of the illuminated region 86b in FIG. 29B as a bright portion of the image acquired by the camera 3.

In step S121 of FIG. 28, the control device 4 detects the region illuminated by the headlights (corresponding to the bright portion described above) from the image acquired by the camera 3, and then the flow of control proceeds to step S122.

In step S122, if the beam changeover switch 18 is changed over to the high beam side, as shown in FIG. 29A, the control device 4 takes the region of overlapping of the first imaging region 73 and the illuminated region 86a as being a fifth imaging region 73a, and takes a region consisting of the first imaging region 73 with this fifth imaging region 73a eliminated as being a remainder region 73b. In other words, the first imaging region 73 is separated into the fifth imaging region 73a and the remainder region 73b.

In step S123, the control device 4 sends a command to the camera 3, and sets the frame rate in the fifth imaging region 73a to be higher than the frame rate in the remainder region 73b. For example, if the frame rate in the remainder region 73b is 60 fps, the control device 4 may increase the frame rate in the fifth imaging region 73a to 120 fps. This is done in order to enhance the frequency of acquiring image information from the fifth imaging region 73a, which becomes bright when illuminated at high beam.

In step S124, as shown in FIG. 29A, the control device 4 takes the region of overlapping of the second imaging region 74 and the illuminated region 86a as being a sixth imaging region 74a, and takes a region consisting of the second imaging region 74 with this sixth imaging region 74a eliminated as being a remainder region 74b. In other words, the second imaging region 74 is separated into the sixth imaging region 73a and the remainder region 74b.

In step S125, the control device 4 sends a command to the camera 3, and sets the frame rate in the sixth imaging region 74a to be higher than the frame rate in the remainder region 74b. For example, if the frame rate in the remainder region 74b is 60 fps, the control device 4 may increase the frame rate in the sixth imaging region 74a to 120 fps. This is done in order to enhance the frequency of acquiring image information from the sixth imaging region 74a which becomes bright when illuminated at high beam. And then the control device 4 advances the flow of control to step S40 (of FIG. 24).

While the situation during high beam has been explained with reference to FIG. 29A, it is possible to perform the same operation in a similar manner during low beam as well. When the beam changeover switch 18 is changed over to the low beam side, then the illuminated region 86b in FIG. 29B corresponds to the bright portion of the photographic subject image. And, to correlate FIG. 29A with FIG. 29B, the fifth imaging region 73a corresponds to a fifth imaging region 73c, the remainder region 73b corresponds to a remainder region 73d, the sixth imaging region 74a corresponds to a sixth imaging region 74c, and the remainder region 74b corresponds to a remainder region 74d.

Figure 31:
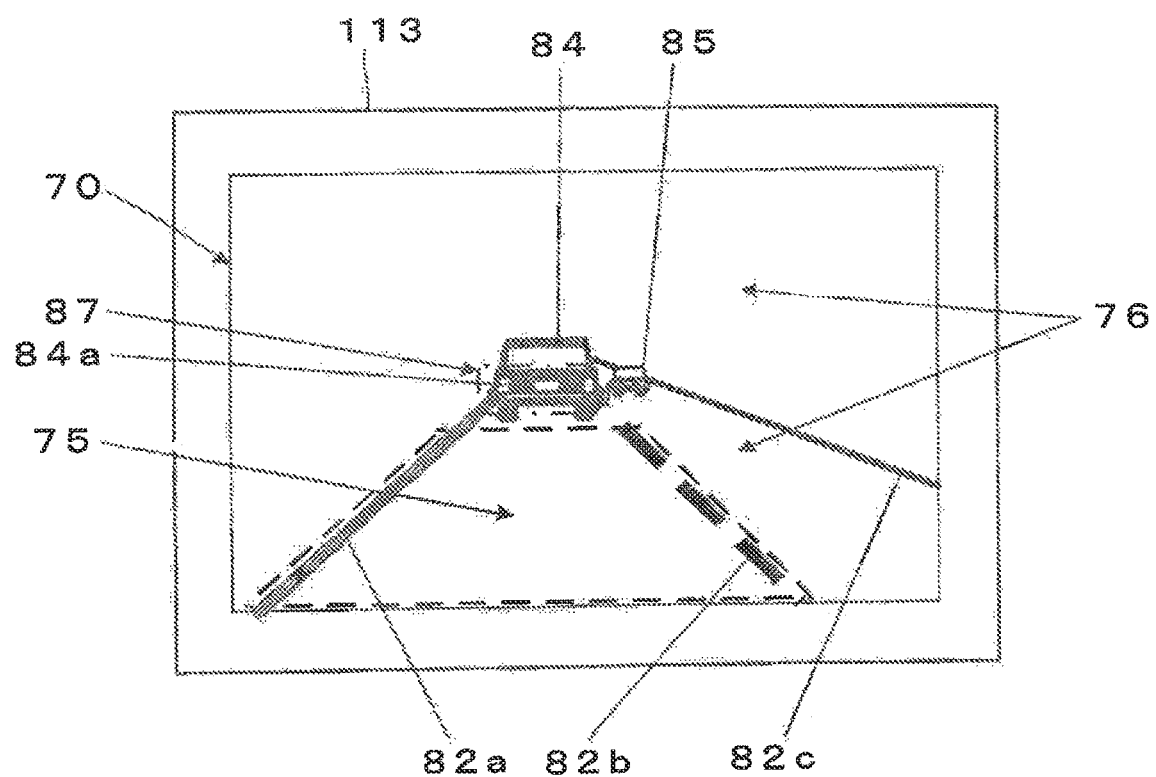
FIG. 31 is a figure schematically showing an image upon the imaging surface of the image capture chip.

FIG. 30 is a flow chart showing an example of processing upon change to a third traveling environment (i.e. to a third road state). And FIG. 31 is a figure schematically showing an image of a photographic subject that is focused upon the imaging surface of the image capture chip 113 when the tail lamps (tail lights) of the leading vehicle 84 in front are turned on.

In step 130 of FIG. 25, the control device 4 makes a decision as to whether or not a tail lamp of the leading vehicle 84 in front has been recognized. If a tail lamp in an illuminated state has been recognized from the image acquired by the camera 3, then the control device 4 reaches an affirmative decision in step S130 and the flow of control is transferred to step S131 of FIG. 30. But if no tail lamp in an illuminated state has been recognized from the image acquired by the camera 3, then the control device 4 reaches a negative decision in step S130 and the flow of control proceeds to step S140. It should be understood that if, although an affirmative decision was reached in step S130 when making this decision during the previous iteration of this routine, this changes to a negative decision in step S130 this time, then the control device 4 cancels the setting of the frame rate that will be described hereinafter on the basis of the flow chart of FIG. 30.

In step S131 of FIG. 30, the control device 4 detects the tail lamp of the leading vehicle 84 from the image acquired by the camera 3, and then the flow of control proceeds to step S132. In FIG. 31, an image of the tail lamp 84a is not included in the first imaging region 75 of FIG. 31, but is included in the second imaging region 76.

In step S132 of FIG. 30, the control device 4 takes a predetermined region that includes an image of the tail lamp 84a of the leading vehicle 84, for example, a rectangular region including the tail lamps 84a on both sides, as being a seventh imaging region 87. And in step S133, in order to perform charge accumulation control for this seventh imaging region 87 under the same conditions as those for the first imaging region 75, the control device 4 separates the seventh imaging region 87 from the second imaging region 76, and incorporates it into the existing first imaging region 75. It should be understood that the shape of this seventh imaging region 87 is not limited to being rectangular; it would also be acceptable for it to be an ellipse or a trapezoid that includes the tail lamps 84*a* on both sides.

The control device 4 further issues a command to the camera 3, so as to set the frame rate for the seventh imaging region 87 to the same frame rate as that of the first imaging region 75. For example, if the frame rate for the first imaging region 75 is 120 fps, then the frame rate for the seventh imaging region 87 is also raised to 120 fps. This is in order to enhance the frequency of acquiring image information for the seventh imaging region 87, which corresponds to the leading vehicle 84. And then the control device 4 transfers the flow of control to step S40 (of FIG. 24).

Figure 32:
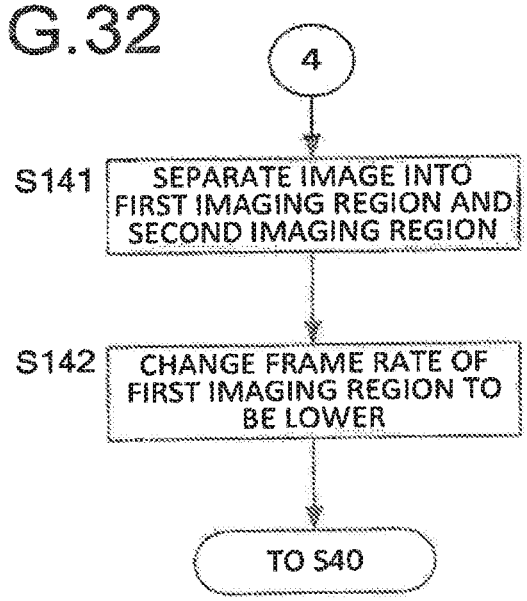
FIG. 32 is a flow chart showing an example of processing upon change to a fourth traveling environment.
Figure 33:
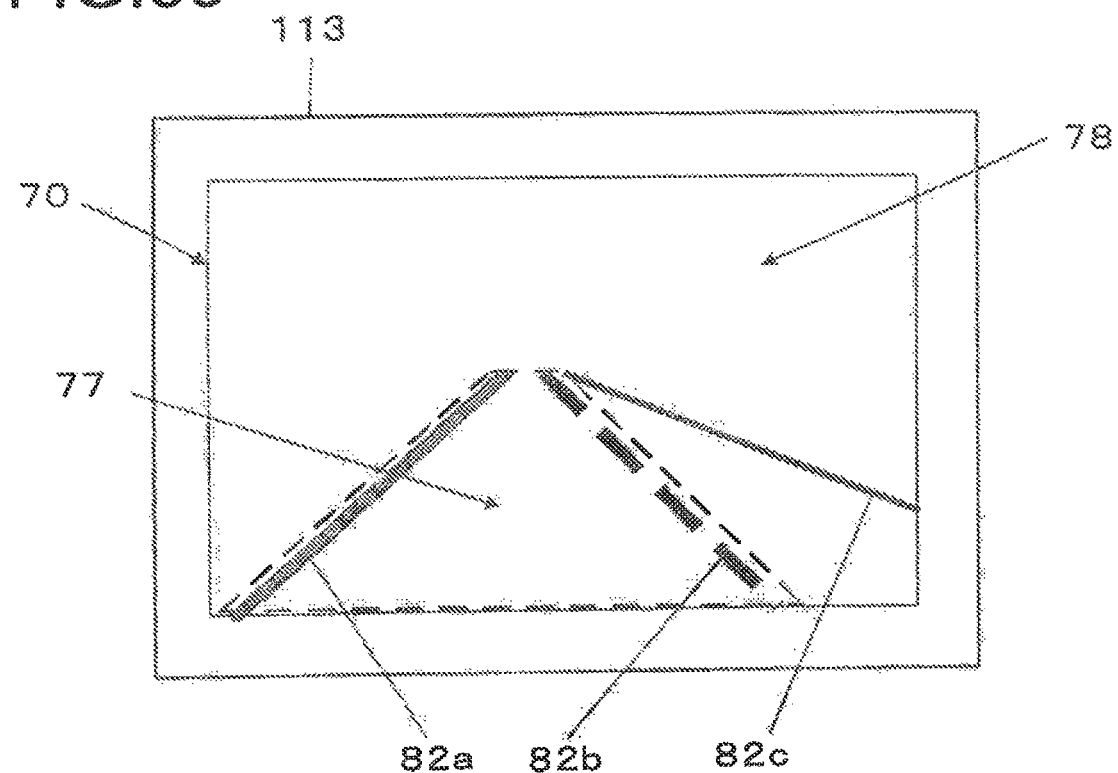
FIG. 33 is a figure schematically showing an image upon the imaging surface of the image capture chip.

FIG. 32 is a flow chart showing an example of processing upon change to a fourth traveling environment (i.e. to a fourth road state). And FIG. 33 is a figure schematically showing an image of a photographic subject that is focused upon the imaging surface of the image capture chip 113 when rainfall has been detected.

In step 140 of FIG. 25, the control device 4 makes a decision as to the presence or absence of rainfall information from the rainfall sensor 19 (refer to FIG. 1). If rainfall information is being inputted, then the control device 4 reaches an affirmative decision in step S140 and the flow of control is transferred to step S141 of FIG. 32. But if no rainfall information is being inputted, then the control device 4 reaches a negative decision in step S140 and the flow of control proceeds to step S150. It should be understood that if, although an affirmative decision was reached in step S140 when making this decision during the previous iteration of this routine, this changes to a negative decision in step S140 this time, then the control device 4 cancels the setting of the frame rate that will be described hereinafter on the basis of the flow chart of FIG. 32.

Generally, during rainfall, it becomes difficult to identify the white lines drawn upon the road, since the road surface is wet. In concrete terms, as compared to a dry road surface, the contrast between the white line portions and the portions other than white lines decreases.

In step S141 of FIG. 32, in a similar manner to the case in step S35 of FIG. 25, the control device 4 separates a region of attention in the image of the photographic subject that is focused upon the image capture chip 113, which is taken as being a first imaging region 77, from the region other than this first imaging region 77, which is taken as being a second imaging region 78, and then the flow of control proceeds to step S142. To explain this with reference to FIG. 33, the control device 4 takes the trapezoidally shaped region that includes the white line 82*a*, the white line 82*b*, and the region between the white line 82*a* and the white line 82*b* as being a first imaging region 77, and takes the region other than this first imaging region 77 as being a second imaging region 78.

In step S142 of FIG. 32, the control device sends a command to the camera 3, and sets the frame rate for the first imaging region 77 to be lower than the frame rate in the case of the first imaging region 71 (refer to FIG. 23). For example, if the frame rate for the first imaging region 71 is 120 fps, then the frame rate for the first imaging region 77 may be changed to 60 fps. This is done in order to obtain clear image information from the first imaging region 77, the luminance of whose white colored portions has decreased because the road surface is wet. And then the control device transfers the flow of control to step S150 of FIG. 25.

It should be understood that, instead of decreasing the frame rate in this manner, it would also be acceptable to increase the contrast of the image by adjusting the tone curve.

Furthermore, for a similar reason, it would also be acceptable to set the frame rate for the second imaging region 78 to be lower than the frame rate in the case of the second imaging region 72 (refer to FIG. 23); and it would also be acceptable to increase the contrast of the image by adjusting the tone curve.

Figure 35A:
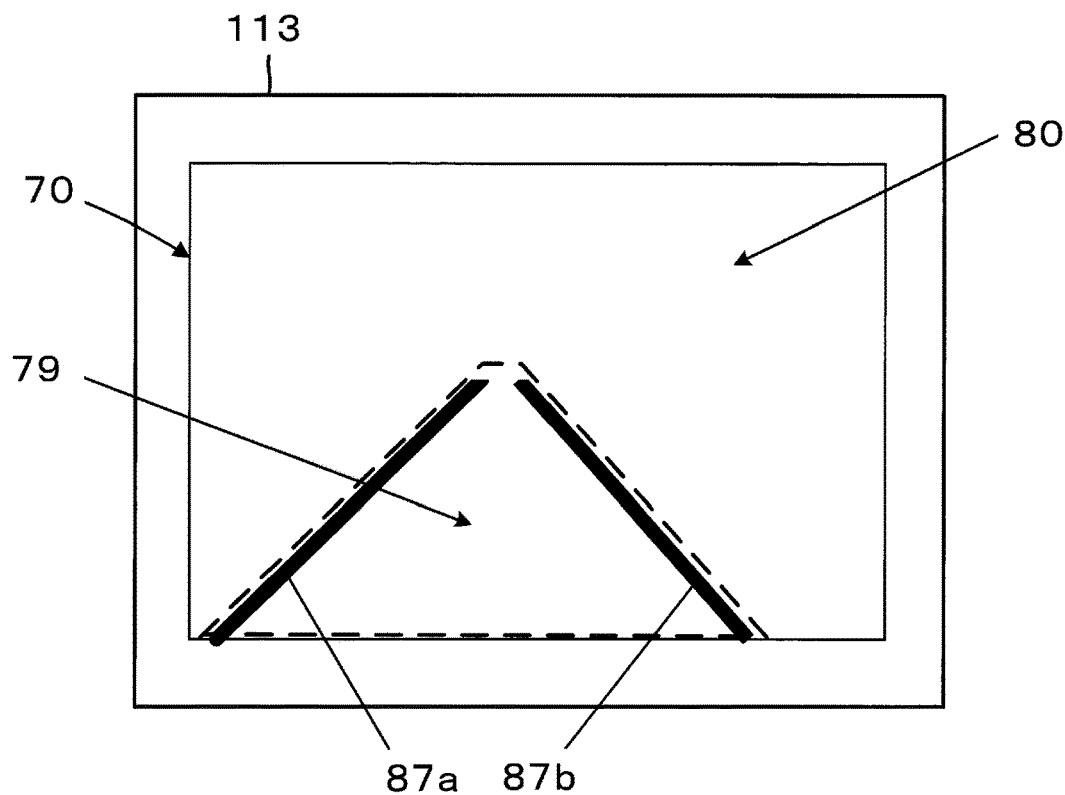
FIGS. 35A and 35B schematically show two images upon the imaging surface of the image capture chip.
Figure 35B:
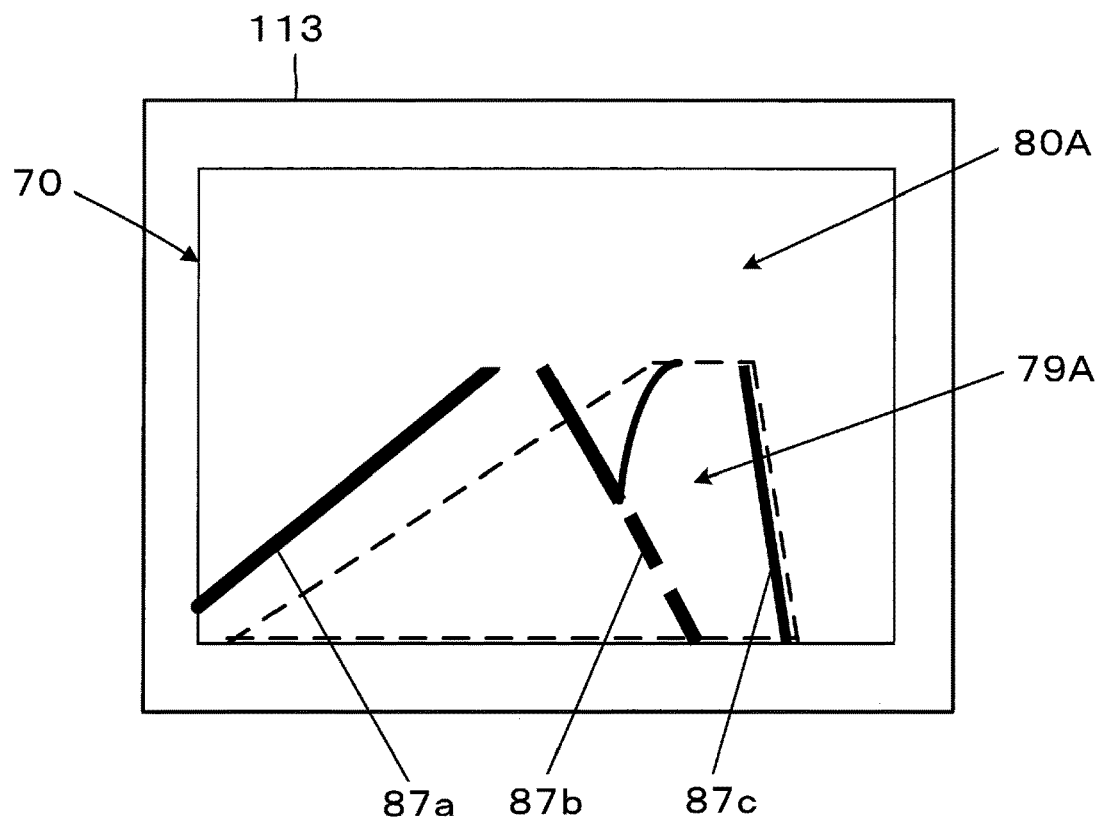

FIG. 34 is a flow chart showing an example of processing upon change to a fifth traveling environment (i.e. to a fifth road state). And FIGS. 35A and 35B schematically show an image of a photographic subject that is focused upon the imaging surface of the image capture chip 113 when a change of course has been detected. FIG. 35A shows the image of the photographic subject before the change of vehicle lane, while FIG. 35B shows the image of the photographic subject during the change of vehicle lane.

In step 150 of FIG. 25, the control device 4 makes a decision as to the presence or absence of information related to a change of vehicle lane. By comparing and matching position information inputted from the GPS device 15 with map information, a navigation device not shown in the figures performs, for example, route guidance as to which road the vehicle 1 is to travel upon (i.e. in which lane the vehicle should travel) and in what azimuth the vehicle should travel. If a change of vehicle lane by the vehicle 1 is required, then a vehicle lane change command is inputted from the navigation device described above to the control device 4. If such a vehicle lane change command has been inputted, then the control device 4 reaches an affirmative decision in step S150 and the flow of control is transferred to step S151 of FIG. 34. But if no such vehicle lane change command has been inputted, then the control device 4 reaches a negative decision in step S150 and the flow of control is transferred to step S40 of FIG. 24.

It should be understood that if, although an affirmative decision was reached in step S150 when making this decision during the previous iteration of this routine, this changes to a negative decision in step S150 this time, then the control device 4 cancels the setting of the frame rate that will be described hereinafter on the basis of the flow chart of FIG. 34.

In step S151 of FIG. 34, the control device 4 makes a change to the first imaging region 79 in the image of the photographic subject that is focused upon the image capture chip 113 in the following manner.

To explain with reference to FIG. 35A, in a similar manner to the case in step S33, the control device 4 takes the trapezoidally shaped region that includes the white line 87*a*, the white line 87*b*, and the region between the white line 87*a* and the white line 87*b* as being a first imaging region 79, and takes the region other than this first imaging region 79 as being a second imaging region 80.

If the position information inputted from the GPS device 15 corresponds to a changed position of vehicle lane, then the control device 4 changes the first imaging region 79 to a first imaging region 79A, as described below. To explain with reference to FIG. 35B, since the new region of attention becomes the white line 87*b* that delimits the traffic lane after change of vehicle lane and the white line 87*c*, accordingly the first imaging region 79A is a trapezoidal shape that includes the white lines 87*b* and 87*c*. Thus, the control device 4 gradually displaces the imaging region from the first imaging region 79 shown in FIG. 35A to the first imaging region 79A shown in FIG. 35B. The processing to shift the imaging region in this manner is performed continuously according to change of the photographic field along with the change of vehicle lane.

It should be understood that, instead of operating to shift the imaging region, it would also be acceptable to increase the size of the first imaging region 79 so that it includes the first imaging region 79A.

In step S152 of FIG. 34, the control device 4 sends a command to the camera 3, and sets the frame rate of the first imaging region 79A that has been reset to the same frame rate as that of the first imaging region 79. Due to this, when performing change of course, it is possible to keep the frame rate of the region of attention after the change of vehicle lane to be the same as the frame rate of the region of attention before the change of vehicle lane. And then the control device transfers the flow of control to step S40 (refer to FIG. 24).

According to this second embodiment, the following beneficial operational effects are obtained.

(1) The control device 4 sets to the camera 3 the first imaging region 71 that includes the white lines 82a and 82b, and the second imaging region 72 that is the portion other than the first imaging region 71, and sets the photographic conditions for the first imaging region 71 and the photographic conditions for the second imaging region 72 to be different from one another. Since, for example, the frame rate for the first imaging region 71 is set to be higher than the frame rate for the second imaging region 72, accordingly it is possible reliably to recognize the white lines 82a and 82b in the image acquired by the camera 3. Furthermore, since the frame rate for the second imaging region 72 that does not contribute to recognition of the white lines 82a and 82b is set to be lower, accordingly it is possible to reduce the consumption of electrical power by the camera 3, and it is possible to suppress the generation of heat.

When the frame rate is high the charge accumulation time becomes short, and when the frame rate is low the charge accumulation time becomes long.

(2) Since, even when the traveling environment of the vehicle 1 has changed, according to the brightness or darkness of the first imaging region 71, the control device 4 divides the first imaging region 71 into two imaging regions, and makes the frame rates of these two imaging regions be different, accordingly it is possible to continue reliably to recognize the white lines 82a and 82b in the images acquired by the camera 3.

For example since, in the case of entry to a tunnel 82 as shown in FIG. 27, along with taking the dark portion in the first imaging region 71 as being the third imaging region 71a and taking the other region as being the remainder region 71b, also the frame rate in this third imaging region 71a is set to be lower than the frame rate in the remainder region 71b, accordingly it is possible clearly to recognize the white lines 82a and 82b within the third imaging region 71a in the image acquired by the camera 3. And, by performing similar control for the second imaging region 72 as for the first imaging region 71, it is possible clearly to recognize the imaging region that is related to traveling in the image acquired by the camera 3.

Furthermore since, during high beam illumination as shown for example in FIG. 29A, along with the region in which the first imaging region 73 and the illuminated region 86a overlap being taken as being the fifth imaging region 73a and the other region being taken as being the remainder region 73b, also the frame rate of the fifth imaging region 73a is set to be higher than the frame rate of the remainder region 73b, accordingly it is possible reliably to recognize the white lines 82a and 82b within the fifth imaging region 73a in the image acquired by the camera 3. And by performing similar control for the second imaging region 72 as that performed for the first imaging region 71, it is possible to increase the amount of information in the image acquired by the camera 3 for the imaging region that is related to traveling.

(3) If, as an example of change of the traveling environment of the vehicle 1, the tail lamps of a leading vehicle 84 in front have been recognized (refer to FIG. 31), then, by taking a region that includes the tail lamps 84a on both sides as being a seventh imaging region 87, and by setting the frame rate for this seventh imaging region 87 to be equal to the frame rate for the first imaging region 75, it is possible reliably to recognize the tail lamps 84a of the leading vehicle 84 in the image acquired by the camera 3.

(4) If, as an example of change of the traveling environment of the vehicle 1, rainfall has been detected (refer to FIG. 33), then, since the frame rate of the first imaging region 77 is set to be lower than before the rainfall, accordingly it is possible easily to recognize the white lines 82a and 82b, whose contrast on the wet road surface has dropped, in the image acquired by the camera 3.

(5) And if, as an example of change of the traveling environment of the vehicle 1, a change of vehicle lane is performed (refer to FIGS. 35A and 35B), then, since the frame rate of the first imaging region 79A that includes the white lines 87b after the change of vehicle lane is set to be the same as the frame rate of the first imaging region 79 before the change of vehicle lane, accordingly the frame rate of the first imaging region is kept constant before and after the change of vehicle lane, so that it is possible reliably to recognize the white lines in the images acquired by the camera 3 both before and after the change of vehicle lane.

One or a plurality of variant embodiments such as the following can also be combined with the second embodiment described above.

Variant Embodiment #1

While, in this second embodiment, an example of control of the camera 3 under control of the control device 4 was explained, it would also be acceptable to provide a structure in which part of the control of the camera 3 is performed by the control unit 35 of the camera 3.

Moreover while, in this second embodiment, among the photographic conditions, principally the frame rate has been described, it would also be acceptable to vary one or more photographic conditions other than the frame rate between the various photographic (image capture) regions.

Variant Embodiment #2

While, in the second embodiment, an example was explained in which the white lines drawn along the surface of the road were recognized as being objects to which attention should be directed, it would also be acceptable to include, not white lines, but rather guard rails or curbs or the like that are provided along the road as being objects to which attention should be directed.

Variant Embodiment #3

In the second embodiment, an example was explained in which the imaging surface 70 was divided into two portions, i.e. a first imaging region of trapezoidal shape and a second imaging region other than the first imaging region, and the frame rates for these two regions were set to be different. Instead of the above, it would also be acceptable to divide the imaging surface 70 into three or more imaging regions, i.e. a first imaging region, a second imaging region, and a third imaging region, and to set the frame rates to be different for each of these imaging regions.

Moreover, in the second embodiment, an example was explained in which each of the first imaging region and the second imaging region was further divided into two imaging regions. Instead of the above, it would also be acceptable to arrange to divide each of the above described first imaging region and the above described second imaging region into three or more imaging regions, and to set the frame rates to be different for each of these three or more finely divided imaging regions.

Variant Embodiment #4

In the second embodiment it was arranged for the control device 4, upon the trigger of a vehicle lane change command being inputted from the navigation device not shown in the figures, to shift the imaging region gradually from the first imaging region 79 shown in FIG. 35A to the first imaging region 79A shown in FIG. 35B. Instead of the above, it would also be acceptable to arrange for the timing at which the change of vehicle lane is performed to be determined by the control device 4. The control device 4 receives supply of information about ground points where change of vehicle lane should be performed from a navigation device of the vehicle, and stores this ground point information in the storage device 4b in advance. And the control device 4 determines that the vehicle lane is to be changed when the position information inputted from the GPS device 15 agrees with the information about a ground point where change of vehicle lane should be performed. Moreover, having determined upon the change of vehicle lane, when the control device 4 detects the vehicle lane after the change of vehicle lane in the image acquired by the camera 3, it shifts the imaging region from the first imaging region 79 shown in FIG. 35A to the first imaging region 79A shown in FIG. 35B.

Variant Embodiment #5

While, in the second embodiment, as a method of distance measurement performed by the camera 3, a calculation technique was employed in which range finding calculation was performed by using the image signals from the pixels for focus detection that were provided to the imaging element 100, it would also be acceptable to employ a technique of performing distance measurement by using two images from a stereo camera. Moreover, it would also be possible to employ a technique for performing distance measurement by using a millimeter wave radar separate from the camera 3.

Embodiment #3

In this embodiment, charge accumulation control for an imaging element 100 (i.e. an image capture chip 113 (refer to FIG. 3)) of a photoelectric conversion unit 15 of an image capture unit 5 (refer to FIG. 36) is performed by the block units described above, on the basis of the method of driving of another vehicle (for example an automatically driven vehicle or a manually driven vehicle) that is traveling in the vicinity of the vehicle 1.

Figure 36:
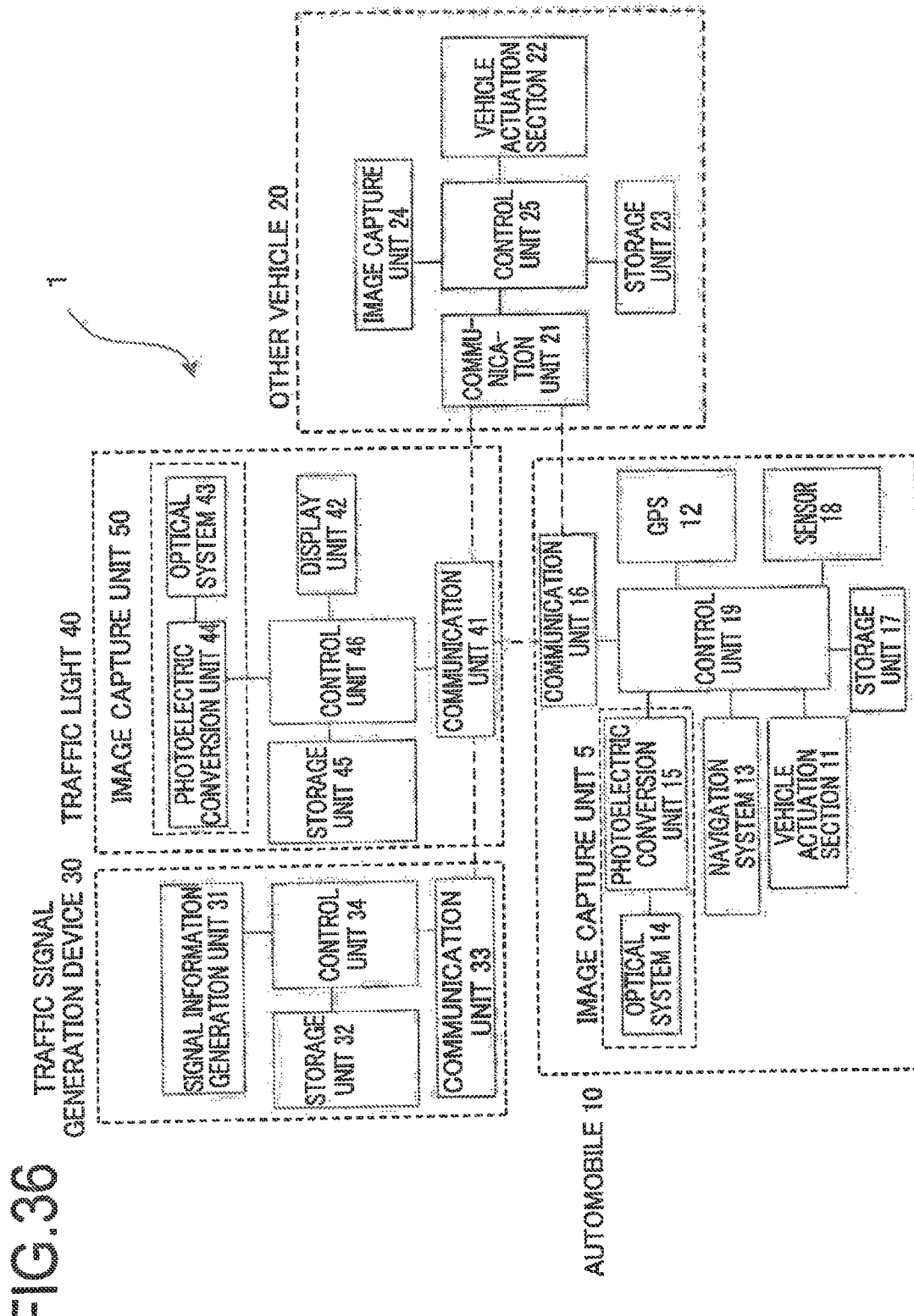
FIG. 36 is a block diagram showing the structure of an image capture system according to a third embodiment.

FIG. 36 is a block diagram showing an example of the structure of an image capture system 1 that includes an image capture device according to this third embodiment. This image capture system 1 employs an automobile 10, other vehicle 20, a traffic signal generation device 30, and a traffic light 40.

It should be understood that, instead of the traffic light 40, or in parallel with the traffic light 40, it would also be acceptable to employ an information supply system that is installed to the road, or a VICS (registered trademark; Vehicle Information and Communication System).

While there are some reference symbols in FIGS. 36, 40, and 42 through 45 that are common to reference symbols used in previous drawings, here they are applied to the explanation of this third embodiment.

The Automobile 10

The automobile 10 comprises a vehicle actuation section 11, a GPS device 12, a navigation system 13, an optical system 14, a photoelectric conversion unit 15, a communication unit 16, a storage unit 17, a sensor 18, and a control unit 19.

It should be understood that the portions of the automobile 10 that are not explained herein have the same basic structures as in a conventional automobile.

The vehicle actuation section 11 includes actuation members of various types related to operation of the automobile, such as a steering wheel, a turn signal switch, a shift lever, an accelerator, a brake, a switch for changing over between automatic driving mode and manual driving mode, and so on.

On the basis of signals obtained by reception of radio waves from the GPS satellites, the GPS device 12 calculates the position of the automobile 10 (i.e. its longitude, latitude, and so on). And the position information that has thus been calculated by the GPS device 12 is outputted to the navigation system 13 and/or to the control unit 19.

The navigation system 13 is a system that provides guidance along a travel path to a destination that has been inputted by detecting the current position of the automobile 10 from the GPS device 12 or the like, by acquiring map data corresponding to this current position from a storage medium or a network, and by displaying this map data upon a liquid crystal monitor. This navigation system 13 comprises an actuation unit that receives actuation from a user, the liquid crystal monitor mentioned above, a speaker that provides audio guidance, a reading unit that reads map data, and so on.

The optical system 14 is built from a plurality of lenses, and focuses an image of the photographic subject upon the photoelectric conversion unit 15. If the optical system 14 is facing forward from the automobile 10, then an image forward in the direction of travel of the automobile 10 is acquired by the photoelectric conversion unit 15. And, if the optical system 14 is facing rearward from the automobile 10, then an image rearward in the opposite direction to the direction of travel of the automobile 10 is acquired by the photoelectric conversion unit 15. The optical system 14 has an angle of view that is adapted to a plurality of lanes of travel (two vehicle lanes or three vehicle lanes or the like).

It should be understood that it would also be acceptable to provide a stereo camera that has a plurality of optical systems 14.

The photoelectric conversion unit 15 comprises an imaging element 100 that comprises, laminated together, an image capture chip that outputs pixel signals corresponding to light incident from the optical system 14, a signal processing chip that processes the pixel signals, and a memory chip that stores the pixel signals. As will be described in detail hereinafter, this imaging element 100 is capable of setting individually different image capture conditions for each pixel or for each of a number of unit regions each consisting of a plurality of pixels (for example 16 pixels by 16 pixels), also including the case that image capture is not to be performed thereby.

In this embodiment, the image capture unit 5 of the camera comprises the optical system 14 and the photoelectric conversion unit 15, and captures images of objects in the vicinity of the automobile 10 (i.e. moving bodies and obstructions and so on), and also captures images of white lines upon the road (also including lines of other colors such as yellow or the like). A forward image capture unit 5 that acquires images forward from the automobile 10 and a rearward image capture unit 5 that acquires images rearward from the automobile 10 are provided to the automobile 10.

In this explanation, lines that are white in color or the like and that extend along the path of travel are termed "white lines". Moreover, both solid lines and broken lines are termed "white lines".

It should be understood that it would also be acceptable to provide a radar, although this is not shown in the figures, and to arrange to detect objects in the vicinity with this radar and the image capture unit 5 (i.e. the optical system 14 and the photoelectric conversion unit 15).

The communication unit 16 performs wireless communication (including an optical beacon, a radio beacon, visible light communication, and the like) with external devices, such as other vehicles 20 and traffic lights 40 and so on. Any desired type of communication method may be employed.

The storage unit 17 may, for example, be built as a non-volatile semiconductor memory such as a flash memory or the like, and stores programs and control parameters of various types for travel of the automobile 10 (including automatic travel).

The sensor 18 includes one or a plurality of sensors of various types, such as a vehicle speed sensor, a yaw rate sensor, or the like. The vehicle speed sensor detects the speed V of the automobile 10, and sends its detection signal to the control unit 19 or the like. And the yaw rate sensor detects the yaw rate of the automobile 10, and sends its detection signal to the control unit 19 or the like. The yaw rate is the rate of change of the rotational angle of the vehicle or the like in the yaw direction.

The control unit 19 is a device that controls the automobile 10 as a whole, and comprises a CPU (Central Processing Unit), RAM (Random Access Memory), ROM (Read Only Memory) and so on. In this embodiment, the control unit 19 performs setting of the image capture conditions for each unit region of the imaging element 100 of the photoelectric conversion unit 15 and control thereof. Moreover, if the automatic driving mode is set by the vehicle actuation section 11, then the control unit 19 detects white lines upon the road with the image capture unit 5 (i.e. the optical system 14 and the photoelectric conversion unit 15) and also detects mobile objects and obstructions in the vicinity of the automobile 10 by using the image capture unit 5, and, in cooperation with the navigation system 13, performs automatic driving to a destination that has been inputted to the navigation system 13.

It should be understood that, in this embodiment, the automatic driving mode means that operation and so on of the steering wheel, of the accelerator, of the brake, of the turn signal switch, and of the shift lever are all automatically performed under control by the control unit 19. Moreover, the manual driving mode means that actuation and so on of the steering wheel, of the accelerator, of the brake, of the turn signal switch, and of the shift lever are performed by the driver; in some cases the speed change mechanism is an automatic transmission, and in some cases it is a manual transmission. Furthermore, in addition to fully automatic driving in which all of the driving functions are performed under the control of the control unit 19, the automatic driving mode also includes semi-automatic driving in which, even though the user is performing actuation of the vehicle actuation unit 11, the control unit 19 may stop or decelerate the automobile 10 so as to avoid collision and the like on the basis of the outputs from the image capture unit 5, the GPS 12, the communication unit 16, the sensor 18, and so on. Due to this, it is possible to ensure safety while the user still can enjoy driving the automobile 10. Moreover, semi-automatic driving also includes the case in which the control unit controls some but not all of the steering wheel, the accelerator, the brake, the turn signal switch, and/or the shift lever, instead of the driver.

The Other Vehicle 20

The other vehicle 20 comprises a communication unit 21, a vehicle actuation section 22, a storage unit 23, an image capture unit 24, a control unit 25 and so on, and the functions of these various sections are the same as functions of the corresponding sections of the automobile 10. While various sections of the other vehicle 20 are omitted in FIG. 36, they support its basic structure as an automobile. However, the other vehicle 20 may be a vehicle of a type that is not equipped with any communication unit 21. Moreover, automatically driven vehicles and manually driven vehicles may be mixed together as other vehicles 20. Of these vehicles, at least those vehicles that are equipped with an automatic driving mode are capable of communicating with one another via their communication units 21, and are built so as to be able to transmit and receive information related to whether they are being automatically driven or are being manually driven, and also so as to be able to communicate information related to image data acquired by their image capture units 24.

The Traffic Signal Generation Device 30

The traffic signal generation device 30 is a device for performing control of signal lights that are displayed upon the display unit 42 of the traffic light 40, and comprises a signal information generation unit 31, a storage unit 32, a communication unit 33, and a control unit 34. While such a traffic signal generation device 30 may be installed to each of a plurality of traffic lights 40 that are provided at various intersections, it would also be acceptable to arrange for a single traffic signal generation device 30 to control a plurality of traffic lights 40.

The signal information generation unit 31 generates traffic signals on the basis of the types and the positions of installation of a plurality of traffic lights 40 that are installed at intersections or the like, and on the basis of commands or the like related to traffic sent from a traffic management center not shown in the figures.

The storage unit 32 may be built as a non-volatile semiconductor memory such as, for example, a flash memory or the like, and stores programs of various types and control parameters and so on for the traffic signal generation device 30.

The communication unit 33 transmits traffic signals generated by the signal information generation unit 31 to each of one or a plurality of traffic lights 40 by cable or by wireless. Moreover, the communication unit 33 may perform transmission and receipt of information to and from a traffic management center.

And the control unit 34 is a device that controls the traffic signal generation device 30 as a whole, and includes a CPU, RAM, ROM, and so on. Moreover, the control unit 34 may perform analysis related to the state of traffic on the basis of the amount of traffic and so on, and may perform control of the signal information generation unit 31 on the basis thereof The Traffic Light 40

Figure 37:
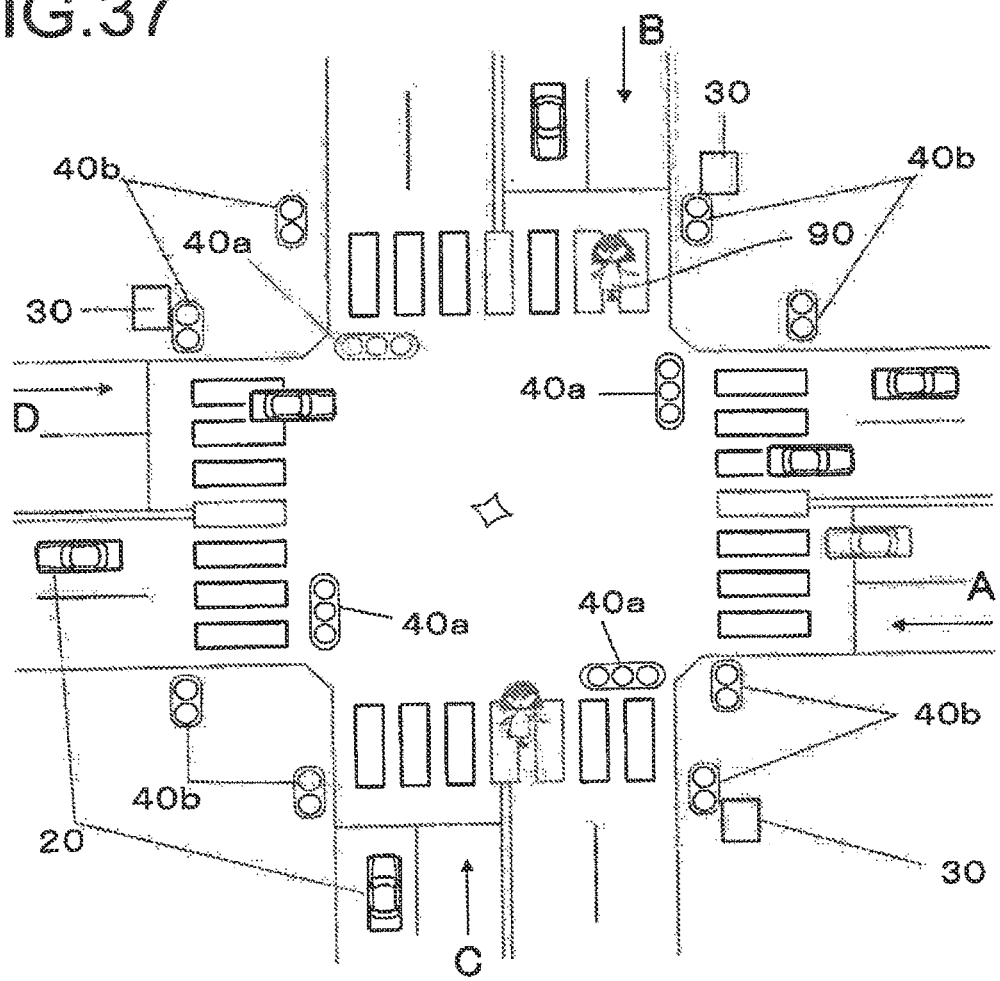
FIG. 37 is a figure showing an example of arrangement of traffic lights at an intersection.

The traffic light 40 comprises a communication unit 41, a display unit 42, an optical system 43, a photoelectric conversion unit 44, a storage unit 45, and a control unit 46. While only one such traffic light 40 is shown in FIG. 36, normally a plurality of traffic lights 40 are provided. For example, in the case of an intersection, as shown by way of example in FIG. 37, a total of eight traffic lights are provided: four traffic lights for automobiles 40a, and four traffic lights for pedestrians 40b. The traffic lights 40 receive traffic signals coming from the traffic signal generation device 30 according to the respective positions in which they are installed, and illuminate or blink display lights of their display units 42.

The communication unit 41 receives traffic signals generated by the signal information generation unit 31 via cable or via wireless. Moreover, the communication unit 41 transmits and receives information of various kinds, such as information related to driving of vehicles and information related to traffic and so on, to and from the automobile 10, other vehicles 20, and other traffic lights 40.

The display unit 42 incorporates signal lights, and performs display of those signal lights according to receipt of traffic signals by the communication unit 41. In concrete terms, the display unit 42 illuminates, blinks, or extinguishes the signal lights in order to permit or restrict movement such as travel, stopping and so on of vehicles traveling upon the road or of pedestrians crossing the road. It should be understood that it would be acceptable for the display unit 42 not only to illuminate a red colored light, a yellow colored light, or a green colored light, but also to illuminate arrow lights that indicate whether, at the intersection, it is possible to go straight on, to turn left, or to turn right.

In this embodiment, the image capture unit 50 of the camera comprises the optical system 43 and the photoelectric conversion unit 44. The optical system 43 includes a plurality of lenses, and focuses an image of the photographic subject upon the photoelectric conversion unit 44. When the image capture unit 50 is provided to a traffic light for automobiles 40a, the optical system 43 is principally used for acquiring images of vehicles. But when the image capture unit 50 is provided to a traffic light for pedestrians 40b, the optical system 43 is principally used for acquiring images of pedestrians (including bicycles). The image capture unit 50 is provided in the vicinity of the display unit 42 (i.e. of its signal light).

The photoelectric conversion unit 44 comprises an imaging element 100 that comprises, laminated together, an image capture chip that outputs pixel signals corresponding to light that is incident from the optical system 43, a signal processing chip that processes those pixel signals, and a memory chip that stores the pixel signals. This photoelectric conversion unit has a similar structure to that of the photoelectric conversion unit 15 of the automobile 10, as described above. The imaging element 100 is capable of setting image capture conditions corresponding to the traffic signal for each pixel or for each of a number of unit regions each consisting of a plurality of pixels (for example 16 pixels by 16 pixels).

Figure 38:
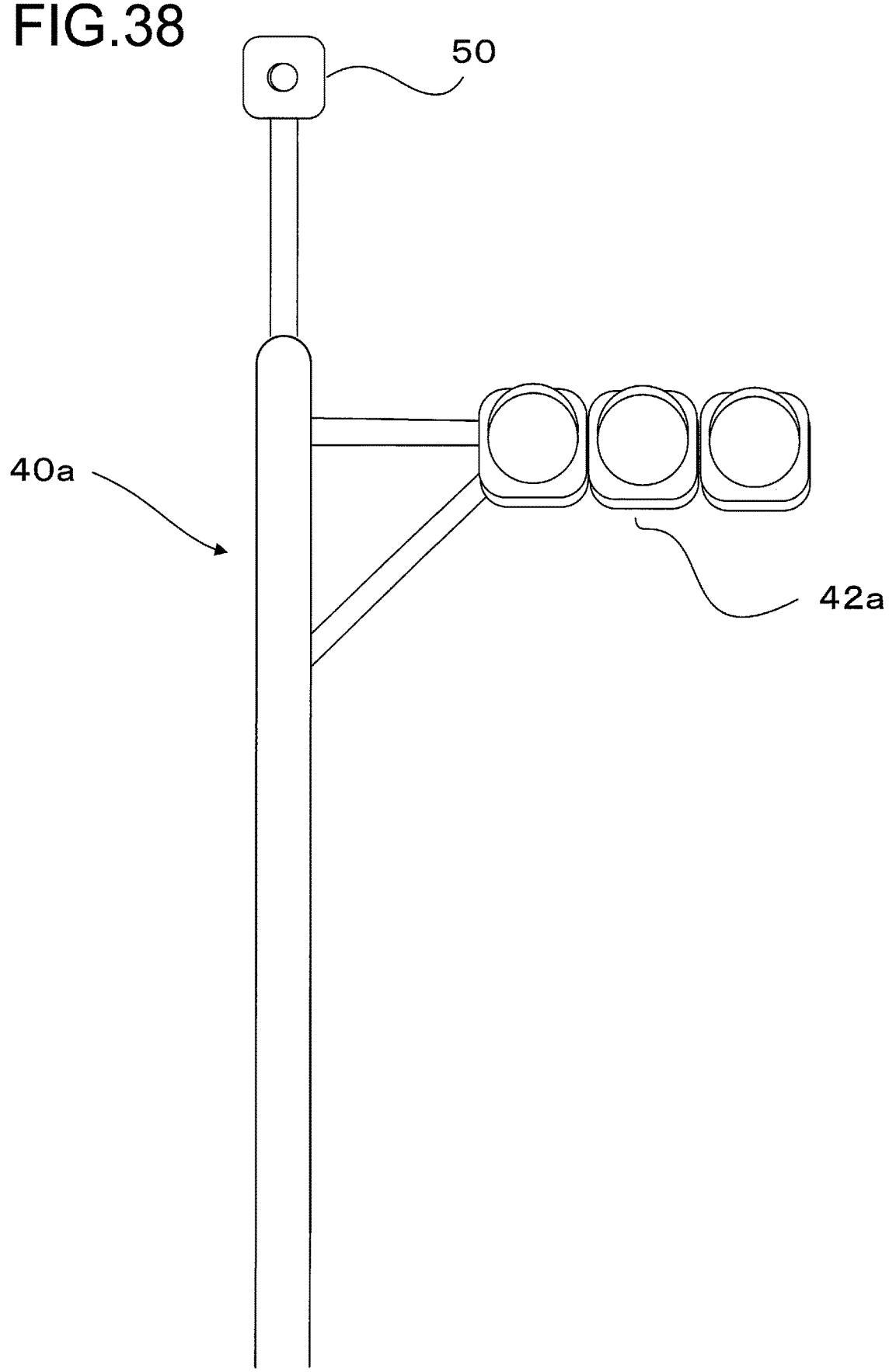
FIG. 38 is a figure showing an example of a traffic light for automobiles.

FIG. 38 is a figure showing an example of a traffic light for automobiles 40a that is disposed at an intersection. In FIG. 38, the image capture unit 50 is installed to the traffic light 40a. As its optical system 43, this image capture unit 50 includes, for example, a wide angle lens, and has an angle of view that includes four vehicle lanes on both sides of a plurality of travel lanes (i.e. two vehicle lanes on each side, or the like) of the intersection shown by way of example in FIG. 37.

The storage unit 45 is built as a non-volatile semiconductor memory such as, for example, a flash memory, and stores image data acquired by the photoelectric conversion unit 44 and the like.

The control unit 46 is a device for controlling the traffic light 40 as a whole, and comprises a CPU, RAM, ROM, and so on. In this embodiment the control unit 46, along with performing display control of the signal lights of the display unit 42 according to traffic signals, also controls capture of images using the imaging element 100 of the photoelectric conversion unit 44.

It should be understood that, if the range of photography by the image capture unit 50 of the traffic light for pedestrians 40b is included in the range of photography by the image capture unit 50 of the traffic light for automobiles 40a, then it would be acceptable to omit the image capture unit 50 of the traffic light for pedestrians 40b (i.e. its optical system 43 and its photoelectric conversion unit 44).

Control of the Automobile

In the following, the control executed by the control unit 19 of the automobile 10 will be explained with reference to the flow chart of FIG. 19. It should be understood that it will be supposed that this flow chart is started when the automobile 10 starts, for example upon starting of the engine or upon starting of the driving system or the like. A program for executing the processing of the FIG. 39 flow chart is stored in a storage medium such as a ROM or the like in the control unit 19, or in the storage unit 17 of the automobile 10.

In step S1 the control unit 19 starts image capture by the imaging element 100 of the photoelectric conversion unit 15. As described above, the image capture unit 5 of the automobile 10 (i.e. the optical system 14 and the photoelectric conversion unit 15) acquires images both in front of the automobile 10 and behind it.

Then in step S2, via the communication unit 16, the control unit 19 performs communication with other vehicles 20 (including, in addition to vehicles that are traveling in the same lane as the automobile 10, also vehicles whose direction of progression is the same as that of the automobile 10 but that are traveling in different travel lanes). In this embodiment, as shown in FIG. 40A, it is supposed that a leading vehicle 73A in front that is traveling in the same lane as the automobile 10 is an automatically driven vehicle, while a vehicle 72A in front that is traveling in a neighboring travel lane (and that is progressing in the same direction) is a manually driven vehicle. Furthermore, it is supposed that a vehicle 73B behind that is traveling in the same lane as the automobile 10 is an automatically driven vehicle, while a vehicle 72B behind that is traveling in an adjacent travel lane (and that is progressing in the same direction) is a manually driven vehicle.

Whether a vehicle in the vicinity of the automobile 10 is an automatically driven vehicle or is a manually driven vehicle is determined on the basis of the result of communication via the communication unit 16, such as per se known vehicle-to-vehicle communication or the like. Moreover it would be acceptable, if an identification mark or the like is displayed upon the other vehicle 20, to arrange to perform the above determination on the basis of the result of image capture by the image capture unit 5 (i.e. the optical system 14 and the photoelectric conversion unit 15). Such an identification mark may be a predetermined mark or code that is displayed upon the body of the vehicle, or could also be provided by displaying identification information upon a display unit, not shown in the figures, that is provided upon the roof of the vehicle or the like.

It should be understood that, for other vehicle 20 for which it is not possible to determine whether it is an automatically driven vehicle or is a manually driven vehicle on the basis of the result of communication (communication not being possible), or on the basis of image capture, it will be supposed that the control unit 19 assesses that vehicle as being a manually driven vehicle.

Then in step S3 the control unit 19 sets the image capture conditions differently for each of the above described unit regions 131 (refer to FIG. 4) of the imaging element 100 of the photoelectric conversion unit 15. FIGS. 40(b) and 40(c) are figures showing images of the photographic subject that are focused upon the imaging element 100 by image capture respectively forward of the automobile 10 and rearward thereof. Although actually inverted images are focused, for convenience of understanding, the images shown in these figures are erect images. The white line 80a shows the demarcation line on the left side of the road facing the direction of travel, the white line 80b shows the boundary line of the lane of travel (i.e. of the lane of this vehicle), and the white line 80c shows the demarcation line on the right side of the road.

Since, as described above, the vehicles 72A and 72B that are traveling ahead and behind the automobile 10 in the next lane are manually driven vehicles, accordingly the control unit 19 takes the region in FIG. 40B that includes the vehicle 72A as a region of attention 71A. And the control unit 19 sets the frame rate of the unit regions of the imaging element 100 corresponding to the region of attention 71A to be higher than the frame rate in the normal region (for example 60 fps), while setting the decimation ratio to be 0% to 20% lower than in the normal region.

In a similar manner, the control unit 19 takes the region in FIG. 40C that includes the vehicle 72B as being a region of attention 71(B). And the control unit 19 sets the frame rate of the unit regions of the imaging element 100 corresponding to the region of attention 71B to be higher than the frame rate in the normal region (for example 60 fps), while setting the decimation ratio to be 0% to 20% lower than in the normal region. Furthermore, the control unit 19 changes this decimation ratio according to the speed of movement of the automobile 10, or according to the relative speed of movement of the automobile 10 relative to the other vehicles 20. For example, the decimation ratio may be changed to be lower along with the relative speed of movement becoming faster.

It should be understood that, while FIG. 40B is an example in which all of the regions except the region of attention 71A are normal regions, it would also be acceptable to arrange to take the region that surrounds the vehicle 73A, which is an automatically driven vehicle, as being a secondary region of attention 74A, and to take the regions other than the region of attention 71A and the secondary region of attention 74A as being normal regions. Moreover, while FIG. 40C is an example in which all of the regions except the region of attention 71B are normal regions, it would also be acceptable to arrange to take the region that surrounds the vehicle 73B which is an automatically driven vehicle as being a secondary region of attention 74B, and to take the regions other than the region of attention 71B and the secondary region of attention 74A as being normal regions. It should be understood that it would also be acceptable to arrange for the control unit 19 to set the image capture conditions for the secondary regions of attention 74A and 74B to be different for fully automatic driving and for semi-automatic driving. In this case, the control unit 19 may set the frame rate of the imaging element 100 during semi-automatic driving to be higher than the frame rate of the imaging element 100 during fully automatic driving. Moreover, it would also be acceptable to arrange for the control unit 19 to set these imaging regions to normal regions during fully automatic driving.

For the imaging elements 100 that capture images in front of the automobile 10 and behind it, the control unit 19 sets the frame rate of the unit regions of the imaging elements 100 that correspond to the secondary regions of attention 74A and 74B to be lower than the frame rate of the normal regions (for example 30 fps), and sets their decimation ratios to be 30% to 60% of that of the normal regions.

Furthermore, in addition to the regions of attention 71A and 71B described above, the control unit 19 may also take regions in which white lines upon the road are included, as being regions of attention. And, for the imaging elements 100 that capture images in front of the automobile 10 and behind it, the control unit 19 sets the frame rate of the unit regions of the imaging elements 100 that correspond to the regions of attention to be higher than the frame rate of the normal regions (for example 60 fps), and sets their decimation ratios to be 0% to 20% of that of the normal regions.

By changing the image capture conditions for each of the unit regions of the imaging element 100 during image capture of a manually driven vehicle and of an automatically driven vehicle in this manner, it is possible to utilize the imaging element 100 efficiently, and to suppress the consumption of electrical power and the generation of heat.

Figure 39:
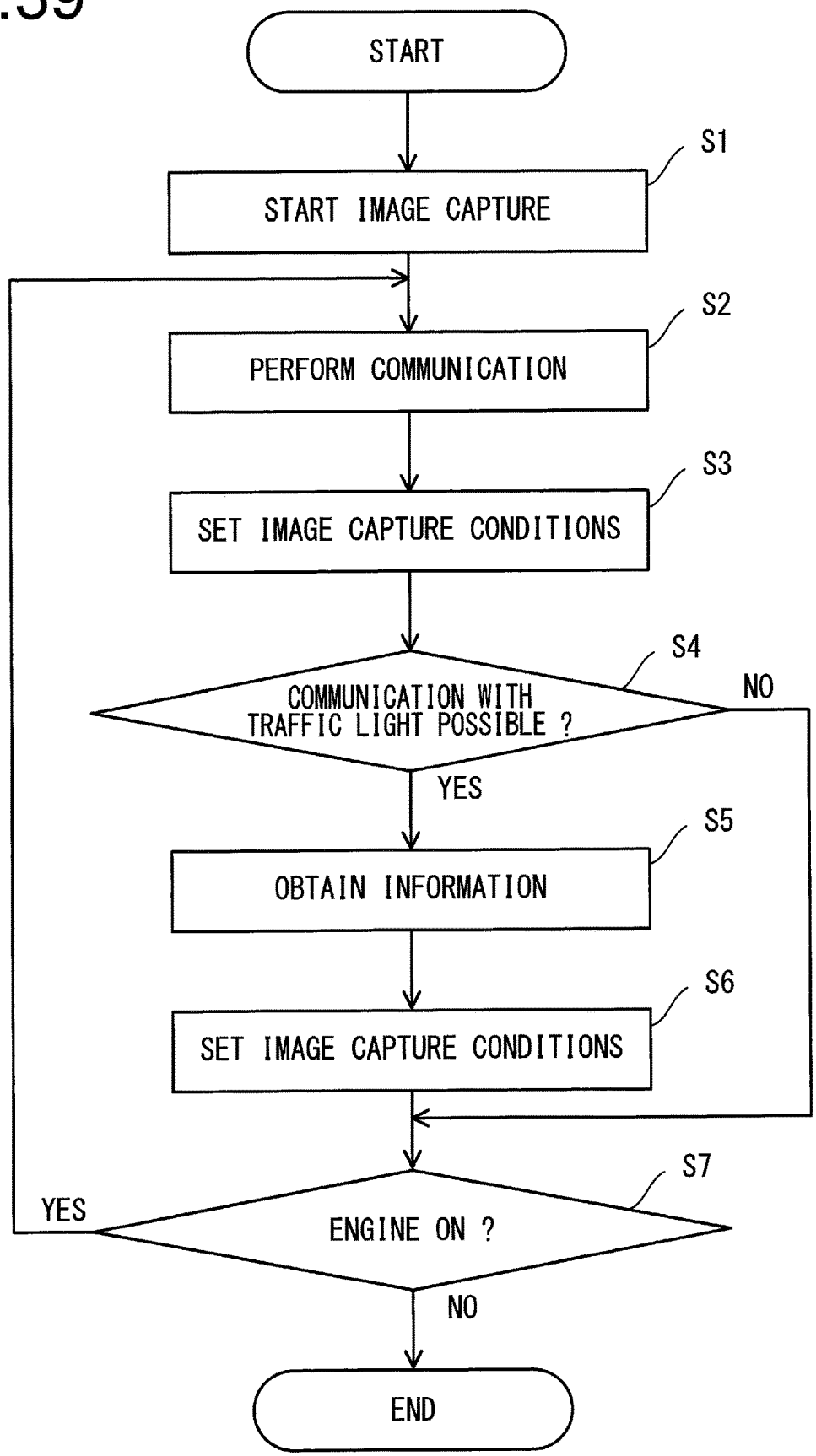
FIG. 39 is a flow chart for explanation of control of an automobile by a control unit.

In step S4 of FIG. 39, the control unit 19 makes a decision as to whether or not it is possible to communicate with a traffic light 40 via the communication unit 16, in other words as to whether or not the vehicle has come close to a traffic light 40 (i.e. an intersection) or the like. If it is not possible to communicate with a traffic light 40 (i.e. if the vehicle is outside any area of communication), then the control unit 19 reaches a negative decision in step S4 and the flow of control is transferred to step S7. On the other hand, if communication with a traffic light 40 is possible (i.e. if the vehicle is within an area of communication), then the control unit 19 reaches an affirmative decision in step S4 and the flow of control proceeds to step S5.

In step S5, the control unit 19 receives information on the basis of an image acquired by the photoelectric conversion unit 44 of the traffic light 40 (which may be a traffic light for automobiles 40a or a traffic light for pedestrians 40b). For example, when the automobile 10 turns left (or when a vehicle turns right in a region where traffic drives on the right side, such as the US or the like), the control unit 19 may receive information related to people from the traffic light for pedestrians 40b. In this case, the presence or absence of a pedestrian is determined on the basis of an image that the control unit 46 of the traffic light 40 has acquired via the photoelectric conversion unit 44, and the control unit 19 receives information related to the pedestrian determined by the control unit 46.

It should be understood that it would also be acceptable to arrange for the control unit 19 of the automobile 10 to receive image data acquired by the photoelectric conversion unit 44 of the traffic light 40, and to determine upon the presence or absence of a pedestrian on the basis of this image data that has been received.

If the automobile 10 is turning right (or, in a region in which vehicles drive on the right side, if it is turning left), then the control unit 19 receives information from the traffic light for automobiles 40*a* as to whether a vehicle straight ahead in the opposite vehicle lane is an automatically driven vehicle or is a manually driven vehicle. Furthermore, the control unit 19 receives from the traffic light for automobiles 40*a* information related to changing over of the traffic signal (for example, signal changeover information such as information to the effect that, after a certain number of seconds, the signal will change over from a green signal to a red signal).

Then in step S6, on the basis of the information entered in the step S5, the control unit 19 sets image capture conditions for the imaging element 100 of the photoelectric conversion unit 15. If, for example, the automobile 10 is turning left at an intersection, then the control unit 19 may increase the frame rate of the frame rate of the unit regions of the imaging element 100 that correspond to the left side of the photographic screen to be higher than the frame rate of the unit regions that correspond to the right side of the photographic screen, and may change the above described frame rate in correspondence with the speed of the automobile 10 or with the speed of movement of a pedestrian (for example a speed of 4 km/h).

For example, if an automobile 10 that has been moving at a speed of 50 km/h has decelerated to 10 km/h in order to turn left, then the frame rate of the unit regions that correspond to the left side of the photographic screen is reduced as compared to before the deceleration. Moreover, if the automobile 10 turns left, then the control unit 19 sets the image capture conditions for the imaging element 100, according to whether a pedestrian who is crossing on a crosswalk is getting nearer to the automobile 10 or is getting further away from the automobile 1. In other words, the control unit increases the frame rate of the unit regions of the imaging element 100 that correspond to a person who is getting nearer to the automobile 10 and also lowers their decimation ratio, while lowering the frame rate of the unit regions of the imaging element 100 that correspond to a pedestrian who is getting further away from the automobile 10 (in particular, that correspond to a person who has already finished crossing a pedestrian crossing through which the automobile 10 is going to pass) and raises their decimation ratio.

Furthermore, if the automobile 10 is going to turn right at an intersection, and if the other vehicle 20 that is coming straight on from the opposite vehicle lane is a manually driven vehicle, then the control unit 19 makes the frame rate of the unit regions corresponding to the right side of the photographic screen relatively higher than the frame rate of the unit regions corresponding to the left side of the photographic screen, and also lowers their decimation ratio. Moreover, if a pedestrian who is crossing a crosswalk toward which the vehicle is turning right is getting nearer to the automobile 10, then the frame rate of the unit regions of the imaging element 100 corresponding to the pedestrian who is getting nearer is made to be yet higher, and their decimation ratio is further lowered.

And it would also be acceptable to arrange for the control unit 19, if the automobile 10 is turning right or turning left, to forecast the imaging region to which attention should be directed (i.e. to forecast the imaging region in which there is a possibility that a pedestrian or the like may appear) and to change the setting of the image capture conditions, in correspondence to the state of actuation of the turn signal switch and/or to the amount of actuation of the steering wheel.

Moreover, the control unit 19 receives information related to changing over of the traffic signal from the traffic light for automobiles 40*a*, and changes over the image capture conditions of the imaging element 100 on the basis of that information. For example, if the control unit 19 receives from the traffic light for automobiles 40*a* information related to changing over of the traffic signal to the effect that it will change over from a green signal to a red signal after a certain number of seconds, and the automobile accordingly decelerates, then the control unit may perform control so that the frame rate of the imaging element 100 that captures images forward of the vehicle becomes lower than before deceleration, and so that the decimation ratio becomes higher. On the other hand, the control unit 19 may perform control so that the image capture conditions of the imaging element 100 that captures images behind the vehicle are maintained just as it is.

It should be understood that since, when the automobile decelerates, it may be predicted that a vehicle following behind will approach the automobile 10, accordingly it would also be acceptable to perform control so that the frame rate of the imaging element 100 that captures images rearward of the vehicle becomes higher than before deceleration, and so that the decimation ratio becomes lower.

It would also be acceptable for the control unit 19, when the speed of the automobile 10 changes, to forecast the change of speed according to the actuation amount of the brake or the accelerator (i.e. the amount by which the corresponding pedal is stepped upon), and to change the settings of the image capture conditions accordingly.

In step S7, the control unit 19 makes a decision as to whether or not the engine (or the driving system) is ON. If the engine (or the driving system) is ON, then the control unit 19 reaches an affirmative decision in step S7 and the processing of step S2 and subsequently is repeated. But if the engine (or the driving system) is OFF, then the control unit 19 reaches a negative decision in step S7, and the processing of this flow chart terminates.

Traffic Light Control

Figure 41:
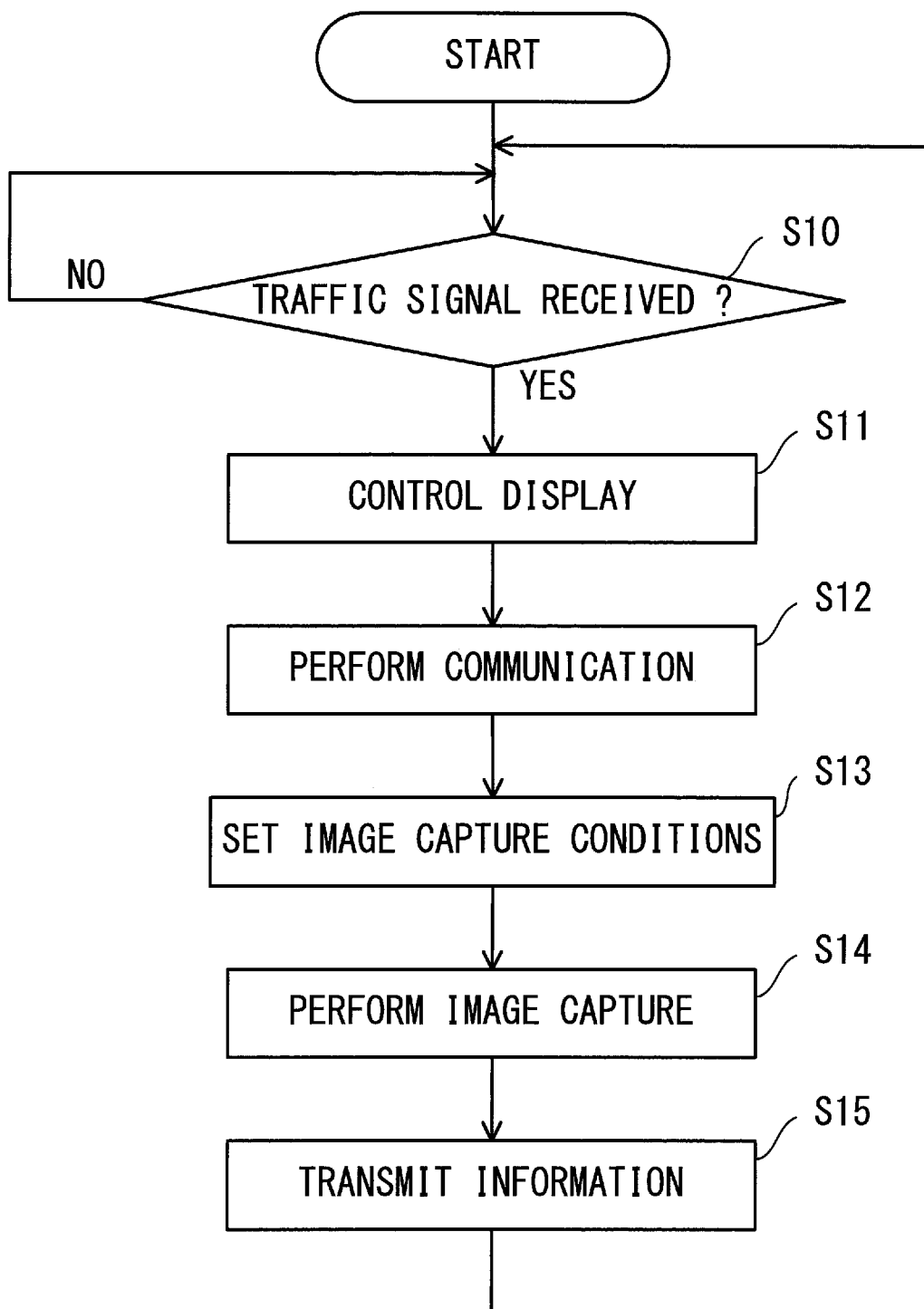
FIG. 41 is a flow chart for explanation of control of a traffic light by a control unit.

Next, the control of the traffic light 40 performed by the control unit 46 will be explained with reference to the flow chart of FIG. 41. A program for executing the processing according to the flow chart of FIG. 41 is stored in a storage medium in the control unit 46 such as a ROM or the like, or in the storage unit 45.

In step S10, the control unit 46 makes a decision as to whether a traffic signal has been received from the traffic signal generation device 30. If a traffic signal has been received from the traffic signal generation device 30, then the control unit 46 reaches an affirmative decision in step S10 and the flow of control proceeds to step S11. But if no traffic signal has been received from the traffic signal generation device 30, then the control unit 46 reaches a negative decision in step S10 and waits for receipt of a signal.

In step S11, the control unit 46 performs display control of the display unit 42. For example, according to the traffic signal that has been received from the traffic signal generation device 30, the control unit 46 may perform control to change over the signal light display of the display unit 42 from red to green.

Then in step S12 the control unit 46 performs communication with one or a plurality of vehicles or with other traffic lights 40. One or more vehicles with which the control unit 46 is in communication, the automobile 10, and other vehicles 20 that are equipped with communication units 21 may be included.

It should be understood that it would also be acceptable to arrange for the other vehicles that are the subjects of communication to be vehicles that are within a predetermined range from an intersection or from a traffic light 40, and it would also be acceptable for them to be vehicles that are capable of communicating via an information supply system that is installed in the road but that is not shown in the figures, or the like.

The control unit 46 acquires information from a vehicle that is the subject of communication that specifies its method of operation, i.e. whether that vehicle or a vehicle in the vicinity of that vehicle is an automatically driven vehicle or is a manually driven vehicle or the like. Moreover, the control unit 46 acquires information from the vehicle that is the subject of communication related to the driving state of that vehicle or of a vehicle in the vicinity of that vehicle. For example, the control unit 19 or the control unit 25 of the vehicle that is the subject of communication may predict a change of course at an intersection (i.e. a right turn or a left turn) from the state of a turn signal switch for operating winkers (i.e. direction indicators). The control unit 46 acquires, from the vehicle that is the subject of communication, this information predicting a right turn or a left turn that has been forecast by the vehicle that is the subject of communication as the above described information related to the state of driving.

It should be understood that it would also be acceptable to arrange for the control unit 46 to determine whether the vehicle that is the subject of communication is an automatically driven vehicle or is a manually driven vehicle on the basis of the result of communication with the vehicle. Moreover, if an identification mark or the like is displayed upon the vehicle, then it would also be acceptable to arrange for the control unit 46 to make this determination on the basis of the result of image capture by the image capture unit (i.e. by the optical system 43 and the photoelectric conversion unit 44). Furthermore, it will also be acceptable to arrange for the control unit 46 to determine upon a change of course by the vehicle (i.e. a right turn or a left turn) from the operational state of the winkers of the vehicle based upon the result of image capture by the image capture unit (i.e. by the optical system 43 and the photoelectric conversion unit 44); or it would be possible to make the above determination according to whether the vehicle is in a left turn lane or is in a right turn lane.

Yet further, the control unit 46 may also perform communication with another traffic light 40, including both a traffic light for automobiles 40a or a traffic light for pedestrians 40b, and may thus acquire information related to the state of traffic at an intersection or the like. Even further, according to requirements, the control unit 46 may perform communication with a traffic signal generation device 30 that is related to generation of traffic signals for traffic lights, and may acquire information related to the state of display of traffic signals in this manner.

In step S13, the control unit 46 sets image capture conditions for the imaging element 100 of the photoelectric conversion unit 44 on the basis of the state of display of the signal lights of the display unit 42, and on the basis of the information that was acquired in step S12. The details of this setting of the image capture conditions for the imaging element 100 of the photoelectric conversion unit 44 will be described hereinafter.

Then in step S14 the control unit 46 performs image capture with the image capture unit (i.e. with the optical system 43 and the photoelectric conversion unit 44) under the image capture conditions that were set in step S14.

And in step S15 the control unit 46 transmits the image data acquired in step S14 via the communication unit 41 to the automobile 10, to the other vehicle 20, or to another traffic light 40 or the like. Moreover, in a similar manner, on the basis of the image data described above, the control unit 46 may also transmit information that has been extracted by performing image processing or image analysis, for example information about the lane in which the vehicle is traveling as estimated from data related to the direction of the vehicle and to its speed and so on, and by identifying the operational state of the winkers and so on.

Furthermore, it would also be acceptable for the control unit 46, on the basis of the information that has thus been analyzed, to recognize the estimated lane of travel of the vehicle that is the subject of communication (the automobile 10 or the other vehicle 20) or an object that may become an obstacle (including a vehicle or a pedestrian), to generate a message on the basis of the result of that recognition, and to transmit that message from the communication unit 41 to the vehicle that is the subject of communication. The message may, for example, be "Two-wheeled vehicle coming from behind", "Pedestrian crossing", "Oncoming vehicle straight ahead", or the like. The control unit 46 executes the processing from step S10 through step S15 repeatedly.

The Setting of Image Capture Conditions for the Traffic Light

Figure 42:
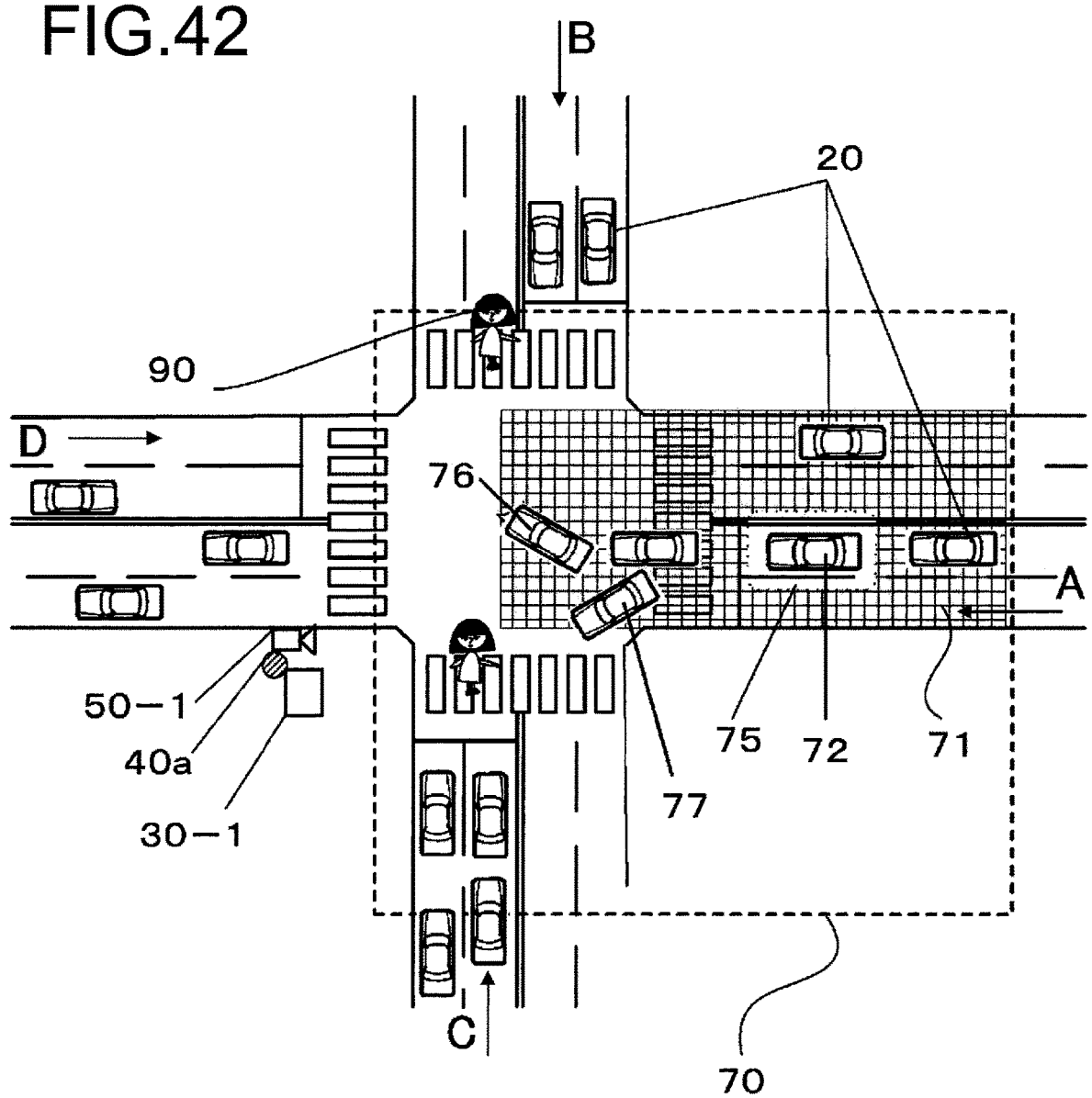
FIG. 42 is a figure for explanation of control of an image capture unit of a traffic light for automobiles.

FIG. 42 is a figure showing an example of control of the image capture conditions for an imaging element 100 of an image capture unit 50-1 that is installed integrally with a traffic light for automobiles 40a, or that is installed in the neighborhood of such a traffic light, when this traffic light for automobiles 40a is displaying a green signal.

In FIG. 42, there are shown a traffic light for automobiles 40a for a lane of travel (vehicle lane) A, an image capture unit 50-1, and a traffic signal generation device 30-1. Other traffic lights and so on at this intersection are omitted from this figure. Within the range of the imaging region 70 of the image capture unit 50-1, a control unit 46 of this traffic light for automobiles 40a provides, as a region of attention 71, a range (the hatched range) in which the vehicles are moving because of a green signal.

The control unit 46 performs control so as, for unit regions of the imaging element 100 that correspond to the region of attention 71, to increase the frame rate to be higher, and to lower the decimation ratio to be lower, as compared to other unit regions outside the region of attention 71. Moreover, when a vehicle 72 present in the region of attention 71 is not an automatically driven vehicle but rather is a manually driven vehicle, then the control unit 46 provides the region that surrounds that vehicle 72 as being a special region of attention 75. And the frame rate of the unit regions of the imaging element 100 that correspond to this special region of attention 75 is further raised to be even higher than that of the unit regions that correspond to the region of attention 71. The control unit 46 also performs control to lower the decimation ratio of the unit regions of the imaging element 100 that correspond to the special region of attention 75 to be even lower than the decimation ratio of the unit regions that correspond to the region of attention 71.

Furthermore, with regard to regions within the region of attention 71 that include a vehicle 76 and a vehicle 77 that have paused for turning right and left respectively, the control unit 46 is able to perform image capture at high resolution by adjusting the decimation ratio for both those regions to be lower than the unit regions corresponding to the region of attention 71.

Figure 43:
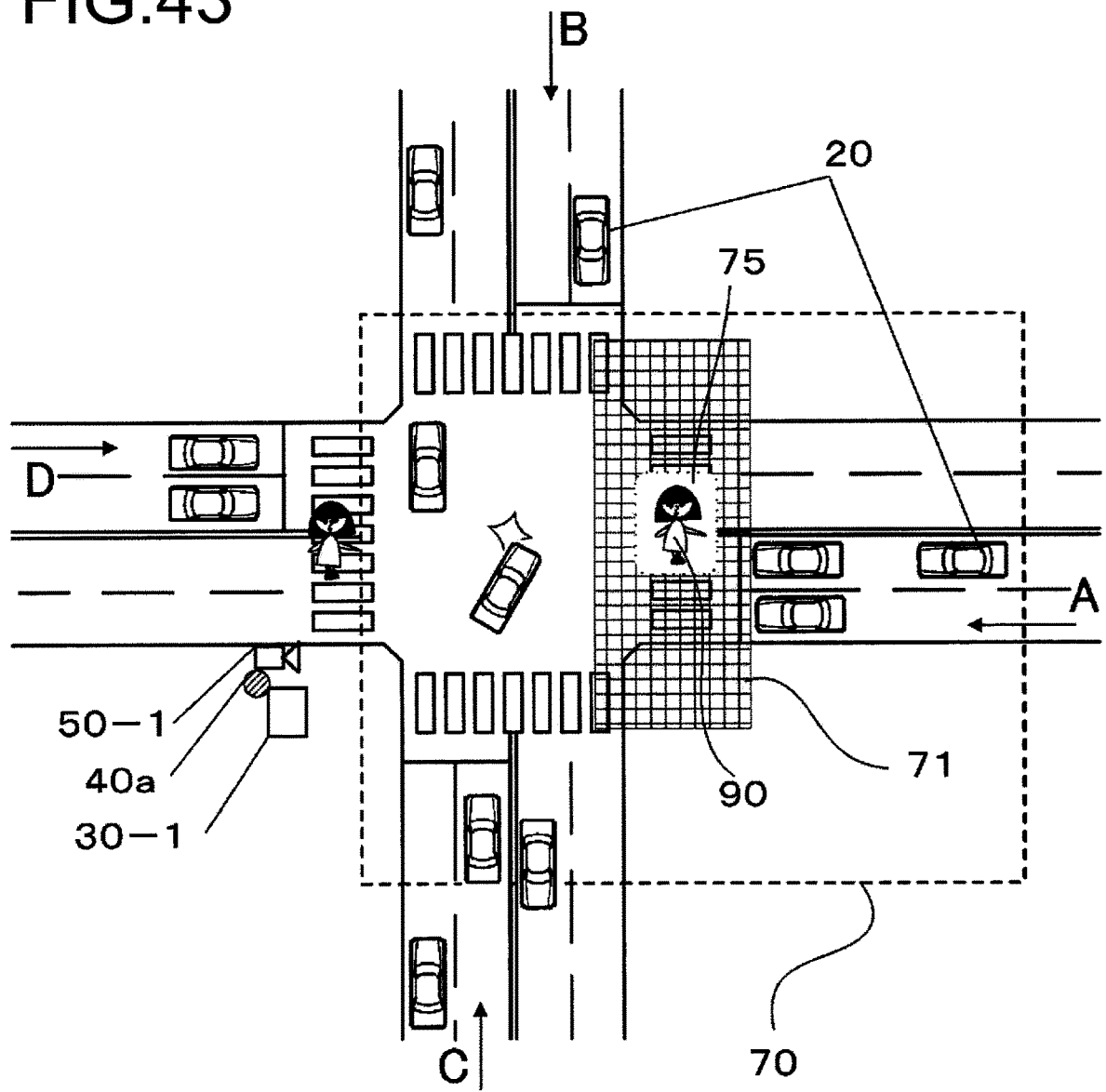
FIG. 43 is a figure for explanation of control of an image capture unit of a traffic light for automobiles.

FIG. 43 is a figure showing an example of control of the image capture conditions for the imaging element 100 of the image capture unit 50-1 that is installed integrally with the traffic light for automobiles 40a, or that is installed in the neighborhood of such a traffic light, when this traffic light for automobiles 40a is displaying a red signal.

In FIG. 43, there are shown the traffic light for automobiles 40a for a lane of travel (vehicle lane) A, an image capture unit 50-1, and a traffic signal generation device 30-1. Other traffic lights and so on at this intersection are omitted from this figure. Within the range of the imaging region 70 of the image capture unit 50-1, the control unit 46 of this traffic light for automobiles 40a sets, as a region of attention 71, a crosswalk that a pedestrian 90 is entering and the vicinity thereof (the hatched range).

The control unit 46 performs control so as, for unit regions of the imaging element 100 that correspond to the region of attention 71, to increase the frame rate to be higher, and to lower the decimation ratio to be lower, as compared to other unit regions outside the region of attention 71. Moreover, when the pedestrian 90 has been recognized, then the control unit 46 sets a region within a predetermined range including that pedestrian 90 as being a special region of attention 75. And the frame rate of the unit regions of the imaging element 100 that correspond to this special region of attention 75 is further raised to be even higher than that of the unit regions that correspond to the region of attention 71. The control unit 46 also performs control to lower the decimation ratio of the unit regions of the imaging element 100 that correspond to the special region of attention 75 to be even lower than the decimation ratio of the unit regions that correspond to the region of attention 71.

Figure 44:
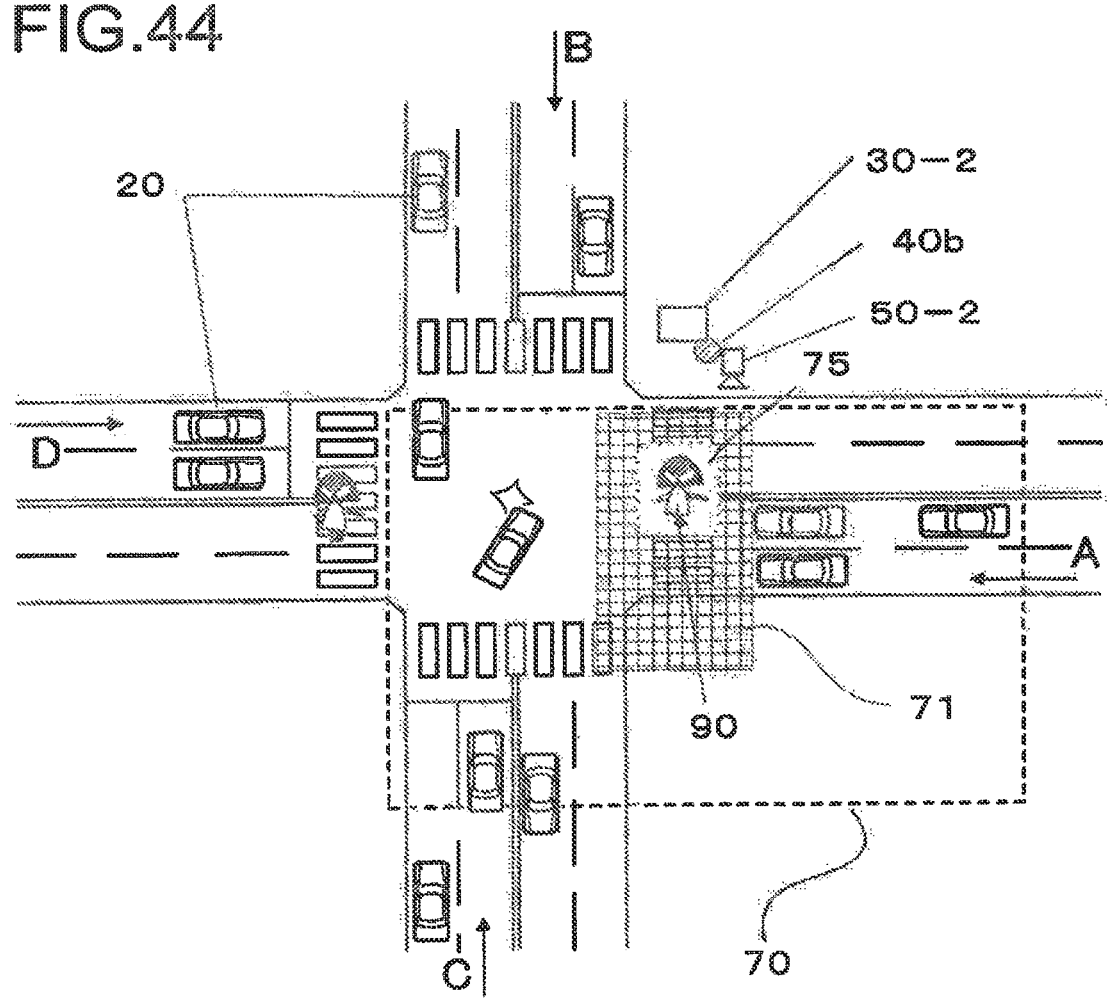
FIG. 44 is a figure for explanation of control of an image capture unit of a traffic light for pedestrians.

In FIG. 44, there is shown an example of control of image capture conditions for an image capture unit 50-2 that is installed integrally with a traffic light for pedestrians 40b, or that is installed in the neighborhood of such a traffic light. In FIG. 44, there are shown the traffic light for pedestrians 40b, the image capture unit 50-2, and a traffic signal generation device 30-2. Other traffic lights and so on at this intersection are omitted from this figure. Within the range of the imaging region 70 of the image capture unit 50-2, the control unit 46 of this traffic light for pedestrians 40b provides, as a region of attention 71, a crosswalk that a pedestrian 90 is entering and the vicinity thereof (the hatched range).

The control unit 46 performs control so as, for unit regions of the imaging element 100 that correspond to the region of attention 71, to increase the frame rate to be higher, and to lower the decimation ratio to be lower, as compared to other unit regions outside the region of attention 71. Moreover, when the pedestrian 90 has been recognized, then the control unit 46 sets a region within a predetermined range including that pedestrian 90 as being a special region of attention 75. And the frame rate of the unit regions of the imaging element 100 that correspond to this special region of attention 75 is further raised to be even higher than that of the unit regions that correspond to the region of attention 71. The control unit 46 also performs control to lower the decimation ratio of the unit regions of the imaging element 100 that correspond to the special region of attention 75 to be even lower than the decimation ratio of the unit regions that correspond to the region of attention 71.

Figure 45A:
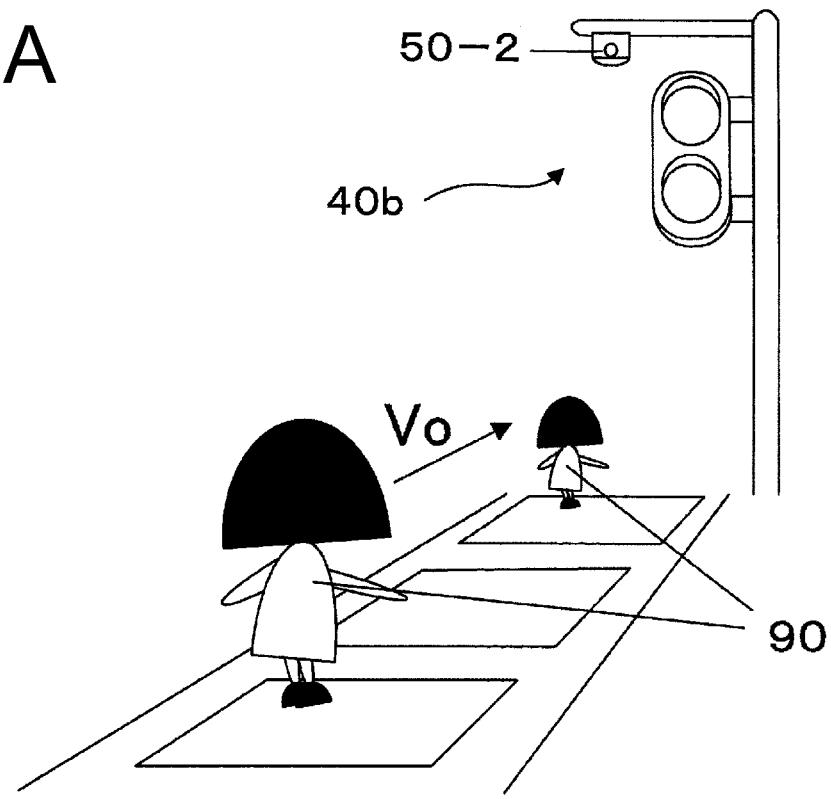
FIG. 45A is a figure showing an example of situation, an image of which has been captured by an image capture unit installed to a traffic light for pedestrians.
Figure 45B:
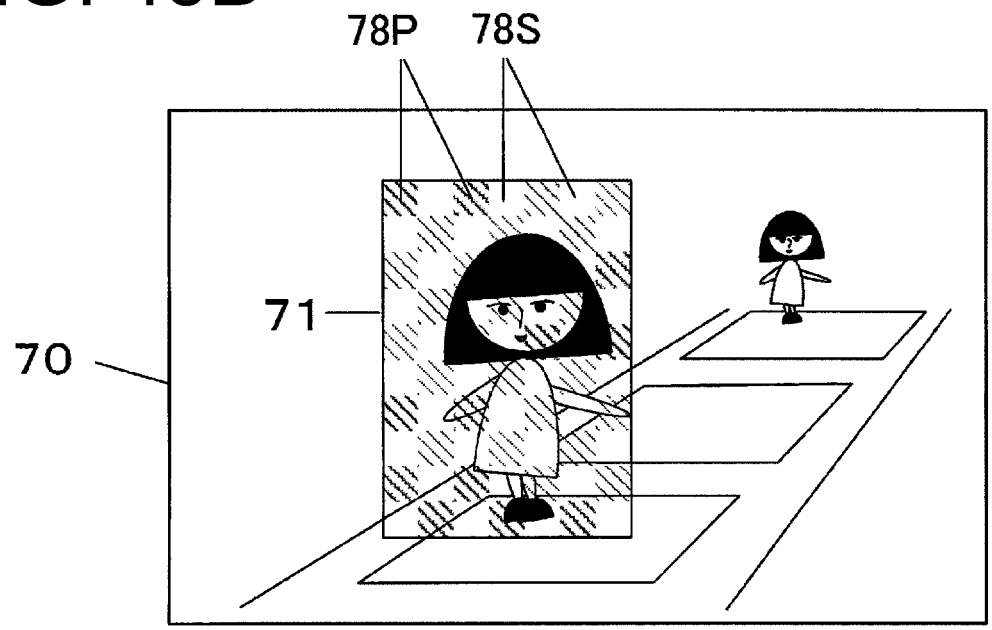
FIG. 45B is a figure for explanation of setting of image capture conditions.

FIG. 45A is a figure showing an example of a situation, an image of which has been captured by the image capture unit 50-2 that is installed to the traffic light for pedestrians 40b. And FIG. 45B is a figure for explanation of setting of image capture conditions on the basis of the results of photographic subject recognition using image data acquired by the image capture unit 50-2. In FIG. 45A, the image capture unit 50-2 described above having the imaging element 100 is installed to the traffic light for pedestrians 40b. Since, according to the imaging element 100 according to this embodiment, it is possible to measure not only movement in the up and down direction and the left and right direction but also movement in the depth direction, accordingly it is possible to measure the speed Vo at which the pedestrian 90, who is the photographic subject, is moving.

In FIG. 45B, within the imaging region of the image capture unit 50-2, the control unit 46 sets a range that includes the pedestrian 90 who is walking over the crosswalk as being the region of attention 71. And the control unit 46 makes the image capture conditions for the unit regions of the imaging element 100 that correspond to this region of attention 71 be different from the unit regions outside the region of attention 71. At this time, the control unit 46 varies the image capture conditions in dependence upon the speed Vo of the pedestrian 90.

For example, when the absolute value of the speed Vo of the pedestrian 90 is high, the control unit 46 may perform control so as to increase the frame rate for the unit regions of the imaging element 100 that correspond to the region of attention 71 that includes the pedestrian 90 to be higher than the frame rate for the unit regions outside the region of attention 71, while lowering the decimation ratio of those unit regions.

Moreover, it would also be acceptable for the control unit 46 to change the image capture conditions for the region of attention 71 on the basis of the positional relationship between the pedestrian 90 and a nearby vehicle or building. For example, if a vehicle that is operating its winker in order to turn right or to turn left at the intersection is present in the imaging region 70, then, since there is a possibility that this vehicle may enter into the crosswalk, accordingly the control unit 46 sets, in the region of attention 71, the above described region that is close to the vehicle described above as being a special region of attention. And the control unit 46 raises the frame rate for the unit regions of the imaging element 100 that correspond to this special region of attention to be yet higher than that for the unit regions that correspond to the region of attention 71. Also, the control unit 46 performs control to lower the decimation ratio for the unit regions of the imaging element 100 that correspond to the special region of attention to be even lower than the decimation ratio for the unit regions that correspond to the region of attention 71.

Furthermore, in the region of attention 71, it would also be acceptable for the control unit 46 to make the image capture conditions be different between a plurality of pixels or regions 78P shown by slanting lines and a plurality of pixels or regions 78S not shown by slanting lines. In the example of FIG. 45B, the image capture conditions are made to be different between pixels or areas that are adjacent in the up, down, left, and right directions in a checked pattern, but this mode should not be considered as being limitative.

Yet further, when an object such as another pedestrian or a bicycle or the like within the range of the imaging region 70 has been recognized, it will be acceptable for the control unit 46 to add another region including each of this plurality of objects to the region of attention 71. And, in this plurality of regions of attention 71, it would also be possible to make the image capture conditions to be different between a plurality of pixels or regions 78P each shown by slanting lines and a plurality of pixels or regions 78S each not shown by slanting lines.

Figure 46:
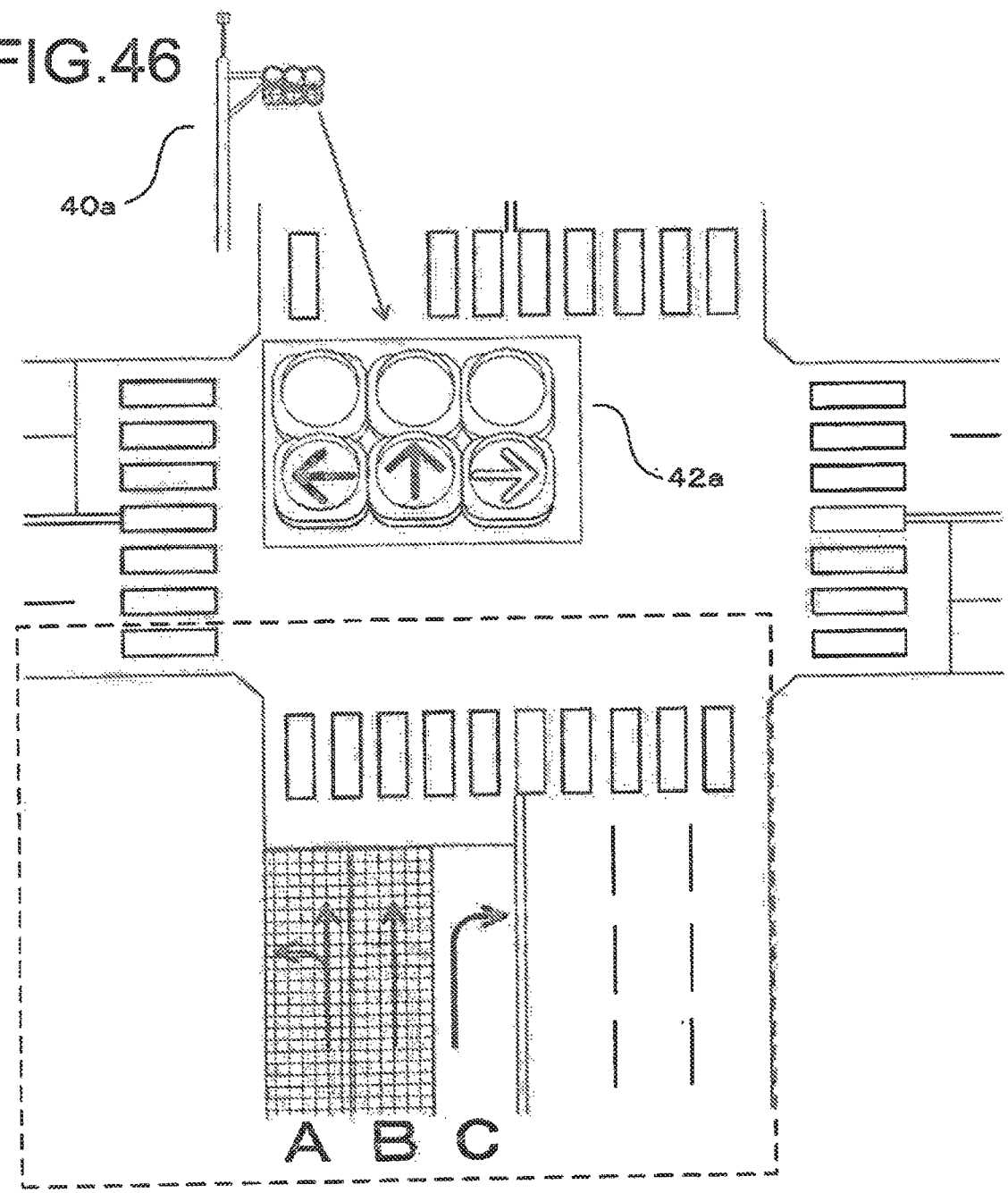
FIG. 46 is a figure showing an example of situation, an image of which has been captured by an image capture unit of a traffic light for automobiles.

FIG. 46 is a figure showing an example of a situation, an image of which has been captured by the image capture unit 50-1 that is installed to the traffic light 40a for automobiles at an intersection. In FIG. 46, the traffic light for automobiles 40a comprises a display unit 42a that has display lamps for indicating that it is possible to go straight ahead, that it is possible to turn left, and that it is possible to turn right. An example will now be explained of image capture conditions that are based upon the results of photographic subject recognition using the image data captured by the image capture unit 50-1.

FIG. 46 shows a situation in which the display unit 42a of the traffic light 40a is illuminating display lamps showing that it is possible to turn left or to go straight ahead, while traffic must wait to turn right. The control unit 46 of the traffic light for automobiles 40a performs control so as to raise the frame rate of the unit regions of the imaging element 100 that correspond to the lane of travel A along which vehicles that are going straight ahead or turning left pass and to the lane of travel B along which vehicles that are going straight ahead pass to be higher than the frame rate of the unit regions that correspond to the other lane of travel C, and so as to lower their decimation ratio. To put this in another manner, the control unit 46 performs control so as to set lower the frame rate of the unit regions that correspond to the lane of travel C, and so as to set their decimation ratio higher.

It should be understood that the concept of lowering of the frame rate also includes making a setting so that image capture is not performed by the unit regions in question.

In the control that has been explained above according to the embodiment explained above of the image capture conditions for the imaging elements 100 of the automobile 10 or of the traffic light 40 (either the traffic light for automobiles 40a or the traffic light for pedestrians 40b), it would be acceptable to arrange to change the image capture conditions almost simultaneously with changing the timing of changeover of the display unit 42, or alternatively it would also be acceptable to arrange to change the image capture conditions by providing a fixed time interval gap from the timing at which the display is changed over. Or, it would also be acceptable to arrange to change the image capture conditions by, for a fixed time period directly after changeover of the display, taking both the region of attention that was set before changeover of the display and also the region of attention that is to be set after changeover of the display as regions of attention.

According to this third embodiment, the following beneficial operational effects are obtained.

(1) The image capture device of the automobile 10 (or of the traffic light 40) comprises the image capture unit 5 (or the image capture unit 50) comprising the imaging element 10 that is capable of setting image capture conditions for a plurality of regions, and the control unit 19 (or the control unit 41) that sets image capture conditions for the plurality of regions on the basis of the driving mode of another vehicle 20 in the vicinity. Due to this, it is possible to set image capture conditions for the imaging element 100 that are adapted to the driving mode of another vehicle 20 in the vicinity.

(2) Since the control unit 19 (or the control unit 41) sets image capture conditions that are different for each region that captures an image of another vehicle 20 for which the driving mode is different, accordingly it is possible to set image capture conditions to be different for regions of the imaging element 100 that capture images of vehicles 20 for which the driving modes are different.

(3) Since the driving modes of other vehicles 20 can be either the automatic driving mode or the manual driving mode, and since the control unit 19 (or the control unit 41) sets the image capture conditions to be different for the regions that capture images of a vehicle 20 whose driving mode is the automatic driving mode and for the regions that capture images of a vehicle 20 whose driving mode is the manual driving mode, accordingly, for the imaging element 100, it is possible to set image capture conditions that are different between the regions that capture images of a vehicle 20 whose driving mode is the automatic driving mode, and the regions that capture images of a vehicle 20 whose driving mode is the manual driving mode.

(4) The control unit 19 (or the control unit 41) sets the frame rate of the regions that capture images of a vehicle 20 whose driving mode is the manual driving mode to be higher than the frame rate of the regions that capture images of a vehicle 20 whose driving mode is the automatic driving mode. Since, due to this, the frequency with which images are captured of a vehicle 20 whose driving mode is manual is increased to be higher than the frequency with which images are captured of a vehicle 20 whose driving mode is automatic, accordingly it is possible to enhance the level of attention that is given to vehicles 20 whose driving mode is manual. In other words it becomes possible to acquire quicker and more accurate information in relation to the behavior of vehicles 20 whose driving mode is manual, which is behavior that it is not possible to predict.

(5) The control unit 19 (or the control unit 41) sets the decimation ratio of the pixels in the regions that capture images of a vehicle 20 whose driving mode is the manual driving mode to be lower than the decimation ratio of the pixels in the regions that capture images of a vehicle 20 whose driving mode is the manual driving mode. Due to this, it is possible to make the amount of information for vehicles 20 whose driving mode is automatic to be greater than for vehicles 20 whose driving mode is manual. In other words, it becomes possible to acquire more accurate information in relation to the behavior of vehicles 20 whose driving mode is manual, which is behavior that it is not possible to predict.

(6) Since it is arranged to provide the control unit 19 (or the control unit 41) that acquires information related to the method of driving of other vehicles 20 in the vicinity, accordingly it is possible to set image capture conditions for the imaging element 100 on the basis of the newest information that has been acquired, even if, for example, some new other vehicle 20 in the vicinity has replaced a previous one.

(7) Since it is arranged for the control unit 19 (or the control unit 41) to acquire information by communication with another vehicle 20, accordingly it is possible to set the image capture conditions for the imaging element 100 in an appropriate manner on the basis of new information that has been acquired by such communication.

(8) Since the control unit 19 (or the control unit 41) acquires information by capturing an image of the other vehicle 20 with the image capture unit 5 (or with the image capture unit 50), accordingly, even in a state in which communication is not possible, still it is possible to set the image capture conditions for the imaging element 100 in an appropriate manner on the basis of new information.

(9) The control unit 19 acquires information from the traffic light 40 that is different from other vehicles 20. Due to this, even in a state in which communication with other vehicles 20 is not possible, still it is possible to set the image capture conditions for the imaging element 100 in an appropriate manner on the basis of new information.

(10) The control unit 19 (or the control unit 41) acquires information indicating whether the other vehicle 20 is an automatically driven vehicle or is a manually driven vehicle, and sets image capture conditions that are different for regions that capture an image of an automatically driven vehicle and for regions that capture an image of a manually driven vehicle. Due to this it is possible to set image capture conditions in an appropriate manner for each unit region on the imaging surface of the imaging element 100, so as, for example, to enhance the level of attention accorded to a manually driven vehicle as compared to that accorded to an automatically driven vehicle. In particular, by increasing the frame rate and reducing the pixel decimation ratio for a manually driven vehicle, it is possible to acquire information in a quick and accurate manner about the behavior of a manually driven vehicle, which is behavior that it is not possible to predict.

(11) Since the automobile 10 is provided with the image capture device that provides the benefits (1) through (10) described above, accordingly it is possible to set the image capture conditions for the image capture device in an appropriate manner that is matched to the methods of driving of other vehicles 20 in the vicinity of the automobile 10.

(12) The control unit 19 (or the control unit 41) of the automobile 10 sets the image capture conditions for the imaging element 100 according to actuation of the steering wheel, of the turn signal switch, of the accelerator, and/or of the brake of the automobile 10. Due to this, it is possible to set image capture conditions in an appropriate manner for each of the unit regions on the imaging surface of the imaging element 100, according to change of the course of the automobile 10, or change of its speed or the like.

(13) The traffic light 40 includes the image capture unit 50 comprising the imaging element 100 that is capable of setting image capture conditions for a plurality of regions independently, and the control unit 46 that sets the image capture conditions for a plurality of regions on the basis of information related to the movement of the automobile 10 and of the other vehicle 20. Due to this, it is possible to set the image capture conditions for the imaging element 100 according to the automobile 10 that is moving at an intersection or the like, and according to the state of movement of other vehicles 20.

(14) Information related to the movement of the automobile 10 and other vehicles 20 includes signals that permit movement of the automobile 10 and the other vehicles 20, and signals that do not permit movement of the automobile 10 and the other vehicles 20, and it is arranged for the control unit 46 to set the image capture conditions on the basis of these various signals. Due to this, it is possible to set the image capture conditions for the imaging element 100 in a manner that is appropriate for when the automobile 10 and the other vehicles 20 are moving, and also for when the automobile 10 and the other vehicles 20 are not moving.

(15) The signals that permit movement of the automobile 10 and the other vehicles 20 include signals that permit movement straight ahead, signals that permit turning left, and signals that permit turning right, and it is arranged for the control unit 46 to set the image capture conditions on the basis of each of these types of signal. Due to this, it is possible to set the image capture conditions for the imaging element 100 in an appropriate manner for each of when the automobile 10 and the other vehicles 20 are going straight ahead, are turning left, or are turning right.

(16) Since the control unit 46 changes the image capture conditions according to changing over of the information related to the movement of the automobile 10 and the other vehicles 20, accordingly it is possible to change the image capture conditions for the imaging element 100 in an appropriate manner at the timing at which the signals described above change over

(17) Since the traffic light 40 includes the control unit 46 that acquires information related to the movement of the automobile 10 and the other vehicles 20 in the vicinity, accordingly even if, for example, some other vehicle 20 in the vicinity is replaced by another, it is still possible to set the image capture conditions for the imaging element 100 on the basis of the newest information that has been acquired.

(18) Since the control unit 46 acquires information by communication with the automobile 10 and other vehicles 20, accordingly it is possible to set the image capture conditions for the imaging element 100 in an appropriate manner on the basis of new information that has been obtained by communication.

(19) Since the control unit 46 acquires information by capturing images of the automobile 10 and other vehicles 20 with the image capture unit 50, accordingly it is possible to set the image capture conditions for the imaging element 100 in an appropriate manner on the basis of new information, even in a situation in which communication is not possible.

(20) As information related to movement, the control unit 46 acquires information that indicates whether the automobile 10 and the other vehicle 20 are automobiles that are being driven in the automatic driving mode or are automobiles that are being driven in the manual driving mode, and sets image capture conditions that are different for regions that capture images of automobiles that are being driven in the automatic driving mode, and for regions that capture images of automobiles that are being driven in the manual driving mode. Due to this it is possible to set image capture conditions for each of the unit regions of the imaging surface of the imaging element 100 in an appropriate manner, so as, for example, to enhance the level of attention that is accorded to automobiles that are being driven in the manual driving mode, as compared to automobiles that are being driven in the manual driving mode. In particular, by increasing the frame rate and reducing the pixel decimation ratio for automobiles that are being driven in the manual driving mode, it is possible to acquire information in a quick and moreover accurate manner related to the behavior of automobiles that are being driven in the manual driving mode, which is behavior that cannot be predicted.

(21) The control unit 46 acquires information specifying changes of course of the automobile 10 or of other vehicles 20, and changes the regions for which image capture conditions are set on the basis of such changes of course of the automobile 10 or of other vehicles 20. By doing this, it is possible to change the image capture conditions of the imaging element 100 in an appropriate manner, at the timing of such changes of course.

(22) Since the communication unit 41 is provided that performs communication with other automobiles 10 and with other vehicles 20 that are different from the automobile 10 and the other vehicle 20, accordingly it is possible to transmit information about other vehicles 20 in the neighborhood of the traffic light 40 to the automobile 10.

(23) The automobile 10 and the traffic light 40 measure the speed at which an object whose image has been captured is moving, and change the image capture conditions for the imaging element 100 according to the magnitude of this speed and its direction and orientation. Accordingly it is possible to change the image capture conditions for each region upon the imaging surface of the imaging element 100 in an appropriate manner, according to the state of movement of the object.

(24) The automobile 10 acquires information such as in how many seconds a signal will change or the like, and reflects this information in the state of driving of the automobile 10. Accordingly it is possible to implement smooth driving in which changing over of the signal is taken into consideration in advance.

(25) For a fixed time period directly after the signal changes over, the automobile 10 or the traffic light 40 sets image capture conditions for the imaging element 100 so as to include, as regions of attention, both the region of attention that was set for the signal directly before the changeover and also the region of attention that must be set to the signal after changeover. Due to this, it is possible to set the image capture conditions for the imaging element 100 in an appropriate manner for the transient state during changeover of the signal.

(26) With this image capture system 1 that includes the automobile 10 and the traffic light 40, it is possible to implement a more organized traffic system on the basis of information acquired by accurate and efficient image capture and on the basis of communication of that information.

It should be understood that while, in this third embodiment, the image capture unit 5 and the image capture unit 50 are respectively controlled by the control unit 19 of the automobile 10 and by the control unit 46 of the traffic light 40, it would also be acceptable to arrange for parts of the control of the image capture unit 5 and the image capture unit 50 to be performed by control circuits (CPUs or the like) interior to the image capture units.

Moreover, it would also be acceptable to arrange for part of the processing performed by the control unit 46 of the traffic light 40 to be performed by the control unit 34 of the signal information generation device 30. And the image capture unit 50 of the camera or the like is not necessarily installed directly to the traffic light 40; it may be installed in some other location, according to the situation with the traffic signals or of traffic at the intersection or the like.

Furthermore while, in this third embodiment, the display unit and the audio replay unit of the navigation system 13 were used for providing messages, it would also be acceptable to arrange to utilize a separate display and replay device. Yet further, it would also be acceptable to arrange to utilize a display and replay device that consists of a HUD (Heads Up Display) that projects information upon the front windshield of the automobile 10, and a speaker that replays audio information.

One or a plurality of the variant embodiments described below may also be combined with the third embodiment described above.

Variant Embodiment #1

It would also be acceptable for the control unit 46 of the traffic light 40 to acquire, by image captured by the image capture unit 50 or by communication via the communication unit 41, information related to the proportion of vehicles upon a road or at an intersection that are automatically driven vehicles, and to change the image capture conditions according to that proportion. For example, the control unit 46 may control the decimation ratio to be greater in time slots in which the proportion of automatically driven vehicles is high, as compared to time slots in which the proportion of automatically driven vehicles is low. By doing this, it is possible to implement economy of the consumption of electrical power and so on, and to perform image capture in a more efficient manner.

Variant Embodiment #2

In addition to the control unit 19 of the automobile 10 or the control unit 46 of the traffic light 40 identifying whether a vehicle is an automatically driven vehicle or a manually driven vehicle by image capture, it would also be acceptable to arrange to identify vehicle signs such as novice driver vehicle signs or senior driver vehicle signs or the like. And the image capture conditions may be set differently for unit regions of the imaging element 100 that correspond to novice driver vehicles and for unit regions that correspond to senior driver vehicles. For example, it would be acceptable to arrange for the image capture frame rate for unit regions of the imaging element 100 that correspond to vehicles that are displaying novice driver signs to be set yet higher than the frame rate for unit regions that correspond to manually driven vehicles. By doing this, it is possible to set the image capture conditions for each of the unit regions upon the imaging surface of the imaging element 100 in an appropriate manner, according to each object.

Variant Embodiment #3

While, in the third embodiment, measurement of distances and detection of surrounding moving objects and/or obstructions were performed by image capture using the imaging element 100, it would also be acceptable to arrange to use a radar not shown in the figures in parallel therewith. By doing this, it becomes possible to acquire more reliable traffic information by making full use of the characteristics of the imaging element 100 and the radar.

While various embodiments and variant embodiments have been explained, the present invention is not to be considered as being limited by the details thereof. Modes in which the various structures disclosed in these embodiments and variant embodiments are employed in combination are also included in the range of the present invention. And other modes that are considered to come within the range of the technical concept of the present invention are also to be considered as being included within the scope of the present invention.

The contents of the disclosures of the following applications, upon which priority is claimed, are hereby incorporated herein by reference:

Japanese Patent Application No. 2014-111375 (filed on 29 May 2014).
Japanese Patent Application No. 2014-173833 (filed on 28 Aug. 2014).
Japanese Patent Application No. 2015-005171 (filed on 14 Jan. 2015).
International Publication WO13/164,915.

REFERENCE SIGNS LIST

1: vehicle
2: driving support device
3: camera
4: control device
4b: storage unit
5: first travel control unit
6: second travel control unit
7: throttle control device
7a: accelerator pedal 8: brake control device
8a: brake pedal
9: steering control device
10: steering wheel
11: turn signal switch
12: vehicle speed sensor
14: display device
15: GPS device
16: shift lever position detection device
17: microphone
18: beam changeover switch
19: rainfall sensor
31: image capture optical system
32: image capture unit
32a: drive unit
33: image processing unit
34: working memory
35: control unit
35a: range finding calculation unit
36: recording unit
60: focus detection pixel line
71, 73, 75, 77, 79, 79A: first imaging regions
71a: third imaging region
72, 74, 76, 78, 80: second imaging regions
72a: fourth imaging region
73a, 73c: fifth imaging regions
74a, 74c: sixth imaging regions
81: imaging region
82, 82A, 82B: regions of attention
83: inactive region
87: seventh imaging region
100: imaging element
113: image capture chip
1: image capture system
5, 50 (50-1, 50-2): image capture units
10: automobile
19, 46: control units
20: other vehicle
30: traffic signal generation device
40: traffic light
40a: traffic light for automobiles
40b: traffic light for pedestrians
42: display unit
70: imaging region
71, 71A, 71B: regions of attention
72, 72A, 72B, 73A, 73B, 76, 77: vehicles
74A, 74B: secondary regions of attention
75: special region of attention
90: pedestrian

The invention claimed is:

1. A vehicle equipped with a driving support device, the driving support device comprising:
an image capture unit that captures an image of an exterior of a vehicle;
a distance measuring unit that measures a distance to an object at the exterior of the vehicle;
a position measuring unit that measures a current position of the vehicle;
a control unit comprising a processor programmed to generate driving support data for the vehicle based on information from the image capture unit, the distance measuring unit and the position measuring unit; and
a sound detection unit that detects sounds from outside the vehicle and a direction of a sound source, wherein:
the control unit generates the driving support data using the information from the image capture unit from an imaging target in the direction of the sound source.

2. The vehicle according to claim 1, wherein:
the control unit uses information from the imaging target in the direction of the sound source identified based on sound input detected by the sound detection unit.

3. The vehicle according to claim 2, wherein:
the sound detection unit detects a sound level; and
the control unit uses the information from the imaging target in the direction of the sound source identified based on the sound level detected by the sound detection unit.

4. The vehicle according to claim 3, wherein:
the control unit uses the information from the imaging target in the direction of the sound source where the sound level detected by the sound detection unit exceeds a predetermined value.

5. The vehicle according to claim 1, wherein:
the control unit generates the driving support data by using more information originating from the imaging target in the direction of the sound source than information originating from an imaging target located at a different position from the direction of the sound source.

6. The vehicle according to claim 1, wherein:
the control unit extends an imaging range in the direction of the sound source.

7. A vehicle equipped with a driving support device, the driving support device comprising:
an image capture unit that captures an image of an exterior of a vehicle;
a distance measuring unit that measures a distance to an object at the exterior of the vehicle;
a position measuring unit that measures a current position of the vehicle;
a control unit comprising a processor programmed to generate driving support data for the vehicle based on information from the image capture unit, the distance measuring unit and the position measuring unit; and
a sound detection unit that detects sounds from outside the vehicle, wherein:
the control unit generates the driving support data using the sounds and the information from the image capture unit from an imaging target identified based on the road conditions.

8. The vehicle according to claim 7, wherein:
the control unit generates the driving support data using information from the imaging targets on the road.

9. The vehicle according to claim 7, wherein:
the control unit generates the driving support data using information from the imaging target identified based on changes in the road conditions.

10. The vehicle according to claim 7, wherein:
the control unit uses information from the imaging target in a direction of a sound source identified based on sound input detected by the sound detection unit.

11. The vehicle according to claim 10, wherein:
the sound detection unit detects a sound level; and
the control unit uses the information from the imaging target in the direction of the sound source identified based on the sound level detected by the sound detection unit.

12. The vehicle according to claim 11, wherein:
the control unit uses the information from the imaging target in the direction of the sound source where the sound level detected by the sound detection unit exceeds a predetermined value.

13. The vehicle according to claim 7, wherein:
the control unit generates the driving support data using the sounds where a level detected by the sound detection unit exceeds a predetermined value.

14. The vehicle according to claim 7, wherein:
the control unit generates the driving support data by using more information originating from the imaging target in a direction of a sound source than information originating from an imaging target located at a different position from the direction of the sound source.

15. A driving support device comprising:
an input unit where information from an image capture unit that takes images of an outside of a vehicle is input;
a distance measuring unit that measures a distance to an object at an exterior of the vehicle;
a position measuring unit that measures a current position of the vehicle;
a control unit comprising a processor programmed to generate driving support data for the vehicle based on information from the input unit, the distance measuring unit and the position measuring unit; and
a sound detection unit that detects sounds from outside the vehicle and a direction of a sound source, wherein:
the control unit generates the driving support data using the information from the image capture unit from an imaging target in the direction of the sound source.

16. A vehicle equipped with a driving support device, the driving support device comprising:
an input unit where information from an image capture unit that takes images of an outside of a vehicle is input;
a distance measuring unit that measures a distance to an object at an exterior of the vehicle;
a position measuring unit that measures a current position of the vehicle;
a control unit comprising a processor programmed to generate driving support data for the vehicle based on information from the input unit, the distance measuring unit and the position measuring unit; and
a sound detection unit that detects sounds from outside the vehicle, wherein:
the control unit generates the driving support data using the sounds and the information from the image capture unit from an imaging target identified based on road conditions.

* * * * *